United States Patent [19]

Takai et al.

[11] Patent Number: 5,751,592
[45] Date of Patent: May 12, 1998

[54] APPARATUS AND METHOD OF SUPPORTING FUNCTIONAL DESIGN OF LOGIC CIRCUIT AND APPARATUS AND METHOD OF VERIFYING FUNCTIONAL DESIGN OF LOGIC CIRCUIT

[75] Inventors: Yuji Takai, Osaka; Kazue Nakatani, Kyoto; Michihiro Matsumoto, Osaka, all of Japan

[73] Assignee: Matsushita Electric Industrial Co., Ltd., Osaka, Japan

[21] Appl. No.: 579,154

[22] Filed: Dec. 27, 1995

Related U.S. Application Data

[63] Continuation of Ser. No. 238,745, May 5, 1994, abandoned.

[30] Foreign Application Priority Data

| May 6, 1993 | [JP] | Japan | 5-105311 |
| Jul. 21, 1993 | [JP] | Japan | 5-180337 |
| Nov. 9, 1993 | [JP] | Japan | 5-279302 |

[51] Int. Cl.$^6$ ................................. G06F 15/60
[52] U.S. Cl. ............ 364/488; 364/489; 364/490; 364/491; 364/578
[58] Field of Search ................. 364/488–491; 395/500

[56] References Cited

U.S. PATENT DOCUMENTS

| 4,510,572 | 4/1985 | Reece et al. | 364/489 |
| 4,566,064 | 1/1986 | Whitaker | 364/300 |
| 4,695,968 | 9/1987 | Sullivan, II et al. | 364/490 |
| 4,855,726 | 8/1989 | Nishio | 364/488 |
| 4,891,773 | 1/1990 | Ooe et al. | 364/578 |
| 4,916,627 | 4/1990 | Hathaway | 364/489 |
| 4,922,432 | 5/1990 | Kobayashi et al. | 364/489 |
| 5,005,136 | 4/1991 | Van Berkel et al. | 364/488 |
| 5,051,938 | 9/1991 | Hyduke | 364/580 |
| 5,202,841 | 4/1993 | Tani | 364/488 |
| 5,212,650 | 5/1993 | Hooper et al. | 364/488 |
| 5,222,029 | 6/1993 | Hooper et al. | 364/488 |
| 5,224,055 | 6/1993 | Grundy et al. | 364/488 |
| 5,243,538 | 9/1993 | Okuzawa et al. | 364/489 |
| 5,287,289 | 2/1994 | Kageyama et al. | 364/489 |

FOREIGN PATENT DOCUMENTS

| 1-309185 | 12/1989 | Japan | 364/489 |

OTHER PUBLICATIONS de Lange et al., "A Hierarchical Constraint Graph Generation and Compaction System For Symbolic Layout", IEEE, pp. 532–535, 1989.

Feng et al., "Single Multiple–Values PLA's and the Design of Fast Multiple–Valued Arithmetic Operation Units for Systolic MV–DTW Processor," IEEE, 1991, pp.2216–2219.

Choon B. Kim "Multiple Mixed–Level HDL Generation From Schematics For Asic Design" IEEE pp. 8–2.1–2.4, Aug. 1991.

XJ Wang "Behavioral VHD1 Code Generation For Synchronous FSM's " IEEE pp. 529–532, Feb. 1992.

Nikkei Electronics, No. 565, SPeeDChART–VHDL, Oct. 12, 1992, p. 239.

*Primary Examiner*—Kevin J. Teska
*Assistant Examiner*—A. S. Roberts
*Attorney, Agent, or Firm*—McDermott, Will & Emery

[57] ABSTRACT

By means of tables, characters, and the like displayed on the screen of a CRT monitor, a functional diagram editor element can generate, on the screen of the CRT monitor, a functional diagram for representing the operation of a logic circuit. A functional diagram check element detects the presence or absence of a contradiction in the generated functional diagram. Furthermore, a functional simulation element can perform the functional verification of the functional diagram free from contradiction. A hardware-description-language conversion element can generate a hardware description language from the functional diagram in which the circuit operation has undergone error correction. A logic synthesis element can generate netlist information from said hardware description language.

6 Claims, 56 Drawing Sheets

Fig. 9(a)
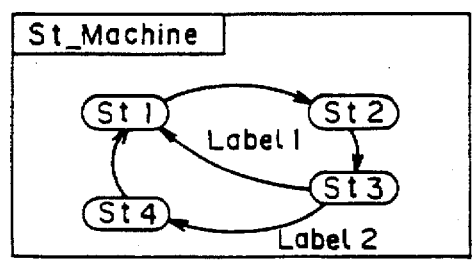
Fig. 9(b)
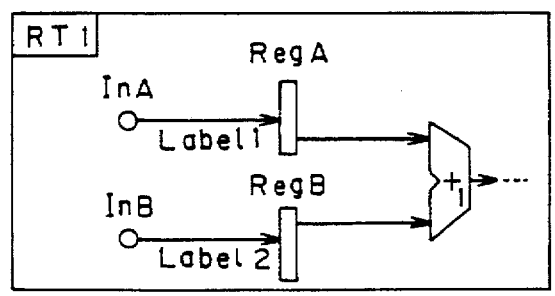
Fig. 9(c)
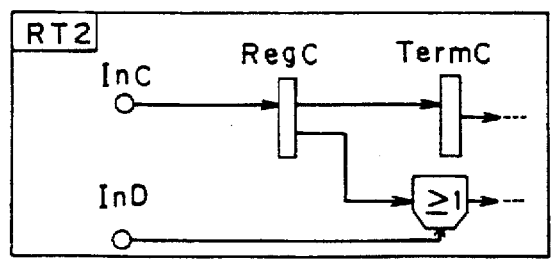
Fig. 9(d)
| TABLE | RegA |
|---|---|
| Label 1 | 1 |
| Label 2 | 0 |

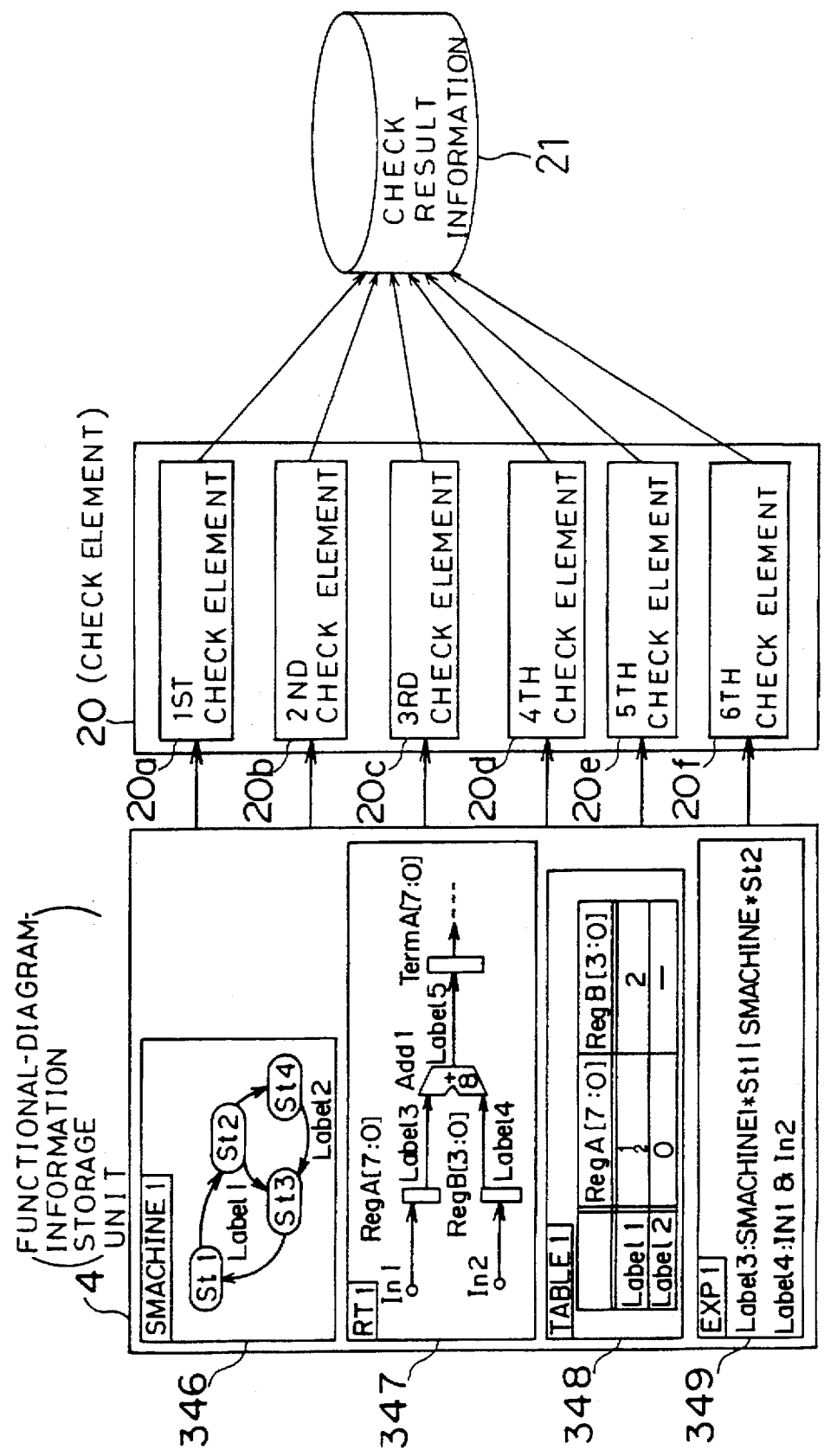

Fig. 11

| 350 | [STATES] | | | |
|---|---|---|---|---|
| | | St1 | → St2 | : SMACHINE1 |
| | | St2 | → St3 | : SMACHINE1 |
| | Label Error | | → St4 | |
| | | St3 | → St1 | : SMACHINE1 |
| | | St4 | → St3 | : SMACHINE1 |

| 351 | [BLOCKS] | | | |
|---|---|---|---|---|
| | | RegA[7:0] | clock : clk | : RT1 |
| | | | reset : rst | |
| | | | ← In1 | |
| | | | → Add1 | |
| | | RegB[3:0] | clock : clk | : RT1 |
| | | | reset : rst | |
| | | | ← In2 | |
| | Bit Width Error | | → Add1 | |
| | | TermA | ← Add1 | : RT1 |

| 352 | [LABELS] | | |
|---|---|---|---|
| | | Label1 | Defined TABLE1 |
| | | | Referred SMACHINE1 |
| | | Label2 | Defined TABLE1 |
| | | | Referred SMACHINE1 |
| | | Label3 | Defined EXP1 |
| | | | Referred RT1 |
| | | Label4 | Defined EXP1 |
| | | | Referred RT1 |
| | Undefined Error | Label5 | Defined None |

Fig.14 (a)

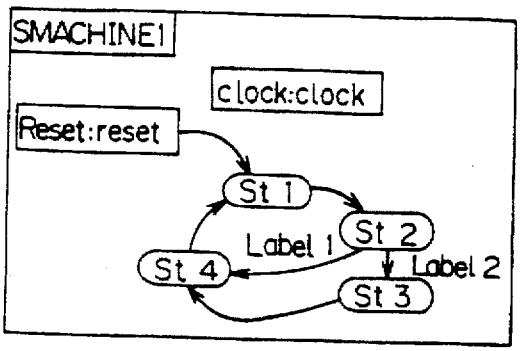

Fig.14 (b)

```
/*DEFINITION OF STATE IN STATE TRANSITION WINDOW
parameter /* synopsys enum SMACHINE1_state*/
      St1=2'd0,
      St2=2'd1,
      St3=2'd2,
      St4=2'd3;
reg [1:0] /* synopsys enum SMACHINE1_state */ SMACHINE1;
reg [1:0] /* synopsys enum SMACHINE1_state */ SMACHINE1_next;
......

/*DESCRIPTION OF OPERATION IN STATE TRANSITION WINDOW
/ / synopsys state_vecor SMACHINE1
always @(SMACHINE1 or Label1 or Label2) begin
case(SMACHINE1)/ / synopsys parallel_case full_case
      St1:
            SMACHINE1_next = St2;
      St2:
            case(1)
               Label1: SMACHINE1_next = St4;
               Label2: SMACHINE1_next = St3;
               default: SMACHINE1_next = St2;
            endcase
      St3:
            SMACHINE1_next = St4;
      St4:
            SMACHINE1_next = St1;
      endcase
end
always @(posedge clock or posedge reset) begin
      if(reset)
            SMACHINE1 = St1;
      else
            SMACHINE1 = SMACHINE1_next;
end
```

Fig. 15(a)

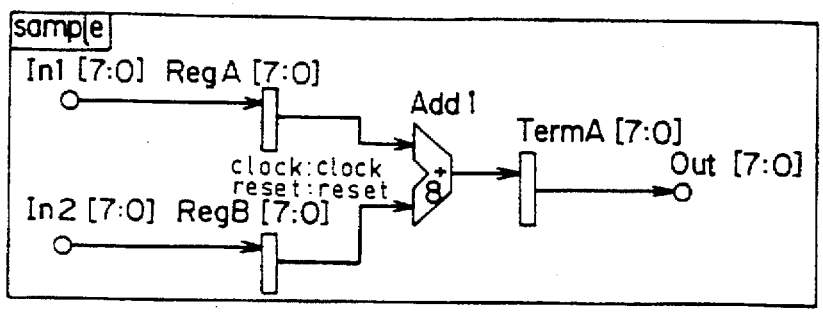

Fig. 15(b)

```
module sample (In1,In2,Out);
/*DECLARATION OF EXTERNAL INPUT PIN AND EXTERNAL
                        OUTPUT PIN IN DATA PATH WINDOW
  input     [7:0] In1,In2;
  output    [7:0] Out;
  reg       [7:0] Out;
/*DECLARATION OF REGISTER AND TERMINAL IN DATA
                                          PATH WINDOW
  reg       [7:0] TermA;
  reg       [7:0] RegA,RegB;

/*DEFINITION OF ADDER IN DATA PATH WINDOW
  function  [7:0] Add1;
  input     [7:0] a,b;
  reg       [7:0] y;
  begin
        y=a+b; //ADD operation
        Add1=y;
    end
  endfunction
  ......
/*DESCRIPTION OF OPERATION IN DATA PATH WINDOW
  always @(posedge clock or posedge reset) begin
    if(reset)
        RegA=8'd0;
      else
        RegA=In1;
  end
  always @(RegA or RegB) begin
    TermA=Add1(RegA,RegB);
  end
```

Fig.16(a)

| TABLE1 | RegA[1:0] | RegB[7] |
|---|---|---|
| Label1 | 1<br>2 | 0 |
| Label2 | 0 | - |

Fig.16(b)

```
/*DECLARATION OF LABEL IN TRUTH TABLE WINDOW
reg    Label1,Label2;
......
/*DESCRIPTION OF COMBINATIONAL CIRCUIT INDICATING
  DEFINITION OF CONDITION IN TRUTH TABLE WINDOW
always @(RegA or RegB) begin
  Label1=((RegA[1:0]==2'd1) || (RegA[1:0]==2'd2)) && (RegB[7]==1'd0);
  Label2=(RegA==2'd0);
end
```

Fig.17(a)

```
EXP1
   Label3 : SMACHINE1*St1 | SMACHINE1*St2
   Label4 : In1[7:0] & (In2[7:0] | TermA[7:0])
```

Fig.17(b)

```
/*DECLARATION OF LABEL IN LOGICAL EXPRESSION
   reg      Label3,Label4;                  WINDOW

......

/*DESCRIPTION OF COMBINATIONAL CIRCUIT INDICATING
     DEFINITION OF CONDITION IN LOGICAL EXPRESSION
always @(SMACHINE1) begin                    WINDOW
     Label3=((SMACHINE1==St1) || (SMACHINE1==St2));
end
always @(In1 or In2 or TermA)begin
     Label4=(In1 && (In2 || TermA));
end
```

Fig.19
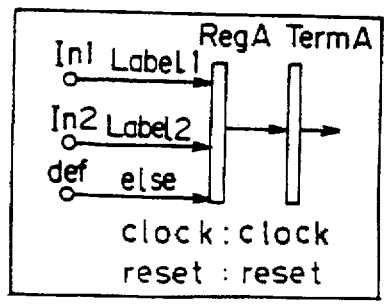
Fig.20(a)
```
always @(posedge clock or posedge reset) begin
        if (reset)
            RegA = 1'd0;
    else
            case(1)
                Label1 : RegA=In1;
                Label2 : RegA=In2;
                default : RegA=def;
            endcase
end
```
Fig.20(b)
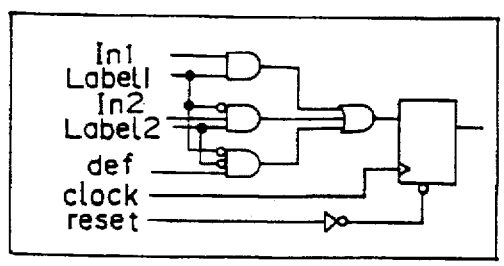

```
always @(posedge clock or posedge reset) begin
            if (reset)
                RegA = 1'd0;
        else
case(1)// / synopsys parallel_case
                Label1 : RegA=In1;
                Label2 : RegA=In2;
                default : RegA=def;
endcase
end
```

Fig.24(a)

```
always @(posedge clock or posedge reset) begin
        if (reset) RegA = 1'd0;
        else
                case(1)
                        L1 :    RegA = a1;
                        L2 :    RegA = a2;
                        L3 :    RegA = a3;
                endcase
end
```

Fig.24(b)

```
wire            regw;

always @ (L1 or a1) begin
        if (L1) reg1 = a1;
        else    reg1 = 1'bz;
end always @ (a2 or L2) begin
        if (L2) reg2 = a2;
        else    reg2 = 1'bz;
end always @ (a3 or L3) begin
        if (L3) reg3 = a3;
        else    reg3 = 1'bz;
end assign  regw = reg1;
assign  regw = reg2;
assign  regw = reg3;

always @(posedge clock or posedge reset) begin
        if (reset)
                RegB= 1'd0;
        else if (L1+L2+L3 > 0)
                RegB = regw ;
end
```

Fig. 28

| TIME MODEL | T1 | T2 | T3 | T4 | ----- |
|---|---|---|---|---|---|
| No. 1 | STATE VALUE | STATE VALUE | ---- | ---- | |
| No. 2 | STATE VALUE | | | | |
| No. 3 | : | | | | |
| No. 4 | : | | | | |

60 ( STATE VALUE STORAGE TABLE )

Fig. 29

CASE OF EXECUTING TIME BACKWARD SIMULATION

| TIME MODEL | T1 | T2 | T3 | T4 | ----- |
|---|---|---|---|---|---|
| No. 1 | V11 | V12 | V13 | V14 | ----- |
| No. 2 | V21 | V22 | V23 | V24 | |
| No. 3 | V31 | V32 | V33 | V34 | |

CASE OF EXECUTING TIME FORWARD SIMULATION

Fig.33

| LOGIC SIGNAL | 0-DRIVE BIT | 1-DRIVE BIT |
|---|---|---|
| 0 | 1 | 0 |
| 1 | 0 | 1 |
| X | 1 | 1 |
| Z | 0 | 0 |

Fig.34

| LOGIC SIGNAL | 0 | 1 | X | Z |
|---|---|---|---|---|
| 0-DRIVE WORD | 1 | 0 | 1 | 0 |
| 1-DRIVE WORD | 0 | 1 | 1 | 0 |

Fig. 37

| LOGIC SIGNAL | 0 | 1 | X | Z |
|---|---|---|---|---|
| ENCODED INPUT SIGNAL<br>0-DRIVE WORD<br>1-DRIVE WORD | 1<br>0 | 0<br>1 | 1<br>1 | 0<br>0 |
| INTERMEDIATE RESULT | 1 | 1 | 1 | 0 |
| ZX CONVERSION MASK | 0 | 0 | 0 | 1 |
| CONVERTED SIGNAL<br>0-DRIVE WORD<br>1-DRIVE WORD | 1<br>0 | 0<br>1 | 1<br>1 | 1<br>1 |
| LOGIC SIGNAL CORRESPON-DING TO CONVERTED SIGNAL | 0 | 1 | X | X |

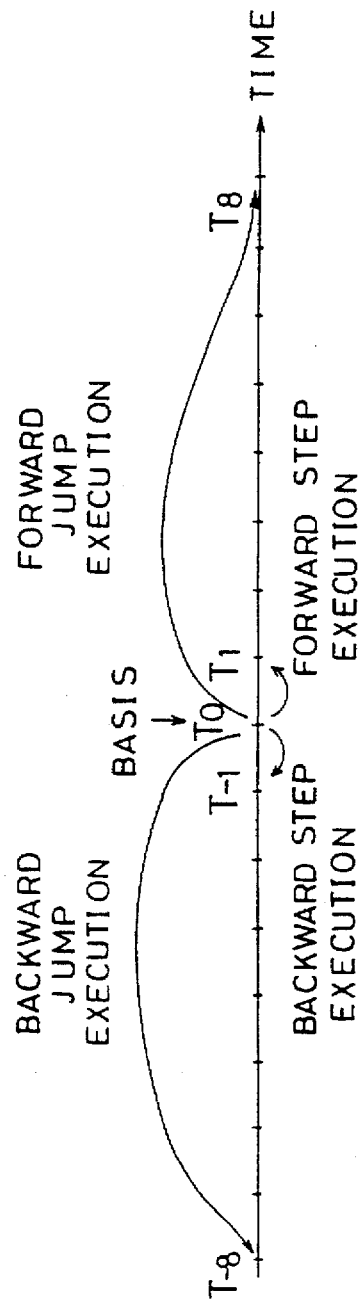

Fig.42(a)
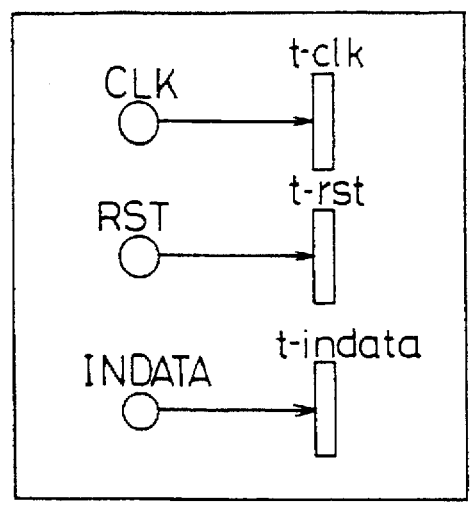
Fig.42(b)
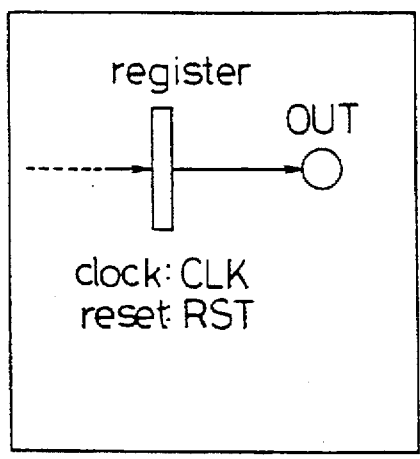
Fig.42(c)
|   | CLK | RST | INDATA | OUT |
|---|-----|-----|--------|-----|
| 0 | ×   | ×   | ×      | ×   |
| 1 | [0] | [1] | [0]    | ×   |
| 2 | 1   | 0   | 0      | 1   |
| ⋮ | ⋮   | ⋮   | ⋮      | ⋮   |

Fig. 44

```
MEMORY NAME
BIT WIDTH , WORD WIDTH
```

| ADDRES | MEMORY PATTERN |
|---|---|
| 0 0 | 2A |
| 0 1 | 3F |
| ⋮ | ⋮ |
| F F | 0 0 |

380 — (address column)
381 — (memory pattern column)

Fig.48(a)
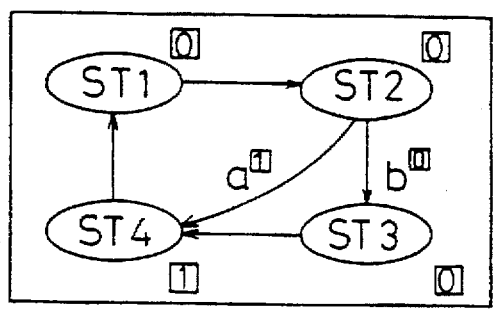
Fig.48(b)
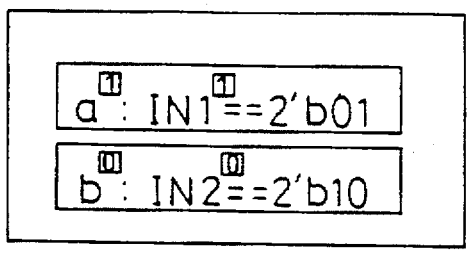
Fig.48(c)
| | reg1 [2] | reg2 [1] |
|---|---|---|
| c [0] | 1 | 0 |
| d [1] | — | 1 |

```
set_clock  -period 10  -wave{3,10}  clock;
set_hold   clock;
```

```
set_delay 4  -from IN1  -to OUT1;
set_delay 4  -from IN2  -to OUT1;
set_delay 4  -from IN2  -to OUT2;
set_delay 5  -from IN3  -to OUT1;
set_delay 5  -from IN3  -to OUT2;
```

APPARATUS AND METHOD OF SUPPORTING FUNCTIONAL DESIGN OF LOGIC CIRCUIT AND APPARATUS AND METHOD OF VERIFYING FUNCTIONAL DESIGN OF LOGIC CIRCUIT

This is a continuation application of application Ser. No. 08/238,745 filed May 5, 1994, now abandoned.

BACKGROUND OF THE INVENTION

The present invention relates to an apparatus and method of supporting and verifying, in designing a logic circuit, the functional design of the logic circuit by means of a functional diagram in which the operation of the logic circuit is represented by symbols, tables, characters, and the like and to an apparatus and method of verifying the functional design of a logic circuit.

In general, logic design plays a major part in designing a logic circuit. The logic design has conventionally been achieved by means of a logic design support apparatus through such a procedure as shown in FIG. 58: First, a logic design drawing is created by laying out symbols representing logic elements on the screen of a display unit and connecting the symbols by lines. Then, the logic design support apparatus generates netlist information from the resulting logic design drawing.

FIG. 58 is a block diagram showing the structure of the logic design support apparatus.

In the drawing, a reference numeral 501 designates an input unit, 502 designates a CRT monitor for displaying a logic design drawing described by a logic-design-drawing editor unit 505, 503 designates a processor of the logic, design support apparatus, and 504 designates a logic-design-drawing-information storage unit for storing logic-design-drawing information on logic elements representing the logic of a logic circuit and on the interconnection thereof.

The logic-design-drawing editor element 505 has functions of: describing the logic design drawing on the screen of the CRT monitor 502; storing, in the logic-design-drawing-information storage unit 504, the logic-design-drawing information on the described logic design drawing; and reading the logic-design-drawing information from the logic-design-drawing-information storage unit 504.

A logic-design-drawing check element 506 reads the logic-design-drawing information from the logic-design-drawing-information storage unit 504 and detects the presence or absence of a contradiction in the logic design drawing indicated by the logic-design-drawing information.

A logic simulation element 507 reads the logic-design-drawing-information which has undergone the detection by the logic-design-drawing check element 506 and hence is free from contradiction, and executes logic simulation with respect to the logic design drawing, thereby verifying the logic of the logic circuit.

A net list conversion element 508 reads, from the logic-design-drawing-information storage unit 504, the logic-design-drawing information which has undergone the logic verification by the logic simulation element 507 and generates netlist information from the logic design drawing.

A reference numeral 509 designates the netlist information generated by the netlist conversion element 508.

As the logic circuit has become more complicated and larger in scale, however, there arises a need for design which is higher in level than the logic design. In view of the foregoing circumstances, there has recently been practiced a method in which the operations of a circuit is described in a hardware description language by means of a text editor and the netlist information is generated from the hardware description language through logical synthesis.

In addition to the method mentioned above, there is also known a method in which a part of the operation of a logic circuit is graphically designed by means of a tool such as: SPeeDCHART-VHDL (Nikkei Electronics, No. 565, Oct. 12, p.239 (1992)), whereby a state transition diagram representing the operation of the control part of a logic circuit is inputted so that the operation is verified in the state transition diagram and that a hardware description language representing the operation is automatically generated; or a design system for ASIC supported by a calculator which is disclosed in Japanese Laid-Open Patent Publication No. 1-309185, whereby the data flow in a logic circuit is represented using a flow chart so that the function thereof is verified in the flow chart and that a netlist is automatically generated from the flow chart.

In the above logic design support apparatus, the logic of the logic circuit is represented by laying out the symbols representing its logic elements and connecting the symbols by lines, while functional design should be accomplished based on a higher-level concept of data transfer to the state transition diagram and to storage elements. Consequently, with the above logic design support apparatus, the functional design cannot be achieved satisfactorily by simply replacing the logic elements by the storage elements, so that it is difficult to apply the above logic design support apparatus to the functional design.

Moreover, in the case of designing using a hardware description language, a logic-circuit designer who is familiar with a circuit diagram may find a difficulty in using a user interface whereby the operation of a logic circuit is described in a language, resulting in much labor and time required for the operation.

In the case of designing using the state transition diagram or flow chart, only a part of the operation of the logic circuit can be designed, so that the other parts of the operation should eventually be designed using a hardware description language.

For example, the state transition diagram can describe only the control operation of the logic circuit. The flow chart representing the data-flow can also describe only the control operation. To describe the whole operation of the logic circuit, however, it is required to describe the data processing operation, control operation, and combinational logic, so that the conventional design in graphic representation is not satisfactory.

SUMMARY OF THE INVENTION

The present invention has been achieved in view of the foregoing. An object of the present invention is to provide an apparatus having a user-friendly interface, wherein all the operations of a logic circuit can be inputted by means of symbols, tables, characters, and the like without using any hardware description language, functional verification can be performed by means of the symbols, tables, characters, and the like, and a hardware description language can be generated from the symbols, tables, characters, and the like.

To achieve the above object, a first functional design support apparatus of the present invention comprises: a display unit for displaying graphic elements such as symbols, tables, and characters; a storage unit for storing functional diagram information on a functional diagram in which the operational function of the logic circuit is represented by said graphic elements; a functional diagram editor means having a function of describing, by means of the graphic elements, a functional diagram on the screen of said display unit, a function of storing, in said storage unit, the functional diagram information on the described functional diagram, and a function of reading the functional diagram information from set storage unit; a functional diagram check means for reading, from said storage unit, the functional diagram information on the functional-diagram described by said functional diagram editor means and detecting the presence or absence of a contradiction in said functional diagram;. a functional simulation means for reading, from said storage unit, the functional diagram information on the functional diagram which has been detected for a contradiction by said functional diagram check means and performing functional verification with respect to said functional diagram; a hardware-description-language conversion means for reading, from said storage unit, the functional diagram information on the functional diagram which has undergone the functional verification performed by said functional simulation means and generating a hardware description language from said functional diagram; and a logic synthesis means for accepting the hardware description language generated by said functional-description-language conversion means and generating netlist information.

With the above structure, a functional diagram for representing the operation of the logic circuit can be generated, by the functional diagram editor means, on the screen of the display unit using graphic elements such as symbols, tables, and characters. Thus, it becomes possible to carry out the functional design of the logic circuit without using the hardware description language. It is also possible to automatically generate the hardware description language from the above functional diagram and to further obtain the netlist information from the generated hardware description language. Hence, the above apparatus provides the following effects:

(1) It saves the designer of a logic circuit the labor of mastering the hardware description language, which is not used therein.

(2) It enables the accumulation and extensive use of design resources, for the hardware description language is not used therein.

(3) It provides a more visible image of the designed circuit to the designer, for the functional design of the logic circuit is carried out by means of graphic images such as symbols, tables, and characters.

(4) It reduces the period of time required for designing a logic circuit.

(5) It can expect the standardization of techniques for designing a logic circuit.

In the above first functional design support apparatus, it is preferred that Preferably, in the above first functional design support apparatus 1, said display unit has a multi-window consisting of first, second, third, and fourth windows, and said functional diagram editor means has: a state-transition-diagram editor means for describing, in the first window of said display unit, a control part of the logic circuit in the form of a state transition diagram; a data path editor means for describing, in the second window of said display unit, a data path part of the logic circuit in the form of a data path diagram which shows the layout of functional elements and the interconnection thereof; a truth table editor means for describing, in the third window of said display unit, a combinational circuit part of the logic circuit in the form of a truth table; and a logical expression editor means for describing, in the forth window of said display unit, that combinational circuit of the combinational circuit part of the logic circuit, which is difficult to represent on a truth table, in the form of a logical expression table.

With the above structure, it is possible to simultaneously describe a plurality of functional diagrams of the state transition diagram, data path diagram, truth table, and logical expression table in the multi-window of the display unit. Hence, the apparatus provides the following effects:

(1) It can expect the widespread and expanded use of the functional design using the state transition diagram, data path diagram, truth table, and logical expression table.

(2) It can efficiently describe the operations of the logic circuit in accordance with its function, because it uses the state transition diagram, data path diagram, and truth table or logical expression table in describing the operations with respect to the control part, data path part, and combinational circuit part of the logic circuit, respectively.

(3) In the case of designing a large-scale logic circuit, the above apparatus divides the logic circuit into several parts so that the individual parts are described in a plurality of windows, for it can simultaneously describe, in the multi-window of the display unit, the plurality of functional diagrams of the state transition diagram, data path diagram, truth table, and logical expression table. Accordingly, design efficiency is improved and the designed circuit becomes more visible.

Preferably, in the above first functional design support apparatus, the above functional diagram check means has: a check means having a function of reading the functional diagram information from said storage unit and judging, based on check rules, whether or not a contradiction exists in the functional diagram indicated by said functional diagram information and a function of generating check result information; a check result screen display means for displaying the check result information on the screen of said display unit; and an error-report-file generation means for generating, from the check result information, an error report file which was obtained by organizing check results. With the above structure, the connection, definition, and reference in the functional diagram can easily be recognized, so that a mistake at an early stage can easily be detected.

A second functional design support apparatus of the present invention is composed of the first functional design support apparatus which further comprises: a language based function simulator for accepting the hardware description language generated by said hardware-description-language conversion means and performing functional simulation in the hardware description language, wherein said hardware-description-language conversion means has: a conversion means for simulation for converting the functional diagram information to a hardware description language for simulation which is suitable for said language based function simulator; and a conversion means for logic synthesis for converting the functional diagram information to a hardware description language for logic synthesis which is suitable for said logic synthesis means and which ensures that the operation of the logic circuit after the logic synthesis is identical with a functional simulation result in said hardware description language for simulation, which is implemented by said language based function simulator.

With the above structure, in the functional design using the functional diagram information, a hardware description language for logic synthesis which is suitable for the logic synthesis means or a hardware description language for functional simulation which is suitable for the language based function simulator is generated from the functional diagram information, so that it becomes possible to obtain a circuit which ensures the same operation in logic synthesis and functional simulation.

Preferably, in the above second functional design support apparatus, said conversion means for logic synthesis has: a conversion means for converting the functional diagram information to a hardware description language suitable for said logic synthesis means, which implements, after logic synthesis, a conditional transfer in a data path diagram indicated by said functional diagram information as a selector without priority; a conversion means for converting the functional diagram information to a hardware description language suitable for said logic synthesis means, which implements, after the logic synthesis, the conditional transfer in the data path diagram indicated by said functional diagram information as a selector with priority; a conversion means for converting the functional diagram information to a hardware description language suitable for said logic synthesis means, which implements, after the logic synthesis, the conditional transfer in the data path diagram indicated by said functional diagram information as a tri-state without priority; and a conversion means for converting the functional diagram information to a hardware description language suitable for said logic synthesis means which implements, after the logic synthesis, the conditional transfer in the data path diagram indicated by said functional diagram information as a tri-state with priority.

With the above structure, in the functional design using the functional diagram information, a hardware description language for logic synthesis suitable for the circuit structure to be implemented after logic synthesis is generated from the functional diagram information, so that a logic circuit of desired structure can be obtained after logic synthesis.

Preferably, in the above second functional design support apparatus, said logic synthesis means has: a first logic synthesis means suitable for the state transition diagram; a second logic synthesis means suitable for the data path diagram; and a third logic synthesis means suitable for random logic, and said conversion means for logic synthesis has: a state-transition-diagram conversion means for converting information on the state transition diagram, which is included by the functional diagram information, to a hardware description language suitable for said first logic synthesis means; a data-path-diagram conversion means for converting information on the data path diagram, which is included by the functional diagram information, to a hardware description language suitable for said second logic synthesis means; a truth table conversion means for converting information on a truth table, which is included by the functional diagram information, to a hardware description language suitable for said second logic synthesis means; and a logical expression conversion means for converting information on a logical expression table, which is included by the functional diagram information, to a hardware description language suitable for said third logic synthesis means.

With the above structure, in the functional design using the functional diagram information, the control part of the circuit is converted to a hardware description language suitable for a logic synthesis means for the state transition diagram, the data path part of the circuit is converted to a hardware description language suitable for a logic synthesis means for the data path, and the random logic of the circuit is converted to a hardware description language suitable for a logic synthesis means for the random logic, so that an optimum logic circuit can be obtained after logic synthesis.

Preferably, in the above second functional design support apparatus, said conversion means for logic synthesis has: a first conversion means for converting data-path-diagram information on each facility such as a register or a terminal in the data path diagram, which is included by the functional diagram information, to a hardware description language suitable for said logic synthesis means, which implements, after logic synthesis, a conditional transfer in each facility as a selector without priority; a second conversion means for converting said data-path-diagram information on each facility to a hardware description language suitable for said logic synthesis means, which implements, after the logic synthesis, the conditional transfer in each facility as a selector with priority; a third conversion means for converting said data path diagram information on each facility to a hardware description language suitable for said logic synthesis means, which implements, after the logic synthesis, the conditional transfer in each facility as a tri-state without priority; and a fourth conversion means for converting said data-path-diagram information on each facility to a hardware description language suitable for said logic synthesis means, which implements, after the logic synthesis, the conditional transfer in each facility as a tri-state with priority, and said logic synthesis conversion means reads the functional diagram information from said storage unit and operates, in each facility in the data path diagram, said first conversion means, said second conversion means, said third conversion means, or said fourth conversion means in consideration of the desired circuit model structure to be obtained after the logic synthesis.

With the above structure, it becomes possible in the functional design using the functional design information to generate, from the functional diagram information, a hardware description language for logic synthesis which is suitable for the circuit structure to be implemented after logic synthesis, so that a logic circuit in which each facility has a desired circuit structure can be obtained after logic synthesis.

A third functional design support apparatus of the present invention is composed of the above first functional design support apparatus, wherein said functional simulation means has: a function simulator means for executing forward step simulation, in which the operational function of the logic circuit is simulated for a specified period of simulation time t based on the state value at a simulation time T so as to obtain the state value at a simulation time (T+t); an input display means for accepting test data used in the simulation executed by said function simulator means and displaying a functional simulation result which is implemented by said function simulator means; and a control means for controlling the transfer of said test data from said input display means to said function simulator means and the transfer of said functional simulation result from said function simulator means to said input display means.

With the above structure, it becomes possible to execute functional simulation for a limited period of time. Moreover, every time functional simulation is executed, test data can be inputted and the simulation result can be displayed. Hence, the operational functions can be verified halfway through the simulation so that an error in test data can be detected at an early stage.

A fourth functional design support apparatus is composed of the above third functional design support apparatus, wherein said function simulator means further has a function of executing backward simulation for obtaining the state value at a simulation time (T-nxt) (n is an integer equal to or more than 1).

With the above structure, it becomes possible to return the simulation time to the past. Consequently, it becomes possible to restart the functional simulation so that, even if the inputted data contains an error or if the inputted data is to be changed, it is not required to restart the functional simulation from the time 0. Hence, the period required for verifying the operational functions of the logic circuit can be reduced, resulting in increased verification efficiency.

Preferably, in the above third or fourth functional design support apparatus, said input display means has a hardware-description-language input display means for accepting said test data in the hardware description language in which the operational function of the logic circuit is described in a statement and displaying said functional simulation result in said hardware description language, and said control means has a hardware-description-language input display control means for controlling said hardware-description-language input display means.

With the above structure, it becomes possible to, e.g., input test data and display the functional simulation result in the hardware description language for the circuit to be subjected to the functional simulation, which is displayed in the multi-window of the display unit. Consequently, the functional operation of the circuit can be verified easily in the hardware description language.

A fifth functional design support apparatus of the present invention is composed of the above third functional design support apparatus of the present invention, wherein said input display means has a functional diagram input display means for accepting, as said test data, a pattern in the functional diagram in which the operational function of the logic circuit is represented by means of graphic elements such as symbols, tables, and characters and displaying said functional simulation result in said functional diagram, and said control means has a functional diagram input display control means for controlling said functional diagram input display means.

With the above structure, it becomes possible to, e.g., input a pattern and display the functional simulation result in the functional diagram of the circuit to be subjected to functional simulation, which is displayed in the multi-window of the display unit. Consequently, it becomes possible to easily recognize the state values of the circuit models operating in parallel, so that the operational function of the logic circuit operating in parallel can be verified more easily and more efficiently. Moreover, in a debugging operation, the cause of an error can be tracked down spatially in the functional diagram, so that debug efficiency can be increased.

Preferably, in the above fifth functional design support apparatus, said functional diagram input display means has a data-path-diagram input display means for accepting, as said test data, a pattern in data-path-diagram representation in which the operational function of the logic circuit is represented in the data path diagram and displaying said functional simulation result in said data-path-diagram representation, and said functional diagram input display control means has a data-path-diagram input display control means for controlling said data-path-diagram input display means.

Moreover, in the above fifth functional design support apparatus, said functional diagram input display means has a state-transition-diagram input display means for accepting, as said test data, a pattern in state-transition-diagram representation in which the operational function of the logic circuit is represented in the state transition diagram and displaying said functional simulation result in said state-transition-diagram representation, and said functional diagram input display control means has a state-transition-diagram input display control means for controlling said state-transition-diagram input display means.

Furthermore, in the above fifth functional design support apparatus, said functional diagram input display means has a logical expression input display means for accepting, as said test data, a pattern in logical expression representation in which the operational function of the logic circuit is represented in a logical expression and displaying said functional simulation result in said logical expression representation, and said functional diagram input display control means has a logical expression input display control means for controlling said logical expression input display means.

Furthermore, in the above fifth functional design support apparatus, said functional diagram input display means has a truth table input display means for accepting, as said test data, a pattern in truth table representation in which the operational function of the logic circuit is represented in a truth table and displaying said functional simulation result in said truth table representation, and said functional diagram input display control means has a truth table input display control means for controlling said truth table input display means.

With the above structure, it becomes possible to, e.g., input a pattern and display the functional simulation result in the data path diagram, state transition diagram, logical expression representation, truth table representation of the circuit to be subjected to functional simulation, which are displayed in the multi-window of the display unit. Consequently, the operational functions of the logic circuit operating in parallel can be verified more easily and more efficiently. Moreover, since the cause of an error can be tracked down spatially in the individual diagrams in a debugging operation, debug efficiency can also be increased.

Preferably, in the above third or fourth functional design support apparatus, said input display means has a control panel display means for displaying a control panel which controls the execution of functional simulation by said function simulator means and the inputting of said test data, and said control means has a control panel display control means for controlling said control panel display means.

With the above structure, it becomes possible to, e.g., control the execution of functional simulation and the inputting of test data on the control panel displayed in the multi-window of the display unit. Consequently, functional simulation can be performed interactively, so that the operational function of the logic circuit can be verified with improved efficiency.

Preferably, in the above third or fourth functional design support apparatus, said function simulator means has a state value storage table for holding a state value transition history at all the simulation times for each circuit model constituting the logic circuit. With the above structure, it becomes possible in the functional simulation process not only to perform time forward functional simulation but also to switch halfway to time backward functional simulation, thereby rapidly returning to a past time, so that the operational function of the logic circuit can be verified with increased efficiency.

Preferably, in the above third or fourth functional design support apparatus, said function simulator means has: an event list composed of a list of events for storing information on changes in the state value; an event processing means for fetching an event from said event list, selecting a process to be performed depending on the type of said fetched event, and updating the state value; and an evaluation means for evaluating an element which may undergo a new change in the state value due to the updating of the state value by said event processing means and, if a change occurs in the state value, storing information on the change in an event so that the event is added to said event list, and said event processing means has: a processing means for fetching an event from said event list; a processing means for judging the type of the event fetched by said processing means; a processing means for updating the state value; a processing means for updating the state value of a clock signal; and a processing means for updating an input data signal of a register.

With the above structure, in the case where a clock signal and an input signal change at the same time in a storage element such as a register or RAM which operates in synchronization with the rise edge or fall edge of the clock signal, if there is a time difference between an event process with respect to the change in the clock signal and an event process with respect to the change in the input signal, the same functional simulation result can be obtained. Hence, the same operation can be ensured in functional simulation. A sixth functional design support apparatus of the present invention is composed of the above third or fourth functional design support apparatus, wherein said input display means has: an encode means for accepting an n-bit input signal ($n \leq 2$) in which each bit is represented by one of logic signals 0, 1, X, and Z and encoding each bit of said input signal to an encoded bit consisting of a 0-drive bit which indicates whether or not the logic value of said bit can be 0 and a 1-drive bit which indicates whether or not the logic value of said bit can be 1 so as, to generate an encoded input signal consisting of a 0-drive word composed of n 0-drive bits and a 1-drive word composed of n 1-drive bits; and a decode means for accepting an encoded output signal consisting of the 0-drive word composed of n 0-drive bits and the 1-drive word composed of n 1-drive bits and restoring a combination of the m-th ($1 \leq m \leq n$) 0-drive bit in the 0-drive word of said encoded output signal and the m-th 1-drive bit in the 1-drive word of the encoded output signal to representation by one of the logic signals 0, 1, X, and Z so as to generate an n-bit output signal, and said function simulator means has: a ZX conversion means for accepting said encoded input signal and converting that encoded bit of the n encoded bits in said encoded input signal, which corresponds to the logic signal Z, to the encoded bit which corresponds to the logic signal X so as to generate a converted signal; and an output signal evaluation means for accepting said converted signal and obtaining, based on the 0-drive word and 1-drive word of said converted signal, the 0-drive word and 1-drive word which correspond to the result of a logic operation to be subjected to functional simulation so as to generate said encoded output signal.

A functional design verification apparatus for verifying the functional design of a logic circuit comprises: an encode means for accepting an n-bit input signal ($n \leq 2$) in which each bit is represented by one of logic signals 0, 1, X, and Z and encoding each bit of said input signal to an encoded bit consisting of a 0-drive bit which indicates whether or not the logic value of said bit can be 0 and a 1-drive bit which indicates whether or not the logic value of said bit can be 1 so as to generate an encoded input signal consisting of a Q-drive word composed of n 0-drive bits and a 1-drive word composed of n 1-drive bits; and a ZX conversion means for accepting said encoded input signal and converting that encoded bit of the n encoded bits in said encoded input signal, which corresponds to the logic signal Z, to the encoded bit which corresponds to the logic signal X so as to generate a converted signal; an output signal evaluation means for accepting said converted signal and obtaining, based on the 0-drive word and 1-drive word of said converted signal, the 0-drive word and 1-drive word which correspond to the result of a logic operation to be subjected to functional simulation so as to generate the encoded output signal consisting of the obtained 0-drive word and 1-drive word; and a decode means for accepting said encoded output signal and restoring a combination of the m-th ($1 \leq m \leq n$) 0-drive bit in the 0-drive word of said encoded output signal and the m-th 1-drive bit in the 1-drive word of the encoded output signal to representation by one of the logic signals 0, 1, X, and Z so as to generate an n-bit output signal.

With the above structure, it becomes possible for the encode means to encode each bit of the multi-bit input signal, represented by one of the four values of the logic signals 0, 1, X, and Z, by the two bits of the 0-drive bit which indicates whether or not the logic value becomes 0 and the 1-drive bit which indicates whether or not the logic value becomes 1. Moreover, in the encoded input signal, the ZX conversion means converts the encoded bit corresponding to the logic signal Z to the encoded bit corresponding to the logic signal X. Based on the 0-drive word and 1-drive word of the converted signal, the output signal evaluation means obtains the 0-drive word and 1-drive word which correspond to the result of the logic operation to be subjected to functional simulation, so as to generate the encoded output signal. In this case, since the two drive words are composed of the binary logic signals 0 and 1, it is possible to simultaneously obtain all the bits in the encoded output signal corresponding to the result of the logic operation to be subjected to functional simulation. Each drive bit in the 0-drive word and 1-drive word of the encoded output signal thus obtained is restored by the decode means to representation by one of the four values of the logic signals 0, 1, X, and Z, thereby generating the output signal.

As described above, since the multi-bit input signal represented by the four values can be encoded to the binary encoded input signal composed of the 0-drive word and 1-drive word, multiple digits can be processed at the same time by treating the logic signal represented by the four values as the binary signal. Consequently, it is unnecessary to obtain the result of an operation for each bit, so that the logic operation between multi-bit logic signals represented by the four values can be performed at a higher speed.

Preferably, in the above sixth functional design support apparatus, said ZX conversion means has: a logical OR evaluation means for accepting the encoded input signal from said encode means, performing the logical OR operation between the 0-drive word and 1-drive word of said encoded input signal, and outputting the result of the operation as an intermediate result; a bit inversion means for accepting said intermediate result, performing the logical NOT operation with respect to said intermediate result, and outputting the result of the operation as a ZX conversion mask; and a ZX-conversion-mask processing means for accepting said encoded input signal and said ZX conversion mask, performing the logical OR operation between the 0-drive word of said encoded input signal and said ZX conversion mask, outputting the result of the operation as the 0-drive word of the converted signal, performing the logical OR operation between the 1-drive word of said encoded input signal and said ZX conversion mask, and outputting the result of the operation as the 1-drive word of the converted signal.

In the above functional design support apparatus, said ZX conversion means has: a logical OR evaluation means for accepting the encoded input signal from said encode means, performing the logical OR operation between the 0-drive word and 1-drive word of said encoded input signal, and outputting the result of the operation as an intermediate result; a bit inversion means for accepting said intermediate result, performs the logical NOT operation with respect to said intermediate result, and outputting the result of the operation as a ZX conversion mask; and a ZX-conversion-mask processing means for accepting said encoded input signal and said ZX conversion mask, performing the logical OR operation between the 0-drive word of said encoded input signal and said ZX conversion mask, outputting the result of the operation as the 0-drive word of the converted signal, performing the logical OR operation between the 1-drive word of said encoded input signal and said ZX conversion mask, and outputting the result of the operation as the 1-drive word of the converted signal.

With the above structure, each bit in the intermediate result outputted from the logical OR evaluation means is inverted by the bit inversion means, resulting in the ZX conversion mask. The ZX conversion mask processing means accepts the encoded input signal and ZX conversion mask, performs the logical OR operation between the 0-drive word of the encoded input signal and the ZX conversion mask, and performs the logical OR operation between the 1-drive word of the encoded input signal and the ZX conversion mask. Consequently, the former logical OR is outputted as the 0-drive word of the converted signal, while the latter logical OR is outputted as the 1-drive word of the converted signal. Hence, it becomes possible to easily execute the ZX conversion whereby the encoded bit corresponding to the logical signal Z in the encoded input signal to the encoded bit corresponding to the logical signal X.

Preferably, the above third or fourth functional design support apparatus further comprises a test vector generation means for generating, based on said functional simulation result, a test vector which describes the content of the test data. With the above structure, it becomes possible to generate a test pattern for the language based function simulator from the result of the functional simulation that has been performed interactively using the test data inputted in order to interactively debug the logic circuit. Therefore, it becomes possible to interactively generate the test data and correct it, while debugging the logic circuit and verifying the operational function thereof, so that the test vector for the language based function simulator can be generated and corrected interactively. As a result, it becomes possible to automatically generate a highly reliable test vector, while it becomes unnecessary to newly generate a test vector for the language based functional simulator, so that the design of the logic circuit can be verified in a reduced period of time with increased efficiency.

Preferably, in the above third or fourth functional design support apparatus, said control means is divided into a function-simulator control part for controlling said function simulator means and an input display control part for controlling said input display means. With the above structure, since the control means is divided into the input display control part for controlling the input display means and the function simulator control part for controlling the function simulator means, if the function of the input display means is to be changed or added to, it is sufficient to change only the input display control part without changing the function simulator control part. Conversely, if the function of the functional simulator means is to be changed or added to, it is sufficient to change only the function simulator control part. Consequently, the apparatus can easily satisfy the user's requirements, so that it becomes possible to realize an environment in which the operational function of a logic circuit can be verified efficiently.

Preferably, in the above third functional design support apparatus, said function simulator means further has a function of executing forward jump simulation, in which the operational function of the logic circuit is simulated for a period of simulation time (mxt) (m is an integer equal to or more than 2) based on the state value at the simulation time T so as to obtain the state value at a simulation time (T+mxt), and said control means has: a forward step control means for controlling the execution of said forward step simulation; a forward jump control means for controlling the execution of said forward jump simulation; a pattern setting control means for setting said test data to said function simulator means; and a result fetch control means for fetching said functional simulation result from said function simulator means.

In the above functional design support apparatus, said function simulator means further has a function of executing forward jump simulation by simulating, based on the state value at the simulation time T, the operational function of the logic circuit for a period of simulation time (mxt) (m is an integer equal to or more than 2) so as to obtain the state value at a simulation time (T+mxt), and said control means has: a forward step control means for controlling the execution of said forward step simulation; a forward jump control means for controlling the execution of said forward jump simulation; a pattern setting control means for setting said test data to said function simulator means; and a result fetch control means for fetching said functional simulation result from said function simulator means.

With the above structure, it becomes possible to select, if required, from the various types of functional simulations and execute the selected one. Moreover, since it becomes possible during executing the functional simulation to input test data including the test pattern, periodic pattern, and memory pattern and fetch the existing functional simulation result, the operational functions of the logic circuit can be verified with increased efficiency.

Preferably, in the above third or fourth functional design support apparatus, said input display means has a table input display means for accepting, as said test data, a pattern in tabular form and displaying said functional simulation result in tabular form, and said control means has a table input display control means for controlling said table input display means.

With the above structure, it becomes possible to, e.g., input the pattern in tabular form and display the functional simulation result in the window of the display unit. Consequently, the user can easily recognize the state values of the individual circuit models operating in parallel not in a sequence of characters but on a table, so that the operational functions of the logic circuit can be verified more easily than in the case where they are verified using only characters, resulting in increased verification efficiency.

Preferably, in the above third or fourth functional design support apparatus, said input display means has a waveform input display means for accepting, as said test data, a waveform pattern and displaying said functional simulation result in waveform, and said control means has a waveform input display control means for controlling said waveform input display means.

With the above structure, it becomes possible to, e.g., input the pattern in the form of a wave and display the functional simulation result in the window of the display unit. Consequently, the operational functions of the logic circuit can be verified more easily than in the case where they are verified using only characters, resulting in increased verification efficiency.

Preferably, in the above third or fourth functional design support apparatus, said input display means has a memory pattern input display means for accepting, as said test data, the memory pattern of a memory in the logic circuit and displaying the memory pattern as said functional simulation result, and said control means has a memory pattern input display control means for controlling said memory pattern input display means.

With the above structure, it becomes possible to input the memory pattern with ease using, e.g., a cursor mode function, copy function, count function, and change function. It is also possible to display the memory pattern every time functional simulation is executed. Consequently, the operational function of the logic circuit provided with a memory can easily be verified in a reduced period of time with increased efficiency.

Preferably, in the above third or fourth functional design support apparatus, said input display means has a pattern history input display means for displaying, in tabular form, the past test data used in the simulation previously executed by said function simulator means and accepting, as new test data, the test data selected from said past test data, and said control means has a pattern history input display control means for controlling said pattern history input display means.

With the above structure, it becomes possible to, e.g., display the previously inputted test data in the window of the display unit and, by selecting from the test data displayed, reuse the previously inputted test data. Consequently, in the case of restarting functional simulation, it becomes unnecessary to manually input test data from the beginning. By simply selecting the test data displayed by the pattern history input display means, the test data is automatically transferred to the function simulator means, so that functional simulation can be executed. If the selected test data contains an error, it can be eliminated by selectively correcting the faulty data, while leaving the other displayed test data as it is. If the logic circuit is changed, the test data can similarly be reused by simply storing the result of the previous functional simulation in a file and loading it. Hence, the operational functions of the logic circuit can be verified in a reduced period of time with increased efficiency.

A functional design verification method of verifying the functional design of a logic circuit comprises: a test data input step of inputting test data; a forward simulation step of simulating, based on said inputted test data, the operational function of the logic circuit for a specified period of simulation time; and a result display step of displaying a functional simulation result obtained through the execution of said forward simulation step.

With the above structure, functional simulation can be executed in a limited period of time. Moreover, every time functional simulation is executed, test data can be inputted and the functional simulation result can be displayed. Consequently, the operational functions of the logic circuit can be verified halfway through the simulation, so that an error in the test data can be detected at an early stage.

A second functional design verification method of verifying the functional design of a logic circuit of the present invention, wherein the state values of the logic circuit at all the simulation times antecedent to the current simulation time are preliminarily stored, comprises: a backward simulation step of returning the simulation time to a past simulation time so as to obtain, as a functional simulation result, the state value of the logic circuit at said past simulation time; and a result display step of displaying said functional simulation result obtained through the execution of said backward simulation step.

Moreover, in the above second functional design verification method, said backward simulation step is for obtaining the state value of the logic circuit at the preceding simulation time by returning the simulation time to the preceding simulation time.

With the above structure, it becomes possible to recognize the state values at the past simulation time. Consequently, if the logic circuit or test data contains an error, a trace back operation can easily be performed in order to tack down its cause, resulting in increased debug efficiency.

A third functional design verification method of verifying the functional design of a logic circuit of the present invention, wherein a state value storage table which can hold all the state values of the logic circuit at all the simulation times is preliminarily provided, comprises: a test data input step of inputting test data; a test data set step of setting, as the state value of the logic circuit at a simulation time T, said inputted test data to said state value storage table; a state value read step of reading, from said state value storage table, the state value of the logic circuit at the simulation time T, which has been held in the state value storage table; a forward simulation step of simulating, based on said read state value, the operational function of the logic circuit for a specified period of simulation time t; a result write step of writing, as the state value of the logic circuit at a simulation time (T+t), a forward simulation result obtained through the execution of said forward simulation step in said state value storage table; a first result display step of displaying said forward simulation result as the state value of the logic circuit at the simulation time (T+t) written in said state value storage table; a step of newly setting, after the execution of said first result display step, the simulation time (T+t) as a simulation time T and repeatedly executing the sequence of said state value read step, forward simulation step, result write step, and first result display step so as to set, to said state value storage table, the state values of the logic circuit at all the simulation times antecedent to the simulation time TO; a backward simulation step of updating the current simulation time in said state value storage table from the simulation time TO to a simulation time (TO-nxt) (n is an integer equal to or more than 1) so as to obtain, as a backward simulation result, the state value of the logic circuit at the simulation time (TO-nxt), which has been held in said state value storage table; and a second result display step of displaying said backward simulation result obtained through the execution of said backward simulation.

With the above structure, the state values at all the simulation times antecedent to the current simulation time can be set on the state value storage table by repeatedly executing functional simulation. With the use of the state value storage table, the simulation time can be returned to the past with ease, so that it is not required to restart the functional simulation from the time 0 even if the inputted test data contains an error or if the inputted test data is to be changed. Consequently, the operational functions of the logic circuit can be verified in a reduced period of time with increased efficiency.

Preferably, in the above first functional design verification method, said test data in said test data input step is a pattern in a functional diagram in which the operational function of the logic circuit is represented by graphic elements such as symbols, tables, and characters and said result display step is for displaying said functional simulation result in said functional diagram.

In the above second functional design verification method, said result display step is for displaying said functional simulation result in a functional diagram in which the operational function of the logic circuit is represented by graphic elements such as symbols, tables, and characters.

In the above third functional design verification said test data in said test data input step is a pattern in a functional diagram in which the operational function of the logic circuit is represented by graphic elements such as symbols, tables, and characters; said first result display step is for displaying said forward simulation result in said functional diagram; and said second result display step is for displaying said backward simulation result in said functional diagram.

With the above structure, it becomes possible to, e.g., input a pattern and display the functional simulation result in the functional diagram of the circuit to be subjected to functional simulation, which is displayed in the multi-window of the display unit. As a result, the state values of the individual circuit models operating in parallel can easily be recognized, so that the operational functions of the logic circuit operating in parallel can be verified more easily and efficiently. Moreover, since it is possible in a debugging operation to spatially track down the cause of an error in the functional diagram, debug efficiency can be increased. A seventh functional design support apparatus of the present invention is composed of the above first functional design support apparatus which further comprises: a design-constraint-information input means having a function of accepting design constraint information from the outside, a function of reading, from said storage unit, the functional diagram information on the functional diagram described by said functional diagram editor means, and a function of setting the design constraint information in said functional diagram; a design-constraint-information check means for reading, from said storage unit, the functional diagram information on the functional diagram in which the design constraint information was set by said design-constraint-information input means and detecting the presence or absence of a contradiction in said design constraint information; a design-constraint-description-language conversion means for reading, from said storage unit, the functional diagram information on the functional diagram in which the design constraint information was set by said design-constraint-information input means, analyzing said design constraint information in the functional diagram, and generating a design constraint description language; and a language based function simulator for accepting the hardware description language generated by said hardware-description-language conversion means and the design constraint description language generated by said design-constraint-description-language conversion means and performing functional simulation in the hardware description language, wherein said functional simulation means accepts, from said storage unit, the functional diagram information on the functional diagram in which the design constraint information was set by said design-constraint-information input means and performs, based on said design constraint information, delay simulation in the functional diagram, thereby performing a timing verification, and said logic synthesis means accepts the hardware description language generated by said hardware-description-language conversion means and the design constraint description language generated by said design-constraint-description-language conversion means and generates netlist information.

A functional design support method of supporting the functional design of a logic circuit of the present invention comprises: a step of generating a functional diagram by means of graphic elements such as symbols, tables, and characters; a step of detecting the presence or absence of a contradiction in the functional diagram; a step of correcting the functional diagram by means of said graphic elements; a step of accepting design constraint information and setting said design constraint information in the functional diagram; a step of judging whether or not an error exists in the design constraint information; a step of correcting the design constraint information in the functional diagram; a step of performing the functional verification and timing verification of the logic circuit based on the functional diagram and design constraint information; and a step of generating a hardware description language and a design constraint description language from the functional diagram and design constraint information.

With the above structure, it becomes possible to set, in the functional diagram in which the operations of the logic circuit are represented, the design constraint information including the timing constraint information, fan-out, fan-in, and delay constraint information. Consequently, the above method provides the following effects:

(1) Design efficiency is increased because the user can clearly recognize the manner in which the design constraints are set for the logic circuit.

(2) The user can obtain the netlist information reflecting the design constraints without using a design constraint description language, for the hardware description language and design constraint description language can be generated automatically. Hence, a circuit having a desired function can be logically synthesized in a relatively short period of time, so that the period required for designing a logic circuit can be reduced.

(3) It becomes possible to perform delay simulation and timing verification in the functional diagram, so that highly precise functional simulation can be performed in the functional diagram.

Preferably, in the above seventh functional design support apparatus, said design-constraint-information input means has a function of accepting a periodic waveform for a clock input pin of the logic circuit and a function of setting the periodic waveform to the clock input pin in the functional diagram; and said design-constraint-description-language conversion means generates the design constraint description language for setting, to said logic synthesis means, timing constraint information, including setup time and hold time of a register, for the periodic waveform set in the functional diagram by said design-constraint-information input means.

With the above structure, it becomes possible to set, to the logic synthesis means, constraints on the logic circuit such as the set-up time and hold-time of its register as the design constraints, so that a circuit approximate to a desired circuit can be obtained at a higher level of the design process.

Preferably, in the above seventh functional design support apparatus, said design-constraint-information input means has a function of accepting a fan-out for an external input pin of the logic circuit and a fan-in for an external output pin of the logic circuit and a function of setting the fan-out to the external input pin in the functional diagram and the fan-in to the external output pin in the functional diagram, and said design-constraint-description-language conversion means generates the design constraint description language for setting, to said logic synthesis means, information on the fan-out and fan-in set in the functional diagram by said design-constraint-information input means.

With the above structure, it becomes possible to set, to the logic synthesis means, the fan-out for the external input pin of the logic circuit and the fan-in for the external output pin of the logic circuit as the design constraints, so that a circuit approximate to a desired circuit can be obtained at a higher level of the design process.

Preferably, in the above seventh functional design support apparatus, said design constraint information input means has a function of accepting delay values for a terminal serving as a component of the logic circuit incapable of storing the state value, for a register serving as a component of the logic circuit capable of storing the state value, and for an external pin of the logic circuit, a function of setting the delay value to the terminal in the functional diagram, a function of setting the delay value to the register in the functional diagram, and a function of setting the delay value to the external pin in the functional diagram, said functional simulation means performs said delay simulation based on the delay values set to the terminal, register, and external pin in the functional diagram by said design-constraint-information input means, and said design-constraint-description-language conversion means generates the design constraint description language for setting, to said logic synthesis means, delay information based on the delay values set in the functional diagram by said design-constraint-information input means.

With the above structure, it becomes possible to set the delay time to the components of the logic circuit and set the delay time to the logic synthesis means as the design constraint. It also becomes possible to perform delay functional simulation in the functional diagram using the functional simulation means. Consequently, a circuit approximate to a desired circuit can be obtained, so that more detailed simulation can be performed.

BRIEF DESCRIPTION OF THE DRAWINGS

FIG. 9(a) is a view showing an example of a state transition diagram window;

FIGS. 9(b) and 9(c) are views showing an example of a data-path-diagram window;

FIG. 9(d) is a view showing an example of a truth table window;

FIG. 10 is a block diagram showing an example of the structure of a check element of the above functional diagram check element;

FIG. 11 is a view showing a specific example of check result information;

FIG. 14(a) is a view showing an example of the state transition diagram to be converted by a state-transition-diagram conversion element according to the first embodiment;

FIG. 14(b) is a view showing a hardware description language obtained by converting the state transition diagram of FIG. 14(a);

FIG. 15(a) is a view showing an example of the data path diagram to be converted by a data path conversion element according to the first embodiment;

FIG. 15(b) is a view showing a hardware description language obtained by converting the data path diagram of FIG. 15(a);

FIG. 16(a) is a view showing an example of the truth table to be converted by a truth table conversion element according to the first embodiment;

FIG. 16(b) shows the truth table hardware description language obtained by converting the truth table of FIG. 16(a);

FIG. 17(a) s a view snowing an example of the logical expression table to be converted by a logical expression conversion element according to the first embodiment;

FIG. 17(b) is a view showing a hardware description language obtained by converting the logical expression table of FIG. 17(a);

FIG. 19 is a view showing an example of the data path diagram to be converted by the data-path-diagram conversion element of FIG. 18;

FIG. 20(a) is a view showing a hardware description language obtained through the conversion of the data path diagram of FIG. 19 by the data-path-diagram conversion element of FIG. 18;

FIG. 20(b) is a circuit diagram of a circuit obtained by logically synthesizing the hardware description language of FIG. 20(a);

FIG. 24(a) is a view showing a hardware description language obtained by converting a register RegA in the data path diagram of FIG. 23;

FIG. 24(b) is a view showing a hardware description language obtained by converting a register RegB in the data path diagram of FIG. 23;

FIG. 28 is a view showing a state value storage table of the above function simulator element;

FIG. 29 is a view showing changes in state values resulting from the functional simulation operation of the above function simulator element;

FIG. 33 is a view showing the correspondence of an input and an output when an encoder according to the first embodiment performs encoding;

FIG. 34 is a view showing a specific example of the encoding of a logic signal;

FIG. 37 is a view showing a specific example of the above ZX conversion element;

FIG. 40 is a view showing changes in simulation time due to the functional simulation control operation by a function simulator control element according to the first embodiment;

FIGS. 42(a) and 42(b) are data path diagrams showing a logic circuit to be subjected to functional simulation;

FIG. 42(c) is a view showing a pattern in tabular form inputted to and displayed by a table input display element according to the first embodiment;

FIG. 44 is a view showing a memory pattern inputted to and displayed by a memory pattern input display element according to the first embodiment;

FIG. 48(a) is view showing a pattern inputted to and displayed by a state-transition-diagram input display element according to the first embodiment;

FIG. 48(b) is a view showing a pattern inputted to and displayed by a logical expression input display element according to the first embodiment;

FIG. 48(c) is a view showing a pattern inputted to and displayed by a truth table input display element according to the first embodiment;

DETAILED DESCRIPTION OF THE PREFERRED EMBODIMENTS

Example 1

Figure 1:
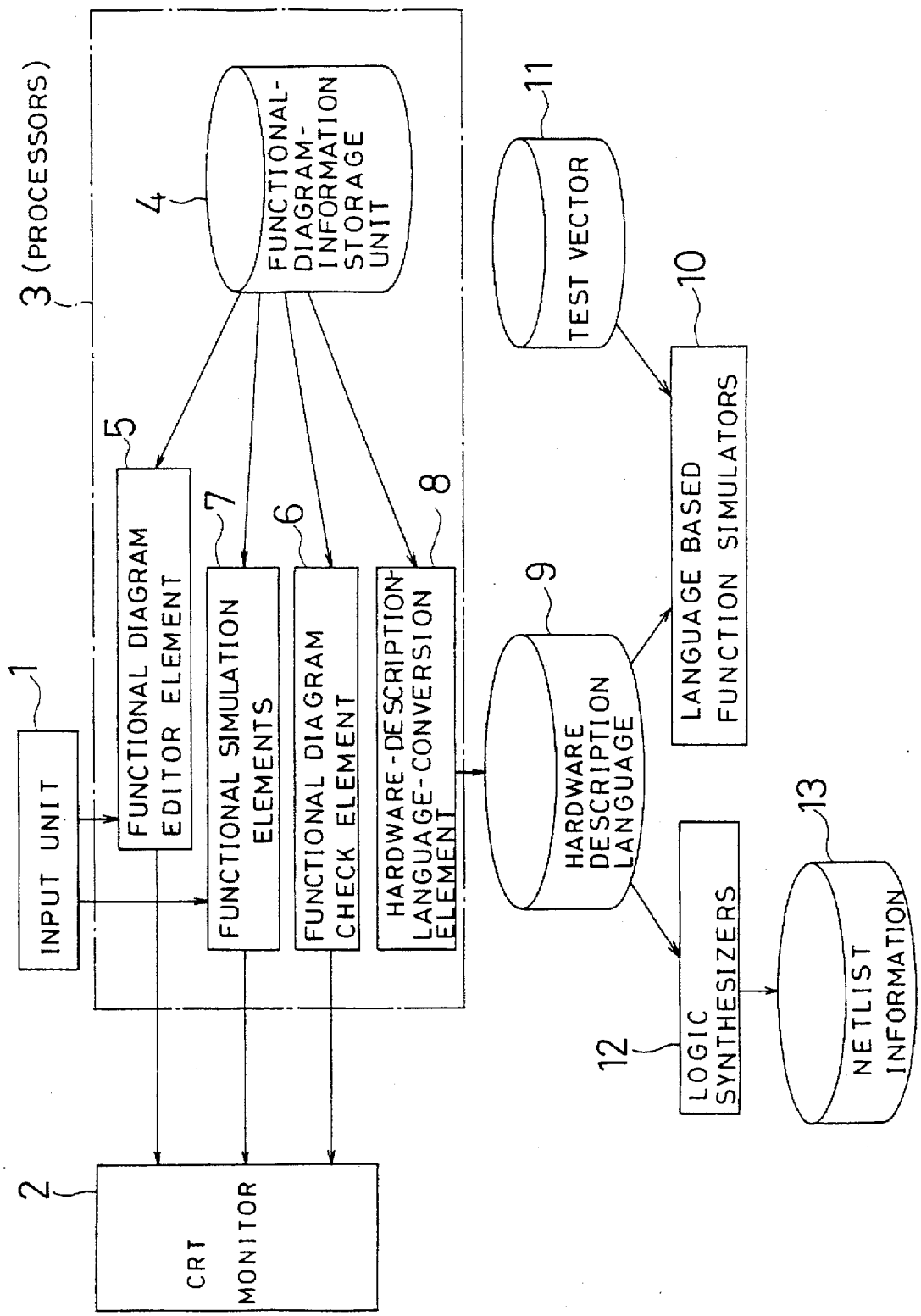
FIG. 1 is a block diagram showing the overall structure of a functional design support apparatus according to a first embodiment of the present invention.

Referring now to the drawings, a functional design support apparatus according to a first embodiment of the present invention will be described above. (Overall Structure of Functional Design Support Apparatus)

FIG. 1 is a block diagram showing the overall structure of the functional design support apparatus according to the first embodiment.

In the drawing, a reference numeral 1 designates an input unit for accepting data from the outside.

A reference numeral 2 designates a CRT monitor for displaying information.

A reference numeral 3 designates a processor of the functional design support apparatus comprising a functional-diagram-information storage unit 4, a functional diagram editor element 5, a functional diagram check element 6, a functional simulation element 7, and a functional description-language conversion element 8.

The functional-diagram-information storage unit 4 stores functional diagram information on a functional diagram in which the operation of a logic circuit is represented by symbols, tables, characters, and the like.

The functional diagram editor element 5 has functions of: describing the functional diagram by means of symbols, tables, characters, and the like on the screen of the CRT monitor 2; storing, in the functional diagram-information storage unit 4, functional diagram information on the described functional diagram; and reading the functional diagram information from the functional diagram-information storage unit 4.

The functional diagram check element 6 reads the functional diagram information from the functional-diagram-information storage unit 4 and detects the presence or absence of a contradiction in the functional diagram indicated by the functional diagram information. The functional diagram information read here includes information on the functional diagram described by the functional diagram editor element 5, information on the functional diagram described in other element, and the like.

The functional simulation element 7 reads, from the functional diagram-information storage unit 4, functional diagram information free from contradiction, as a result of the detection by the functional diagram check element 6 and the correction by the functional diagram editor element 5, and executes functional simulation with respect to the functional diagram, thereby verifying the function of the logic circuit.

A hardware-description-language conversion element 8 reads functional diagram information on the functional diagram which has undergone the functional verification by the functional simulation element 7 and generates a hardware description language from the functional diagram.

A reference numeral 9 designates the hardware description language generated by the hardware-description-language conversion element 8.

A reference numeral 10 designates a language based function simulator which accepts the hardware description language 9 and a test vector so as to perform functional simulation at a high speed in the hardware description language.

A reference numeral 11 designates the test vector to be inputted to the language based function simulator 10.

A reference numeral 12 designates a logic synthesizer which accepts the hardware description language 9 and generates netlist information.

A reference numeral 13 designates the netlist information generated by the logic synthesizer 12.

Figure 2:
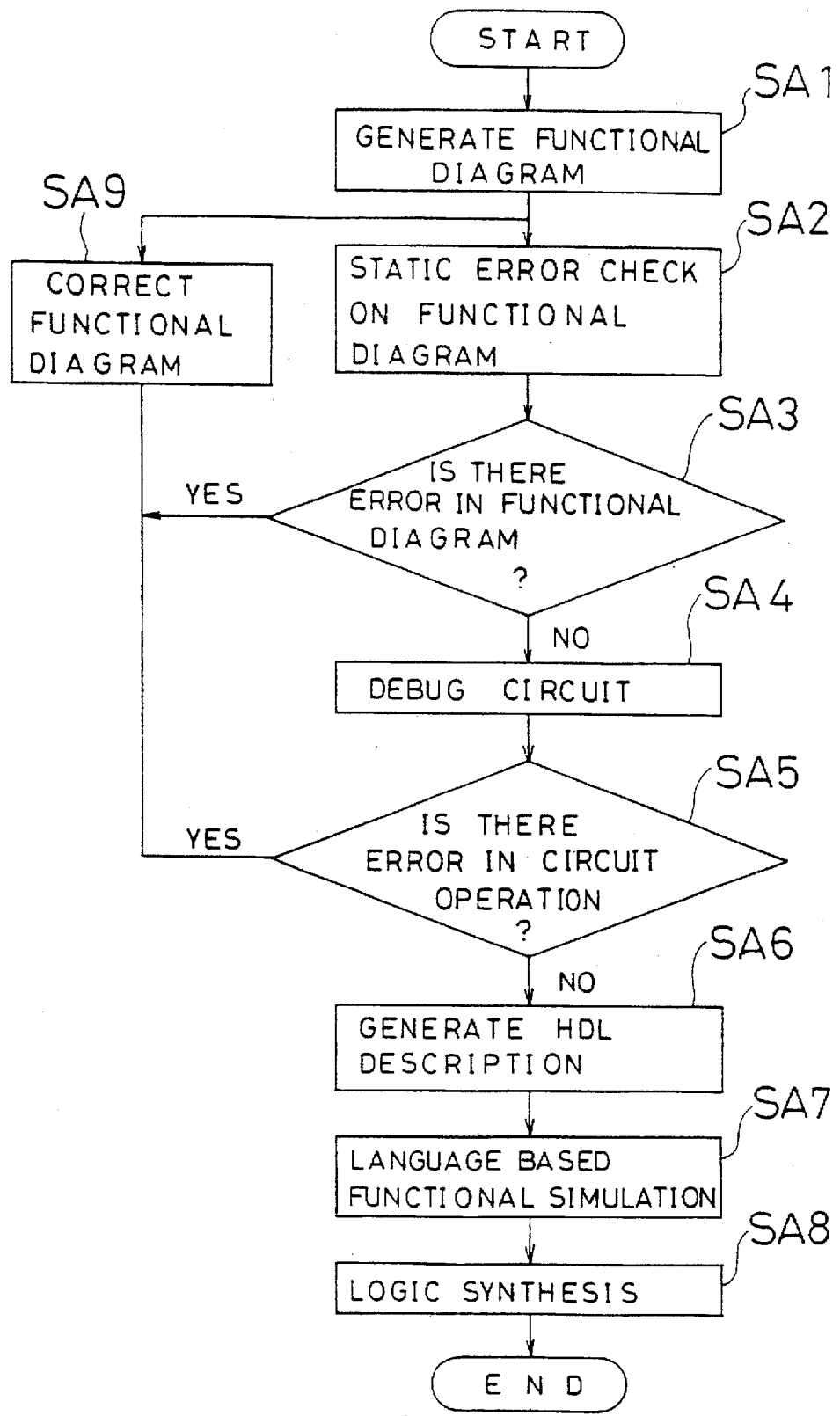
FIG. 2 is a flow chart showing a functional design support method using the above functional design support apparatus.

FIG. 2 is a flow chart showing a functional design support method using the functional design support apparatus thus constituted.

First, as shown in Step SA1 of the flow chart, the functional diagram editor element 5 generates a functional diagram using symbols, tables, characters, and the like.

Next, in Step SA2, the functional diagram check element 6 accepts the functional diagram generated in Step SA1 and detects the presence or absence of a contradiction in the functional diagram.

Next, in Step SA3, it is determined whether or not a contradiction exists in the functional diagram. If there is no contradiction, the process goes on to Step SA4. On the other hand, if there is any contradiction, the process goes on to Step SA9 where the functional diagram is corrected using symbols, tables, characters, and the like, thereby returning to Step SA2.

In Step SA4, the functional simulation element 7 executes functional simulation in the functional diagram, so as to verify the function of the logic circuit.

Next, in Step SA5, it is determined whether or not an error exists in the operation of the logic circuit. If there is no error, the process goes on to Step SA6. On the other hand, if there is any error, the process goes on to Step SA9 where the functional diagram is corrected using symbols, tables, characters, and the like, thereby returning to Step SA2.

In the case where the functional diagram contains any contradiction or where the circuit operation represented by the functional diagram contains any error, above Steps SA2 to SA5 and Step SA9 are repeatedly performed.

If the functional diagram contains no more contradiction and if the circuit operation represented by the functional diagram contains no more error, the hardware-description-language conversion element 8 generates the hardware description language 9 from the functional diagram in Step SA6.

Subsequently, in Step SA7, the language based function simulator 10 accepts the hardware description language 9 generated in Step SA6 as well as the test vector 11 and performs functional simulation in the hardware description language.

Next, in Step SA8, the logic synthesizer 12 accepts the hardware description language 9 and generates the netlist information 13.

Thus, with the functional design support apparatus of the present embodiment, the functional design of a logic circuit can be implemented by generating a functional diagram in which the operation of the logic circuit is represented by symbols, tables, characters, and the like, without using a hardware description language. The hardware description language can be generated automatically from the functional diagram. Moreover, with the logic synthesizer, it is also possible to obtain netlist information from the hardware description language generated.

The present embodiment can be implemented both on a dedicated hardware and on a calculator having a CPU and a memory.

(Functional Diagram Editor Element)

Below, the functional diagram editor element 5 of the functional design support apparatus according to the first embodiment will be described in detail.

Figure 3:
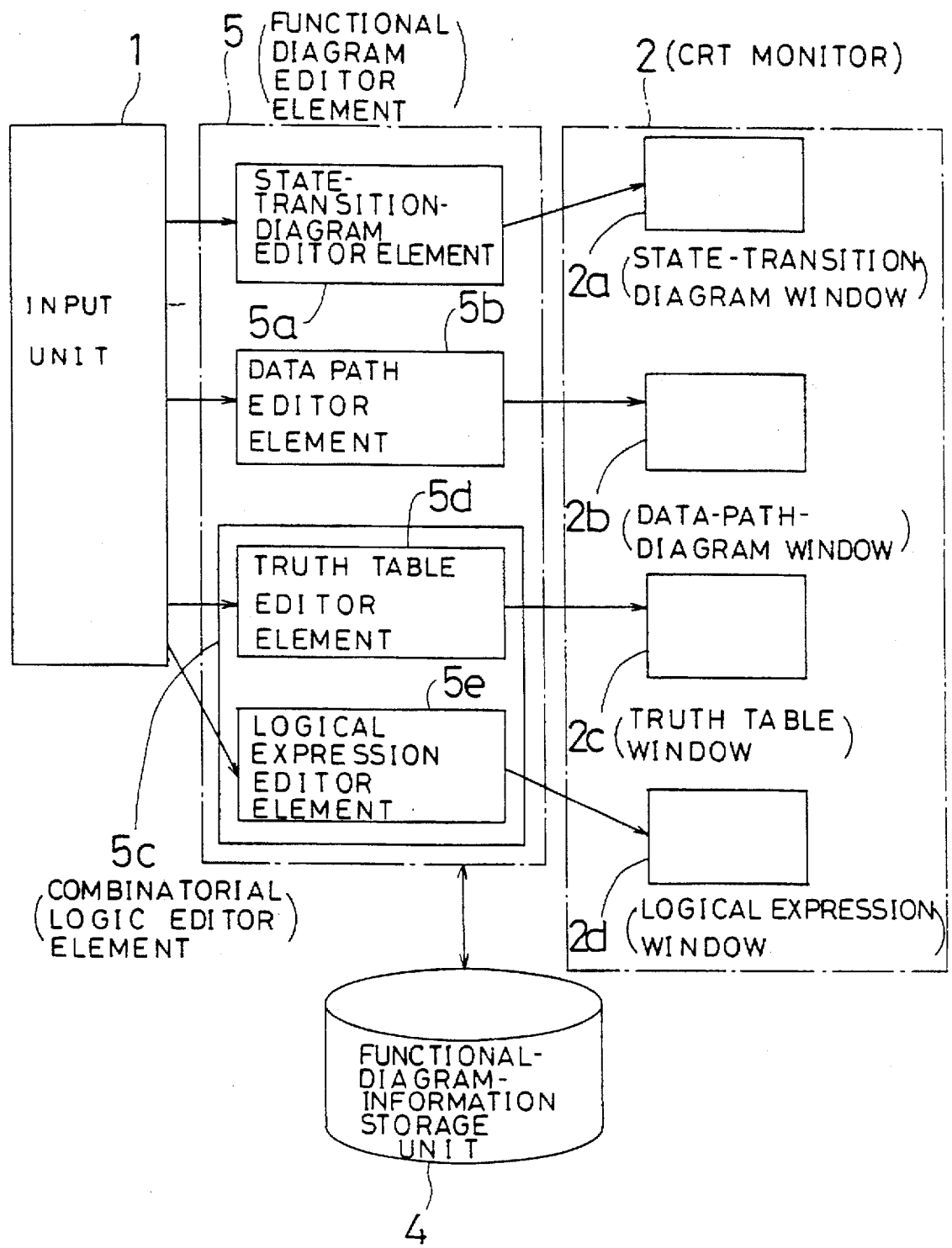
FIG. 3 is a block diagram showing an example of the structure of a functional diagram editor element according to the first embodiment.

FIG. 3 is a block diagram showing an example of the structure of the functional diagram editor element 5. In the drawing, a functional diagram-information storage unit 4 stores functional diagram information on a functional diagram in which the operation of a logic circuit is represented by symbols, tables, characters, and the like, similarly to the corresponding unit shown in FIG. 1.

It is possible to design the logic circuit so that it is constituted by: a control part for controlling the operation; a data path part for showing data flow; and a combinational circuit part. The functional diagram editor element 5 comprises: a state-transition-diagram editor element 5a provided corresponding to the control part of the logic circuit; a data path editor element 5b provided corresponding to the data path part of the logic circuit; and a combinatorial logic editor element 5c provided corresponding to the combinational circuit part of the logic circuit. The combinatorial logic editor element 5c has a truth table editor element 5d and a logical expression editor element 5e.

The state-transition-diagram editor element 5a describes, in the multi-window of the CRT monitor 2, the control part of the logic circuit in the form of a state transition diagram. The state-transition-diagram editor element 5a also has a function of storing, in the functional diagram-information storage unit 4, the functional diagram in the form of a described state transition diagram and a function of accepting, from the functional diagram-information storage unit 4, the functional diagram in the form of a state transition diagram.

The data path editor element 5b describes, in the multi-window of the CRT monitor 2, the data path part of the logic circuit in the form of a data path diagram which shows the layout of functional elements and the interconnection thereof. The data path editor element 5b also has a function of storing, in the functional diagram-information storage unit 4, the functional diagram in the form of a described data path diagram and a function of accepting, from the functional diagram-information storage unit 4, the functional diagram in the form of a data path diagram.

The truth table editor element 5d describes, in the multi-window of the CRT monitor 2, the combinational circuit part of the logic circuit in the form of a truth table. The truth table editor element 5d also has a function of storing, in the functional diagram-information storage unit 4, the functional diagram in the form of a described truth table and a function of accepting, from the functional-diagram-information storage unit 4, the functional diagram in the form of a truth table.

The logical expression editor unit 5e describes, in the multi-window of the CRT monitor 2, that one of the combinational circuits of the logic circuit which is difficult to describe in a truth table in the form of a logical expression table. The logical expression editor element 5e also has a function of storing, in the functional diagram-information storage unit 4, the functional diagram in the form of a described logical expression table and a function of accepting, from the functional diagram-information storage unit 4, the functional diagram in the form of a logical expression table.

A reference numeral 2a designates, among windows constituting the multi-window of the CRT monitor 2, a state-transition-diagram window for displaying the state transition diagram to be edited by the state-transition-diagram editor element 5a.

A reference numeral 2b designates, among the windows constituting the multi-window of the CRT monitor 2, a data-path-diagram window for displaying the data path diagram to be edited by the data path editor element 5b.

A reference numeral 2c designates, among the windows constituting the multi-window of the CRT monitor 2, a truth table window for displaying the truth table to be edited by the truth table editor element 5d A reference numeral 2d designates, among the windows constituting the multi-window of the CRT monitor 2, a logical expression window for displaying the logical expression table to be edited by the logical expression editor element 5e.

As described above, with the functional design support apparatus of the present embodiment, it is possible to simultaneously describe the state transition diagram, data path diagram, truth table, and logical expression table in the multi-window of the CRT monitor 2 by means of the state-transition-diagram editor element 5a, data path editor element 5b, truth table editor element 5d, and logical expression editor element 5e.

Here, the functional diagrams described by the individual editor units will be explained with reference to FIGS. 4, 5, 6, and 7.

Figure 4:
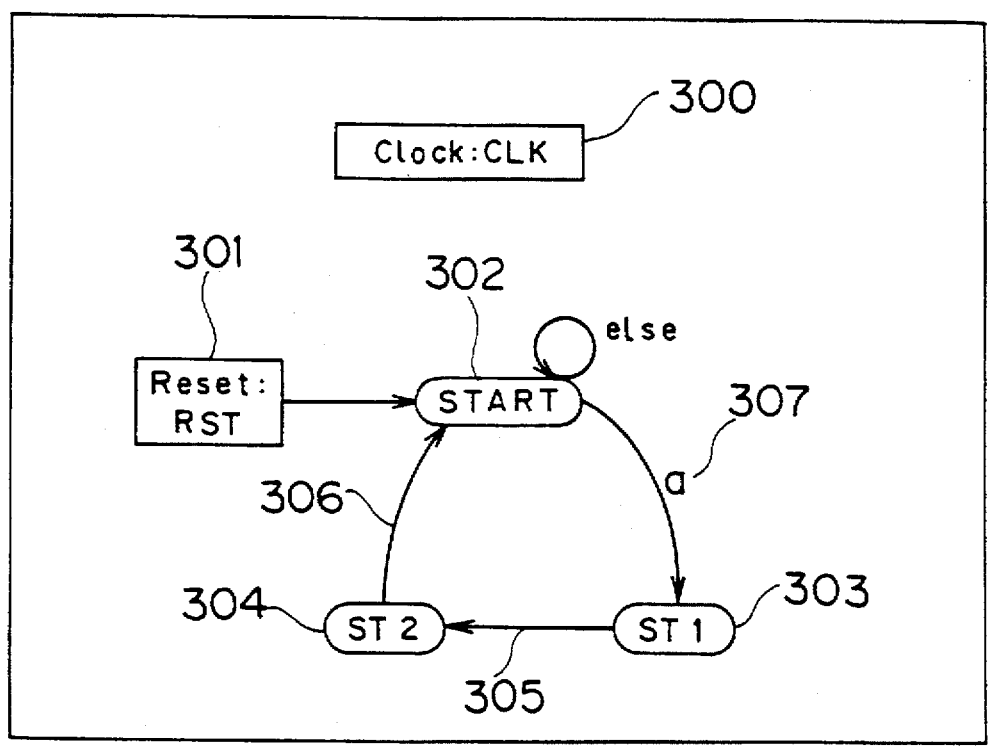
FIG. 4 is a view showing a specific example of a state transition diagram described by a state transition editor element according to the first embodiment.

FIG. 4 is a specific example of the state transition diagram described by the state-transition-diagram editor element 5a. In the drawing, a reference numeral 300 designates a state transition clock signal specification which specifies a clock signal for controlling the state transition, 301 designates a reset signal specification which describes a signal for forcibly returning the state under transition to the initial state and specifies the initial state by an arrow. Reference numerals 302, 303, and 304 show the states under transition. The arrows from the states show the destinations of the states after transition. The state 302 is the initial state prior to transition specified by the reset signal specification 301. Reference numerals 305 and 306 designate arrows for unconditional transition which indicates unconditional transition to the next state in synchronization with the clock signal specified by the state transition clock signal 300. A reference numeral 307 designates a condition label for conditional state transition. When the signal value of the condition label is 1, "START" of the state 302 changes to "ST1" of the state 303 in synchronization with the clock signal specified by the state transition clock signal specification. A reference numeral 308 designates an else label which is added to the arrow showing the destination of the state after transfer when the unconditional state transition did not occur and the conditional state transition did not occur, either.

Figure 5:
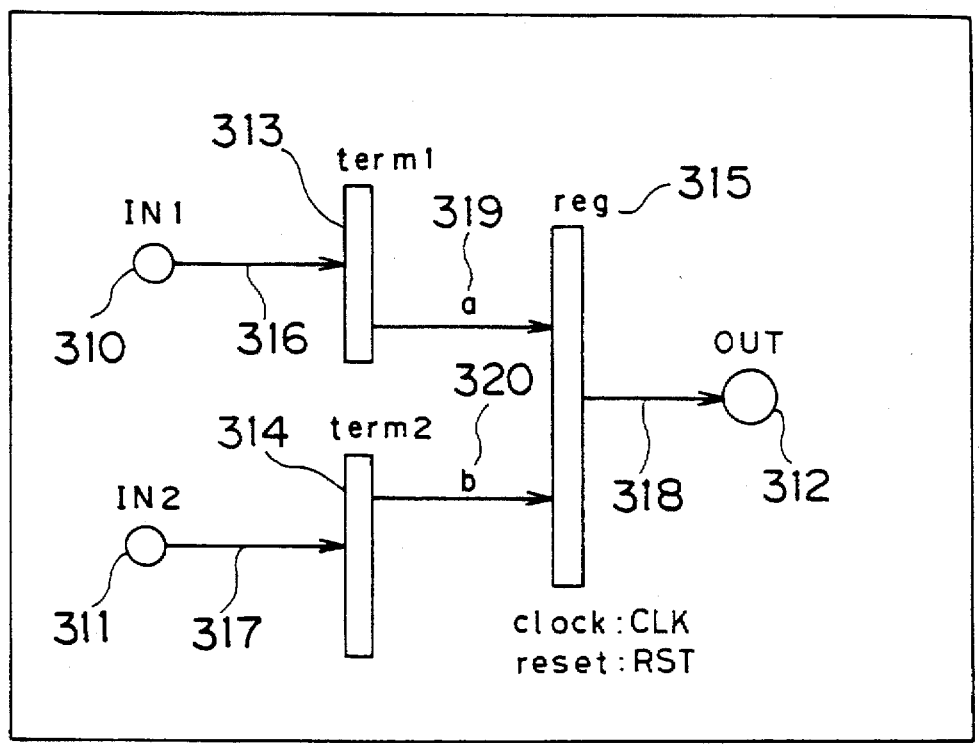
FIG. 5 is a view showing a specific example of a data path diagram described by a data path editor element according to the first embodiment.

FIG. 5 shows a specific example of the data path diagram described by the data path editor element 5b. In the drawing, reference numerals 310 and 311 designate input pins to which signal values are inputted from the outside. A reference numeral 312 designates an output pin for outputting the signal values to the outside. Reference numerals 313 and 314 designate terminals. A reference numeral 315 designates a register for storing the signal value in synchronization with the rise of the clock signal CLK and resetting the stored signal value to 0 when the reset signal RST is 1. Reference numerals 316, 317, and 318 designate arrows indicating the destinations of the signal values after unconditional propagation, which suggests the unconditional propagation of the signal values. Reference numerals 319 and 320 designate condition labels added to the conditional-propagation-destination arrow. When the signal value of the condition label is 1, the conditional-propagation-destination arrow suggests the propagation of the signal value. The other constituents of the data path diagram include: logical calculators for performing logical operations such as AND and OR operations; numeric calculators for performing arithmetic operations such as addition and subtraction; comparators; memories such as a RAM and ROM; page-to-page connectors for connecting a signal spreading over a plurality of data path diagrams; and submodules.

The logical calculators include: a logical NOT calculator; a logical AND calculator; a logical OR calculator; a logical EXCLUSIVE-OR calculator; a logical NAND calculator; a logical NOR calculator; and a logical EXCLUSIVE-NOR calculator. The arithmetic calculators include: an increment calculator; a decrement calculator; an adder without carry; a subtracter without borrow; an adder with carry; a subtracter with borrow; a multiplier; a divider; and a shift calculator. The comparators include: a magnitude comparator for comparing the magnitudes of the state values of signals; a match comparator for determining whether or not the state values of signals match; and a mismatch comparator for determining whether or not the state values of signals mismatch.

Figure 6:
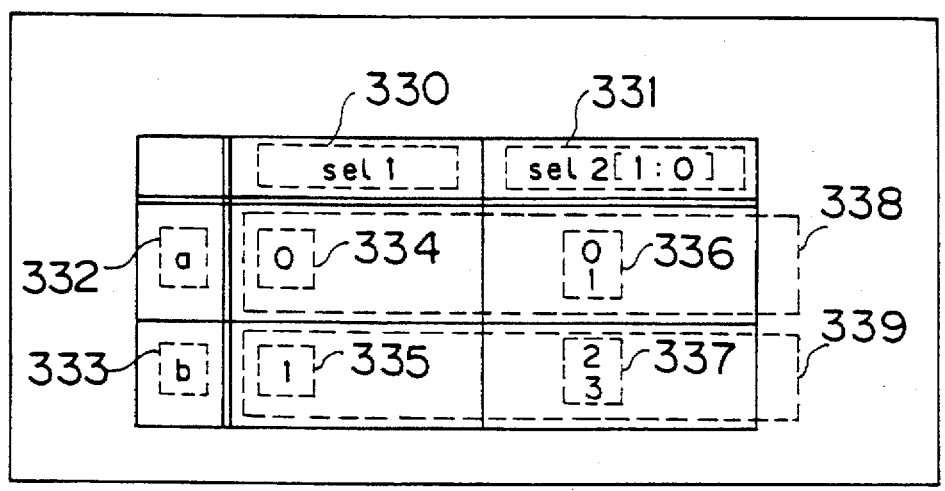
FIG. 6 is a view showing a specific example of a truth table described by a truth table editor element according to the first embodiment.

FIG. 6 shows a specific example of the truth table described by the truth table editor element 5d. In the drawing, reference numerals 330 and 331 designate reference signal names for describing signal names which are referred to by the truth table, 332 and 333 designate labels the signal values of which are determined by the conditions on the truth table, 334, 335, and 337 designate conditional-value fields in which values serving as conditions are described. It is possible to describe a plurality of conditions in each of the conditional-value fields. In this case, the conditions correspond to the logical OR of all the conditional values described in the conditional-value field. Reference numerals 338 and 339 designate logical AND conditional fields for performing the logical AND operation between the conditional values in the conditional field. The example shows the case where the condition of activating the label a is: sel1 = 1 and sel2 [1:0] =0 or 1. The condition of activating the label b is: sel1 = 1 and sel2 [1:0] is 2 or 3. It is possible to describe the name of the state transition diagram as the reference signal name. In this case, the state name described in the state transition diagram is described in the conditional-value field. It is possible to describe a plurality of reference signal names and labels on the truth table.

Figure 7:
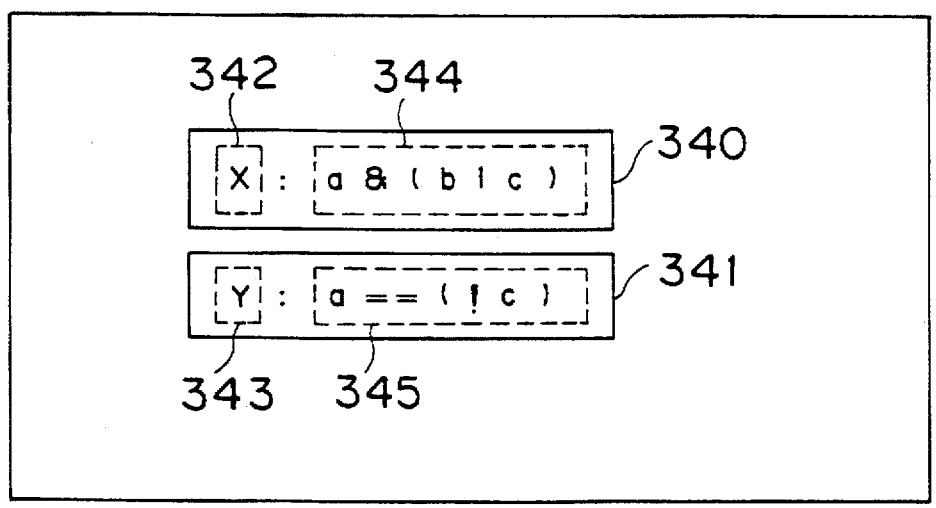
FIG. 7 is a view showing a specific example of a logical expression table described by a logical expression editor unit according to the first embodiment.

FIG. 7 shows a specific example of the logical expression table described by the logical expression editor element 5e. In the drawing, reference numerals 340 and 341 designate conditional-expression fields for describing a label name and a conditional expression in which the condition of activating the label is represented in a logical expression. Reference numerals 342 and 343 designate label names, and 344 and 345 designate conditional expressions which represent the conditions of activating the corresponding labels. The logical symbols "&," "|," "=," and "( )" represent logical AND, logical OR, comparison, and parentheses, respectively. The logic symbols which can be used in the diagram are not limited thereto. Any symbol can be used therein provided that it represents a logical operation.

The truth table or logical expression table defines the condition of activating the condition label for the conditional state transition in the state transition diagram, the condition of activating the condition label added to the conditional propagation destination arrow in the data path diagram, and the like.

(Functional Diagram Check Element)

Below, the functional diagram check element 6 of the functional design support apparatus according to the first embodiment will be described in detail.

Figure 8:
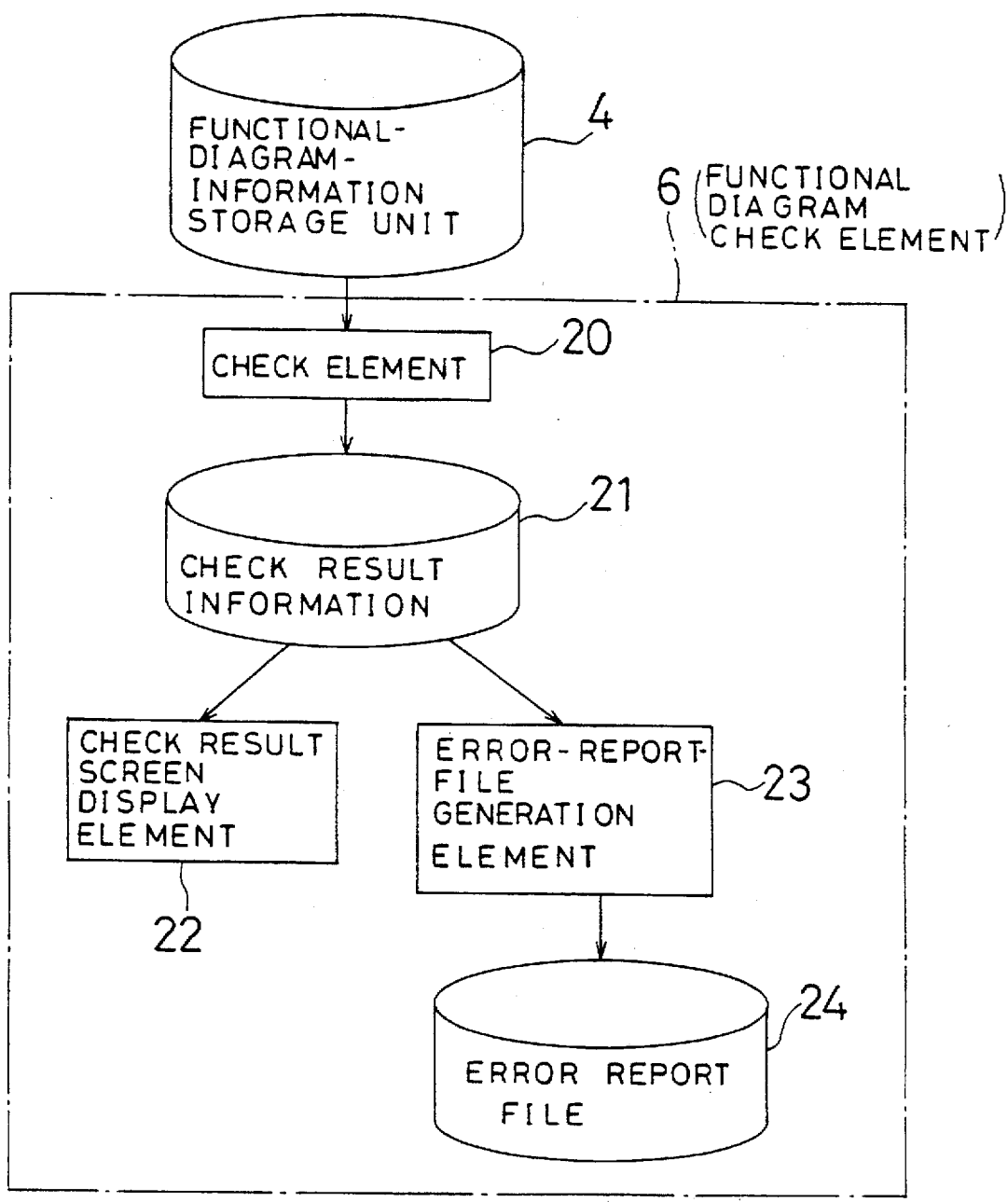
FIG. 8 is a block diagram showing an example of the structure of a functional diagram check element according to the first embodiment.

FIG. 8 is a block diagram showing an example of the structure of the functional diagram check element 6. In the drawing, a functional diagram-information storage unit 4 stores information on a functional diagram in which the operation of the logic circuit is represented by symbols, table, characters, and the like, similarly to the corresponding unit shown in FIG. 1.

The functional diagram check element 6 comprises a check element 20, a check result screen display element 22, and an error-report-file generation element 23.

The check element 20 reads functional diagram information from the functional diagram-information storage unit 4 and determines, based on check rules, whether or not the functional diagram indicated by the functional diagram information contains an error, thereby generating check result information 21.

The check result screen display element 22 displays, on the screen of the CRT monitor 2, information on the connection, definition, reference and the like of each circuit component, so that it reflects the check result information 21. This enables the cross probing of an error point and the circuit component associated with the error.

The error-report-file generation element 23 generates an error report file 24 based on the check result information 21.

The functional diagram information is implemented on the screen of the CRT monitor 2 by a plurality of windows constituting the multi-window, which are: the state-transition-diagram window representing the control part of the logic circuit; the data-path-diagram window representing the data path part of the logic circuit; and the truth table window or logical expression window representing the combinational circuit portion of the logic circuit. The names used in common in the plurality of windows are considered to designate the same components.

FIGS. 9(a), 9(b), 9(c), and 9(d) show the plurality of windows displayed on the screen of the CRT monitor 2: FIG. 9(a) shows an example of the state-transition-diagram window; FIGS. 9(b) and 9(c) show examples of the data-path-diagram window; and FIG. 9(d) shows an example of the truth table window. As shown in the drawings, the condition label Labell referred to in the state-transition-diagram window (St Machine) of FIG. 9(a) and in the data-path-diagram window (RT1) of FIG. 9(b) is defined by the truth table window (TABLE) of FIG. 9(d) by using RegA in the data-path-diagram window (RT1) of FIG. 9(b). Consequently, it becomes necessary to perform an error check over the plurality of windows in addition to the conventional error check on the connection and the like in a single window.

FIG. 10 is a block diagram showing an example of the structure of the check element 20 in the functional diagram check element 6. The check element 20 of this example is constituted so that an error check can be performed over the plurality of windows in checking the functional diagram.

Check result information 21 of FIG. 10 is the same as the one shown in FIG. 8.

In the functional diagram-information storage unit 4, there is stored: state-transition-diagram information corresponding to the state-transition-diagram window 346; data-path-diagram information corresponding to the data-path-diagram window 347; truth table information corresponding to the truth table window 348; and logical expression information corresponding to the logical expression window 349, each serving as the functional diagram information.

The check element 20 comprises: a first check element 20a for detecting a name error; a second check element 20b for detecting an undefined name; a third check element 20c for detecting duplicate names; a fourth check element 20d for detecting the disconnection between components; a fifth check element 20e for detecting an error in bit width; and a sixth check element 20f for detecting an error in the setting of the condition label. The first check element 20a detects the presence or absence of a description error in the definition of bit width which follows the name and the presence or absence of an error in which a reserved word is used in the name. The detection is performed with respect to all the windows by using the state transition diagram information, data-path-diagram information, truth table information, and logical expression information. If an error is detected, the first check element 20a outputs the check result information 21 indicating an error.

The second check element 20b examines whether or not the condition label referred to in the state-transition-diagram window 346 or data-path-diagram window 347 is defined in the truth table window 348 or logical expression window 349 by using the state-transition-diagram information, data-path-diagram information, truth table information, and logical expression information. If the condition label is not defined yet, it outputs the check result information 21 indicating the undefined condition label.

The third check element 20c examines whether or not the same name is used to define components of different types. The examination is performed with respect to all the windows by using the state-transition-diagram information, data-path-diagram information, truth table information, and logical expression information. If duplicate names are detected, the third check element elements 20c outputs the check result information 21 indicating the duplicate names.

The fourth check element 20d detects the presence or absence of any state containing no transition arrow in the state-transition-diagram window 346, the presence or absence of any functional element with no transfer arrow in the data-path-diagram window 347, and the presence or absence of any label which has not been referred to either in the truth table window 348 or in the logical expression window 349. The detection is performed with respect to each window using the state-transition-diagram information, data-path-diagram information, truth table information, and logical expression information. If the above state, functional element, or label is present, the fourth check element 20d outputs the check result information 21 indicating their presence.

The fifth check element 20e examines whether or not a transfer arrow exists between functional elements having different bit widths in the data-path-diagram window 347 or, if the bits of the functional elements defined in the data-path-diagram window 347 are partly selected and referred to in the truth table window 348 or logical expression window 349, the fifth check element 20e examines whether or not the width of the selected bit is in the range of the original bit width when it was defined. The examination is conducted using the data-path-diagram information, truth table information, and logical expression information. If there is any error in bit width, the fifth check element 20e outputs the check result information 21 indicating the bit-width error.

The sixth check element 20f examines whether or not the condition labels are set to all the transition arrows indicating the states having a plurality of transition destinations in the state-transition-diagram window 346 or whether or not the condition labels are set to all the transfer arrows of the functional element having a plurality of transfer starting functional elements in the data-path-diagram window 347. The examination is conducted using the state-transition-diagram information and data-path-diagram information. If there is any arrow to which the condition label is not set, the sixth check element 20f outputs the check result information 21 indicating the arrow to which the condition label is not set.

If the specific content of the functional diagram information read from the functional diagram-information storage unit 4 into the check element 20 corresponds to the window shown in FIG. 10, static errors contained in the functional diagram include: the undefined error in which the condition label Label5 referred to in the data-path-diagram window 347 is not defined in the truth table window 348 and in the logical expression window 349; the bit-width error in which the 4-bit register RegB is connected to the input of the 8-bit adder Add in the data-path-diagram window 347; and the condition label setting error in which, among all the transition arrows from the state St2 in the state-transition-diagram window 346, there is one to which the condition label is not set. These errors are outputted as the check result information 21, which is displayed by the check result screen display element 22 on the screen of the CRT monitor 2.

FIG. 11 shows the above check result information 21 displayed on the screen. In the drawing, a reference numeral 350 designates state transition information, 351 designates functional element connection information, and 352 designates definition and reference information for the condition label.

The state transition information 350 indicates the name of the transition destination state for each state in the state-transition-diagram window 346. The functional element connection information 351 indicates the name of the transfer starting element and the name of the transfer destination element for each functional element in the data-path-diagram window 347. If the functional element is a storage element, the name of the activation signal is also shown. The definition and reference information 352 for the condition label indicates for each condition label defined either in the truth table window 348 or in the logical expression window 349, the name of the window in which it was defined and the name of the window in which it is referred to. The check result information 21 is added to the information on the connection, definition, and reference of each circuit component.

If the label error is specified on the screen of FIG. 11 displaying the check result information, the state St2 associated with the label error in the state-transition-diagram window 346 and the transition arrow from the state St2 with no transition condition label to the state St4 are highlighted. If the bit-width error is specified on the screen of FIG. 11 displaying the check result information, the functional elements RegB and Add1 associated with the bit-width error in the data-path-diagram window 347 and the transfer arrow therebetween are highlighted. If the condition label undefined error is specified on the screen of FIG. 11 displaying the check result information, the condition label5 associated with the condition label undefined error in the data-path-diagram window 347 is highlighted. In this manner, an error point can easily be located.

In addition to the above display method using a high light, there are other methods of displaying the error point such as the blinking display method or the changing-color display method. Any display method can be used provided that it shows the error point clearly.

As described above, since the functional design support apparatus of the present embodiment is provided with the check element 20, the connection, definition, and references in the functional diagram can easily be recognized based on the check result displayed on the screen in the functional design using the functional diagram information. Consequently, it becomes possible to find out design mistakes with ease due to the check result displayed on the screen, cross-probing display of the error point, and outputted report file. (Functional Description Language Conversion Element) Below, the hardware-description-language conversion element 8 of the functional design support apparatus according to the first embodiment will be described in detail.

In general, the range covered by the description in the hardware description language for logic synthesis is narrower than the range covered by the description in the hardware description language for language-based functional simulation, so that the functional description language generated for the language based function simulator cannot be inputted to the logic synthesizer. Conversely, the hardware description language generated for the logic synthesizer can be inputted to the language based function simulator. In this case, however, the speed at which functional simulation is executed is lower than in the case where the hardware description language generated for the language based function simulator is used instead. When the same hardware description language is inputted to the logic synthesizer and to the language based function simulator, the meaning of the operation in the logic synthesizer is different from the meaning of the operation in the language based function simulator, so that the operations of the circuits in the logic synthesizer and in the language based function simulator are different. Consequently, functional verification cannot be performed effectively.

Figure 12:
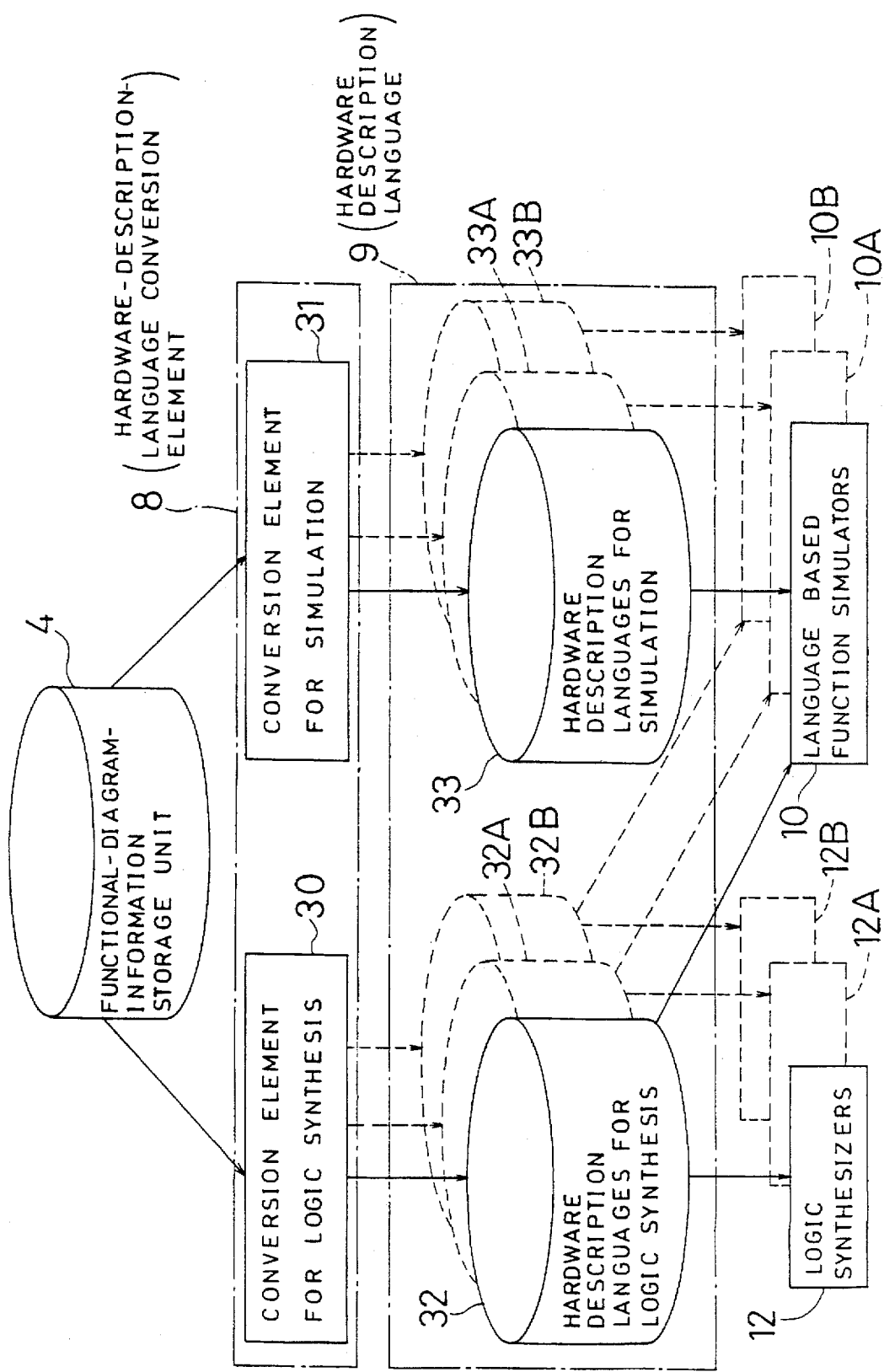
FIG. 12 is a block diagram showing an example of the structure of a hardware-description-language conversion element according to the first embodiment.

FIG. 12 is a block diagram showing an example of the structure of the hardware-description-language conversion element 8, which will solve all the problems mentioned above.

A functional diagram-information storage unit 4, hardware description language 9, language based function simulator 10, and logic synthesizer 12 shown in FIG. 12 are the same as those shown in FIG. 1.

The hardware-description-language conversion element 8 comprises a conversion element for logic synthesis 30 and a conversion element for simulation 31.

The conversion element for logic synthesis 30 reads the functional diagram information from the functional diagram-information storage unit 4 and generates, from the functional diagram information, a hardware description language for logic synthesis 32 which is suitable for the logic synthesizer 12. The conversion element for logic synthesis 30 also has a function of generating a hardware description language for logic synthesis 32A which is suitable for another logic synthesizer 12A and a function of generating a hardware description language for logic synthesis 32B which is suitable for still another logic synthesizer 12B.

The simulation conversion element 31 reads the functional diagram information from the functional-diagram-information storage unit 4 and generates, from the functional diagram information, a hardware description language for simulation 33 which is suitable for the language based function simulator 10. Moreover, the conversion element for simulation 31 has a function of generating a hardware description language for simulation 33A which is appropriate for another language based function simulator 10A and a function of generating a hardware description language for simulation 33B which is suitable for still another language based function simulator 10B.

Thus, with the functional design support apparatus of the present embodiment, the functional diagram information can be converted, by the conversion element for logic synthesis 30, to the hardware description language for logic synthesis which is suitable for the logic synthesizer. At the same time, the functional diagram information can also be converted, by the conversion element for simulation 31, to the hardware description language for language based functional simulation which is suitable for the language based function simulator. Consequently, the circuits which operate in the same manner both in the logic synthesizer and in the language based function simulator can be obtained without considering the operations of the hardware description languages, so that the above problems can be solved at the same time.

Figure 13:
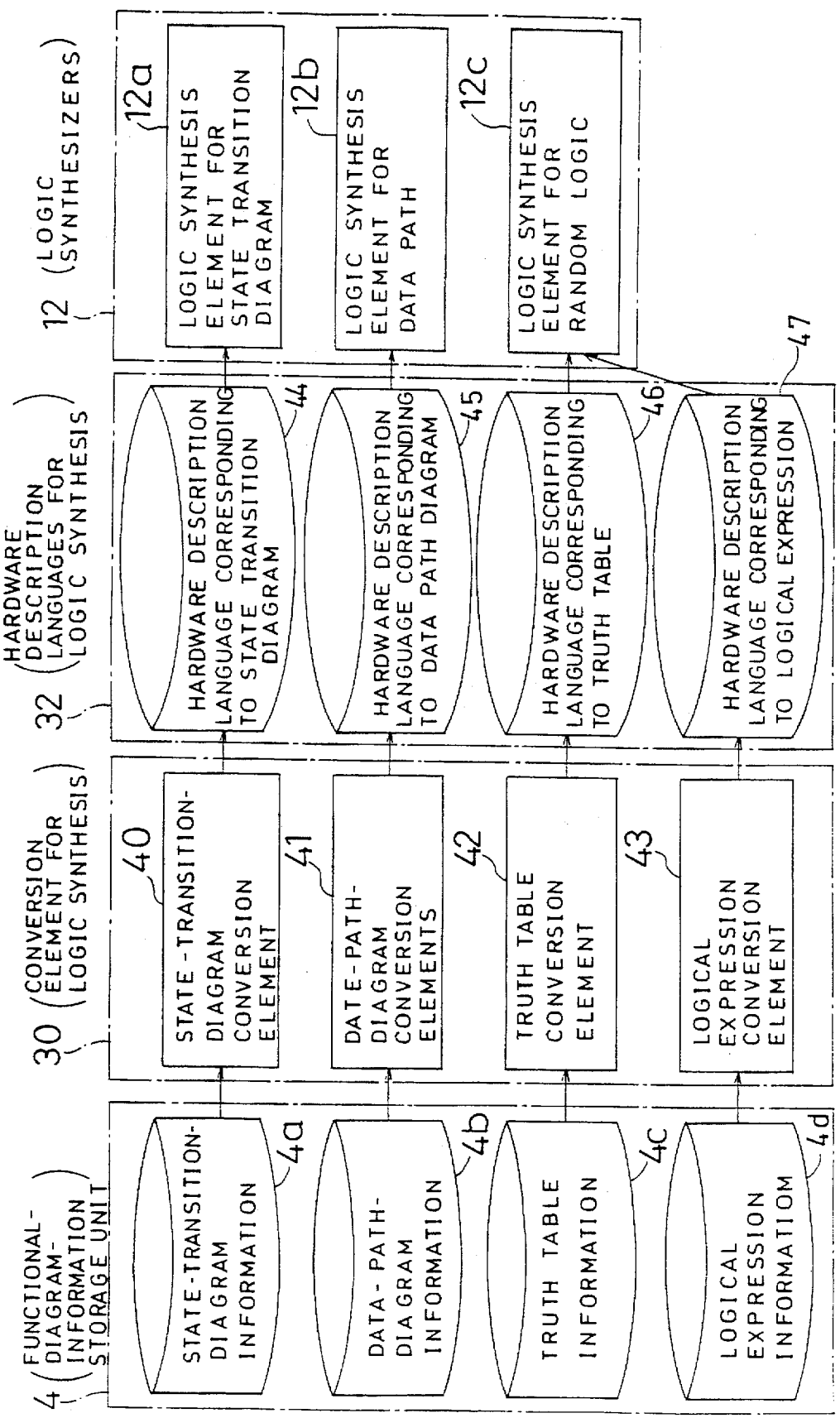
FIG. 13 is a block diagram showing an example of the structure of a hardware-description-language conversion element for logic synthesis in the above hardware-description-language conversion element according to the first embodiment.

FIG. 13 is a block diagram showing an example of the structure of the conversion element for logic synthesis 30 in the hardware-description-language conversion element 8.

A functional diagram-information storage unit 4, conversion element for logic synthesis 30, hardware description language f or logic synthesis 32, and logic synthesizer 12 are the same as those shown in FIG. 12.

In the functional diagram-information storage unit 4 is stored: state-transition-diagram information 4a; data-path-diagram information 4b; truth table information 4c for defining the condition label used in the state-transition-diagram information 4a or in the data-path-diagram information 4b; and logical expression information 4d for defining the condition label used in the state-transition-diagram information 4a or in the data-path-diagram information 4b.

The conversion element for logic synthesis 30 comprises a state-transition-diagram conversion element 40, a data-path-diagram conversion element 41, a truth table conversion element 42, and a logical expression conversion element 43.

A reference numeral 44 designates a state-transition-diagram hardware description language, 45 designates a data-path-diagram description language, 46 designates a truth table hardware description language, and 47 designates a logical expression hardware description language.

The logic synthesizer element 12 comprises a logic synthesis element 12a suitable for the state transition diagram, a logic synthesis element 12b suitable for the data path, and the logic synthesis element 12c suitable for random logic.

The data transition diagram conversion element 40 reads the data transition diagram information 4a from the functional diagram-information storage unit 4 and converts it to the state-transition-diagram hardware description language 44 which is suitable for the logic synthesis element 12a and which implements the operation of state transition with no contradiction, using comments which can be recognized by a state machine in logic synthesis.

The data-path-diagram conversion element 41 reads the data-path-diagram information 4b from the functional diagram-information storage unit 4 and converts it to the data-path-diagram hardware description language 293 which is suitable for the logic synthesis element 12b and which implements, without any contradiction, the data path operation in accordance with a change in an edge signal or with the establishment of transfer conditions.

The truth table conversion element 42 reads the truth table information 4c from the functional diagram-information storage unit 4 and converts it to the truth-table hardware description language 46 which is suitable for the logic synthesis element 12c and which implements, without any contradiction, the definition of conditions in the truth table information 4c by means of the combinational circuit.

The logical expression conversion element 43 reads the logical expression information 4d from the logical diagram information storage unit 4 and converts it to the logical-expression hardware description language 47 which is suitable for the logic synthesis element 12c and which implements, without any contradiction, the definition of conditions in the logical expression information 4d by means of the combinational circuit.

FIGS. 14(a) and 14(b) show a specific example of the operation of the state-transition-diagram conversion element 40: FIG. 14(a) shows the state transition diagram indicated by the state-transition-diagram information; and FIG. 14(b) shows the state-transition-diagram hardware description language obtained by converting the state transition diagram of FIG. 14(a).

For example, the state-transition-diagram conversion element 40 converts the state transition diagram of FIG. 14(a) to the state-transition-diagram hardware description language of FIG. 14(b) by adding a synthesized comment which is suitable for a specific state transition diagram and which is effective to the logic synthesizer, such as "// synopsys state vector" or "// synopsys enum," and declaring the current state of the state machine and registers "SMACHINEl" and "SMACHINEl_next."

FIGS. 15(a) and 15(b) show a specific example of the operation of the data-path-diagram conversion element 41: The FIG. 15(a) shows the data path diagram indicated by the data-path-diagram information; and FIG. 15(b) shows the data-path-diagram hardware description language obtained by converting the data path diagram of FIG. 15(a).

For example, data-path-diagram conversion element 41 converts the data path diagram of FIG. 15(a) to the data-path-diagram hardware description language of FIG. 15(b) by describing, for the register RegA in the data path diagram of FIG. 15(a), sentences which implement an edge operation in response to a clock signal and a clear operation, data transfer operation, or the like in response to a reset signal and describing, for the calculator Add1, a sentence which implements a calculating operation.

FIGS. 16(a) and 16(b) show a specific example of the operation of the truth table conversion element 42: FIG. 16(a) shows the truth table indicated by the truth table information; and FIG. 16(b) shows the truth table hardware description language obtained by converting the truth table of FIG. 16(a).

For example, the truth table conversion element 42 converts the truth table of FIG. 16(a), which means the logical AND in the lateral direction and means the logical OR in the same item, to the truth-table hardware description language of FIG. 16(b) which satisfies requirements set by constraints of the logical AND OR.

FIGS. 17(a) and 17(b) show a specific example of the operation of the logical expression conversion element 43: FIG. 17(a) shows the logical expression table indicated by the logical expression information; and FIG. 17(b) shows the logical expression hardware description language obtained by converting the logical expression table of FIG. 17(a).

For example, the logical expression conversion element 43 converts the logical expression table of FIG. 17(a), which is represented by the state machine and its state or by operators, to the logical expression hardware description language of FIG. 17(b) which considers the priority of the, operators.

Thus, with the functional design support apparatus of the present embodiment, each operation in the state transition diagram, data path diagram, truth table, and logical expression table indicated by the functional diagram information is implemented by the conversion element for logic synthesis 30 without any contradiction, so that conversion to the hardware description language suitable for the logic synthesis element which is dedicated to the state transition diagram, data path, or random logic can be performed, thereby providing an optimum logic circuit after logic synthesis.

Figure 18:
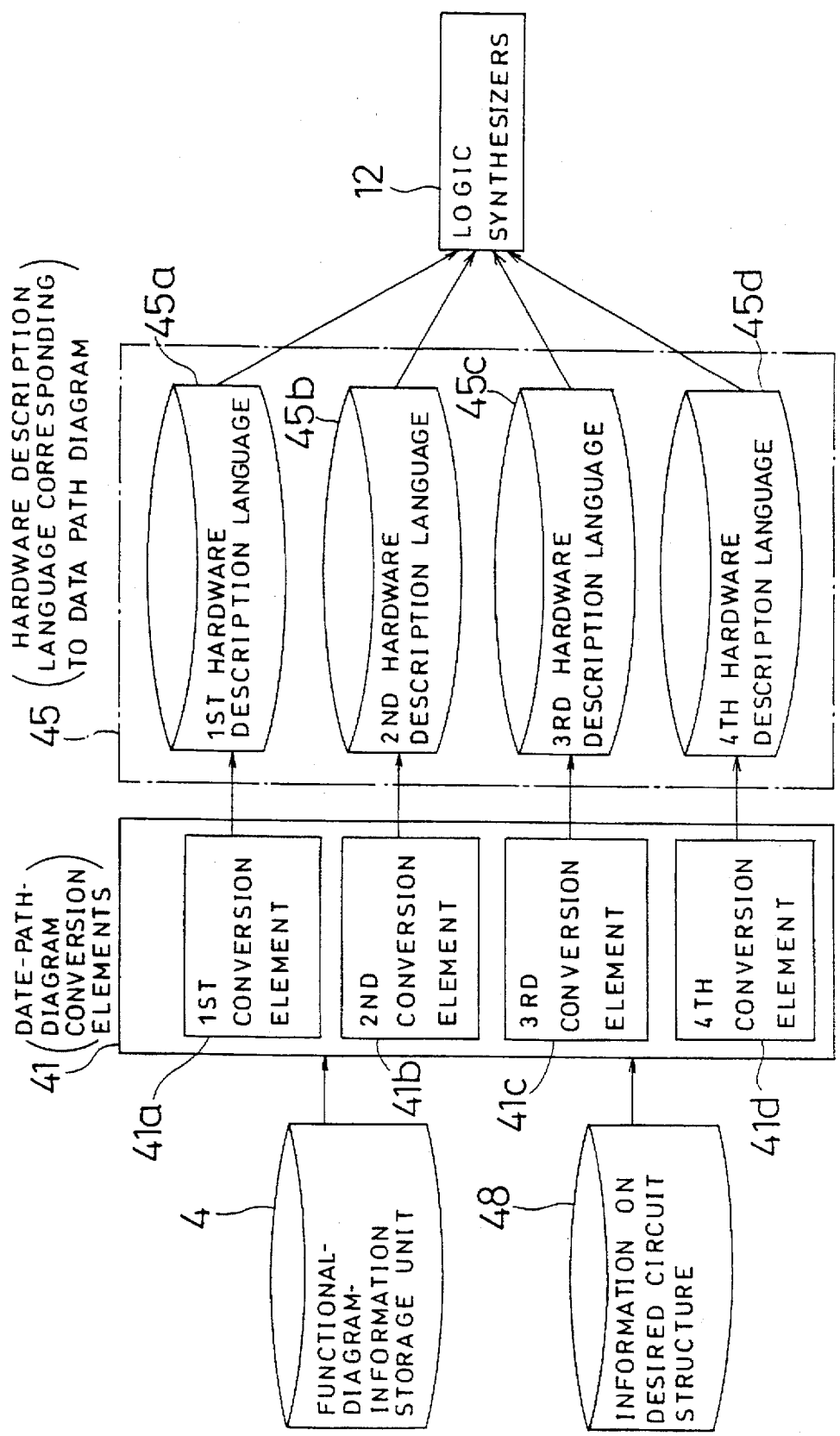
FIG. 18 is a block diagram showing an example of the structure of the data-path-diagram conversion element according to the first embodiment.

FIG. 18 is a block diagram showing an example of the data-path-diagram conversion element 41.

In the drawing are shown a functional-diagram-information storage unit 4 for storing the functional diagram information free from design error which was generated by the functional diagram editor element and was checked for errors by the functional diagram check element, information on desired circuit structure 48 indicating a circuit structure and the priorities of conditions, a data-path-diagram conversion element 41, a data-path-diagram hardware description language 45, and a logic synthesizer 12, which are the same as those shown in FIG. 13.

The data-path-diagram conversion element 41 comprises: a first conversion element 41a for carrying out conversion to a hardware description language which implements the conditional transfer by means of a selector without priority; a second conversion element 41b for carrying out conversion to a hardware description language which implements the conditional transfer by means of a selector with priority; a third conversion element 41c for carrying out conversion to a hardware description language which implements the conditional transfer by means of a tri-state without priority; and a fourth conversion element 41d for carrying out conversion to a hardware description language which implements the condition transfer by means of a tri-state with priory. A reference numeral 45a designates the first hardware description language which implements the conditional transfer by means of the selector without priority, 45b designates the second hardware description language which implements the conditional transfer by means of the selector with priority, 45c designates the third hardware description language which implements the conditional transfer by means of the tri-state without priority, and 45d designates the fourth hardware description language which implements the conditional transfer by means of the tri-state with priority.

The data path conversion element 41 reads the functional diagram information from the functional-diagram-information storage unit 4 and converts the condition label transfer between the functional elements in the data-path-diagram information, included by the functional diagram information, to the data-path-diagram hardware description language 45, while adding a synthesized comment which will be effective in the logic synthesizer 12 in consideration of the information on desired circuit structure 48.

FIGS. 19, 20(a), 20(b), 21(a), and 21(b) show specific examples of the operation of the data-path-diagram conversion element 41: FIG. 19 shows the data path diagram indicated by the data-path-diagram information, FIG. 20(a) shows the hardware description language which is obtained by converting the data path diagram of FIG. 19 and which implements the conditional transfer by means of the selector with priority; FIG. 20(b) shows the circuit obtained by logically synthesizing the hardware description language of FIG. 20(a); FIG. 21(c) shows the hardware description language which Is obtained by converting the data path diagram of FIG. 19 and which implements the conditional transfer by means of the selector without priority; and FIG. 21(d) shows the circuit obtained by logically synthesizing the function description language of FIG. 21(a).

Here, a description will be given to the case where the data path diagram in which transfer to the register RegA exists under a plurality of conditions is converted to the data-path-diagram hardware description language which implements the conditional transfer by means of the selector.

If the condition labels label1, label2, and else are in order of decreasing priority, the second conversion element 41b converts the operation in the register to the data-path-diagram hardware description language shown in FIG. 20(a). For example, a specific logic synthesizer logically synthesizes the description of the condition label after the case statement in the data-path-diagram hardware description language, on the supposition that they are described in order of decreasing priority. Consequently, the result of the logic synthesis becomes a logic circuit shown in FIG. 20(b) which implements the operation of the conditional transfer to the resister in consideration of priority.

Figures 21A, 21B:
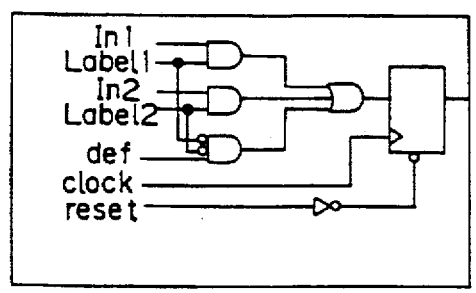
FIG. 21(a) is a hardware description language obtained through the conversion of the data path diagram of FIG. 19 by the data-path-diagram conversion element of FIG. 18.
FIG. 21(b) is a circuit diagram of a circuit obtained by logically synthesizing the hardware description language of FIG. 21(a)

If the priorities of the condition labels are not determined and the default is else, the first conversion element 41a converts the operation in the register to the data-path-diagram hardware description language shown in FIG. 21(a). During the conversion to the hardware description language, when a logically synthesized comment and "// synopsys parallel case" are added, a specific logic synthesizer implements the case statement as a demultiplexor, for example, according to the synthesized comment. Consequently, the result of the logic synthesis becomes a logic circuit which implements the operation of the conditional transfer to the resistor without priority, as shown in FIG. 21(b).

The present embodiment can easily be applied to the case where a component other than the selector and tri-state is set in the circuit structure in the circuit structure information.

Thus, with the functional design support apparatus of the present embodiment, the condition label transfer between the functional elements in the data path diagram indicated by the functional diagram information can be converted by the data-path-diagram conversion element 41 to the data-path-diagram hardware description language which considers the desired circuit structure to be implemented after logic synthesis and the priorities of the conditions. Hence, a logic circuit of desired structure can be obtained after logic synthesis.

Figure 22:
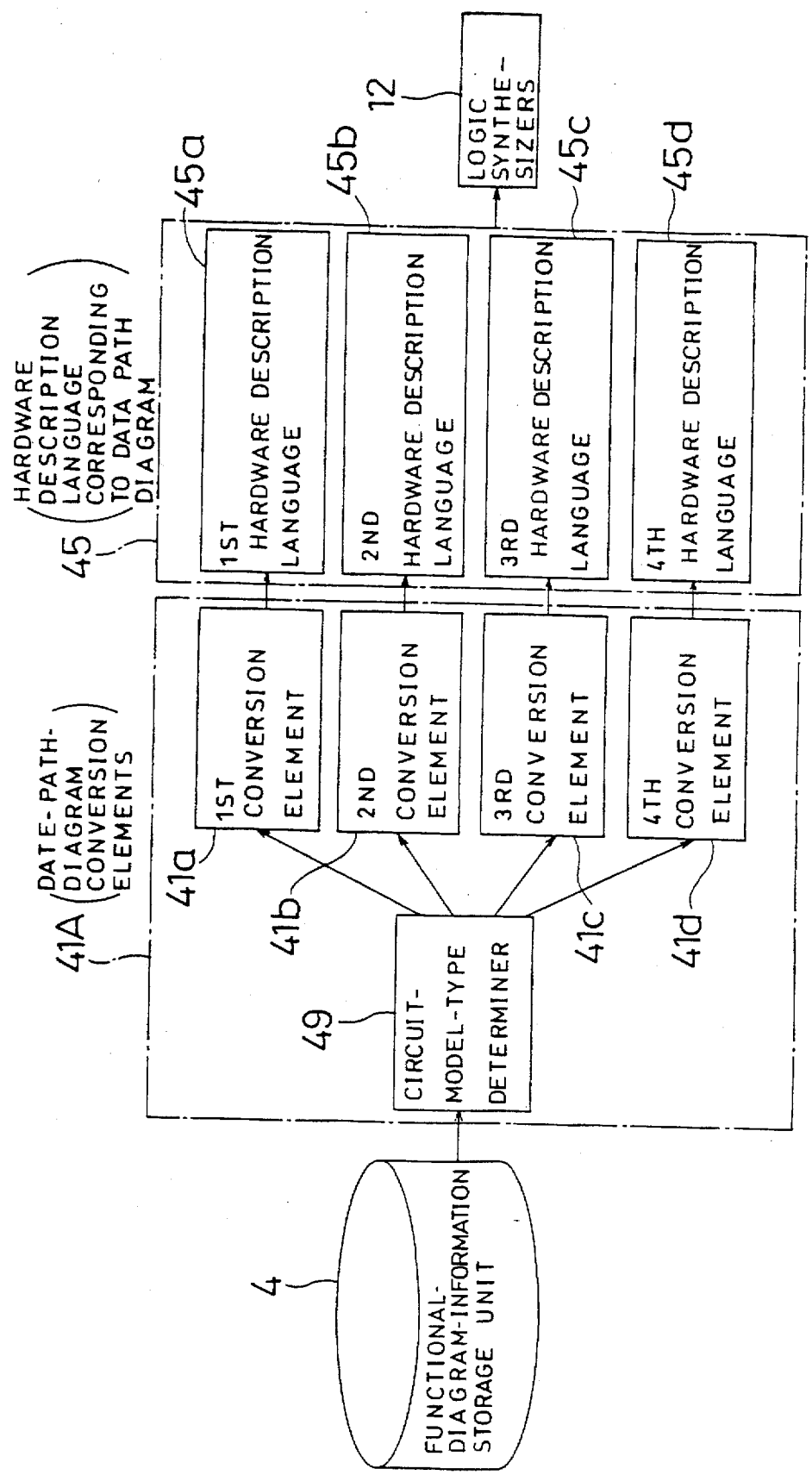
FIG. 22 is a block diagram showing another example of the structure of the data-path-diagram conversion element according to the first embodiment.

FIG. 22 is a block diagram showing another example of the structure of the data-path-diagram conversion element. Here, the description of the same components as shown in FIG. 18 will be omitted by providing the same reference numerals.

In the drawing, the functional-diagram-information storage unit 4 stores the functional diagram information which is free from design error as a result of the error check by the functional diagram check element 6 and which includes circuit-model-type information for each facility.

The data-path-diagram conversion element 41A, comprising the first conversion element 41a, second conversion element 41b, third conversion element 41c, and fourth conversion element 41d, further comprises a circuit-model-type determiner 49.

The circuit-model-type determiner 49 determines the circuit model type which is set for each facility (register or terminal). The data-path-diagram conversion element 41A converts, for each circuit model type, the data-path-diagram information included by the functional diagram information to the data-path-diagram hardware description language 45, while adding the synthesized comment which will be effective in the logic synthesizer 12 in consideration of the circuit structure to be implemented by logic synthesis and the priorities of the conditions.

Figure 23:
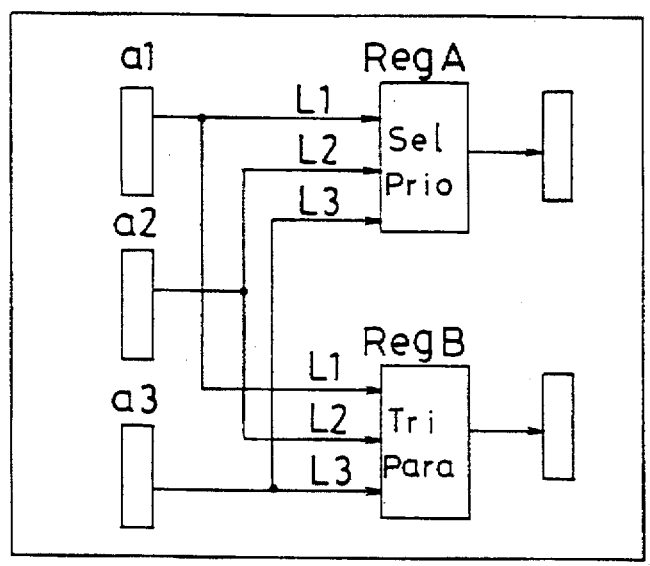
FIG. 23 is a view showing an example of the data path diagram to be converted by the data-path-diagram conversion element of FIG. 22.
Figure 25:
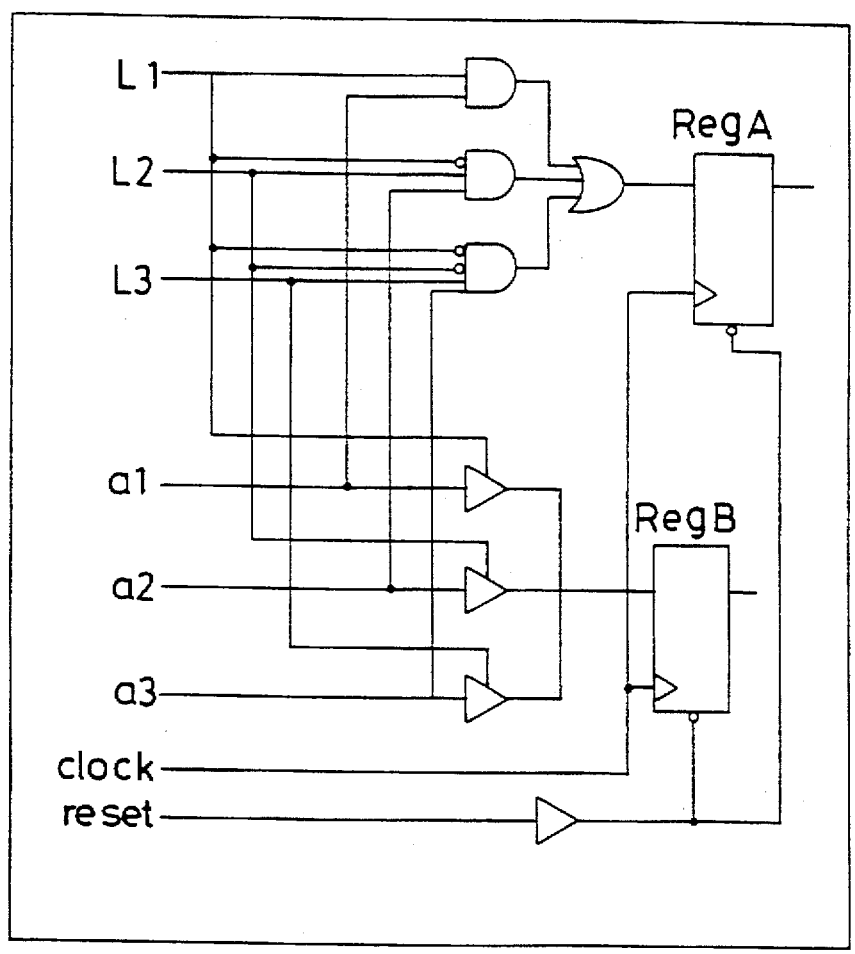
FIG. 25 is a circuit diagram of a circuit obtained by logically synthesizing the hardware description language of FIG. 24(a) and the hardware description language of FIG. 24(b)

FIGS. 23, 24(a), 24(b), and 25 show specific examples of the operation of the data-path-diagram conversion element 41A: FIG. 23 shows the data path diagram indicated by the data-path-diagram information; FIG. 24(a) shows the hardware description language which is obtained by converting the register RegA in the data path diagram of FIG. 23 and which implements the conditional transfer by means of the selector with priority; FIG. 24(b) is the hardware description language which is obtained by converting the register RegB in the data path diagram of FIG. 23 and which implements the conditional transfer by means of the tri-state without priority; and FIG. 25 shows a circuit obtained by logically synthesizing the hardware description language of FIG. 24(a) and the hardware description language of FIG. 24(b).

Here, a description will be given to the case where the data path diagram in which the transfer to the registers RegA and RegB exists under a plurality of conditions is converted to the data-path-diagram hardware description language which implements the registers RegA and RegB by different circuit structures.

According to the information on the desired circuit structure after logic synthesis of each facility in the data-path-diagram information included by the functional diagram information, the register RegA is of selector structure in which the transfer condition has a high-order priority, the register RegB is of tri-state structure in which the transfer condition has no priority, and the condition label are L1, L2, and L3. The model type of a desired circuit is determined by the circuit-model-type determiner 49. For the register RegA, the second conversion element 41b generates the hardware description language shown in FIG. 24(a). For the register RegB, the third conversion element 41c generates the hardware description language shown in FIG. 24(b). The logic synthesizer 12 accomplishes logic synthesis, and as shown in FIG. 25, the logic synthesis result for RegA from the hardware description language of FIG. 24(a) becomes a logic circuit which implements the selector structure in consideration of priority. On the other hand, by providing "wire" as shown in the hardware description language of FIG. 24(b), the logic synthesis result for RegB becomes a logic circuit which implements the tri-state structure.

The present embodiment can easily be applied to the case where a component other than the selector and tri-state is set in the circuit structure in the circuit structure information.

Thus, with the functional design support apparatus of the present embodiment, the condition label transfer can be converted, for each functional element in the data path diagram indicated by the functional diagram information, by the data-path-diagram conversion element 41A to the data-path-diagram hardware description language which considers a desired circuit structure to be implemented after logic synthesis and the priorities of the conditions. Hence, a logic circuit of desired structure can be obtained in each functional element after logic synthesis.

(Functional Simulation Element)

Below, the function diagram simulation element 7 of the functional design support apparatus according to the first embodiment will be described in detail.

First, the overall structure of the functional simulation element 7 will be described with reference to FIG. 26.

Figure 26:
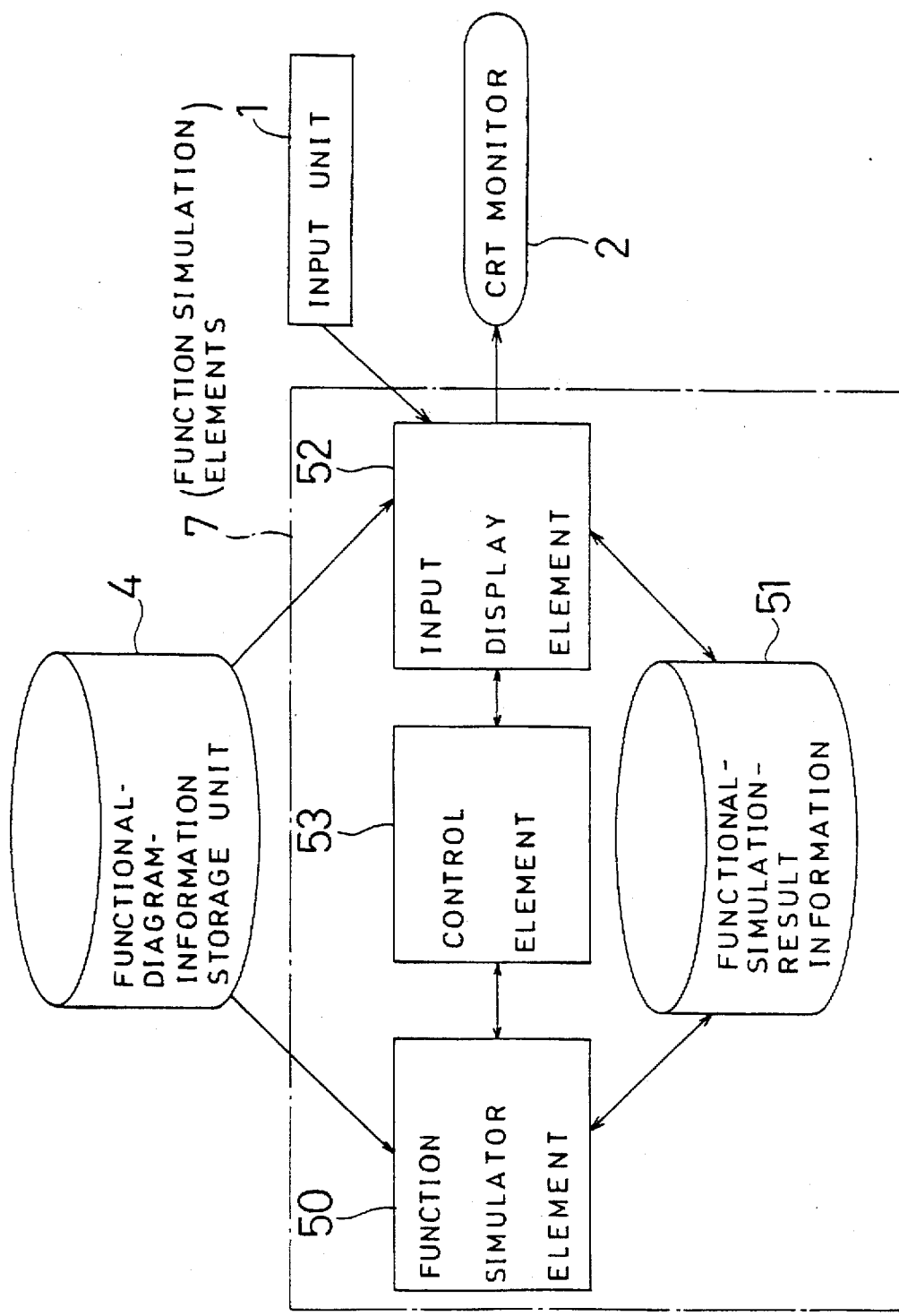
FIG. 26 is a block diagram showing an example of the structure of a functional simulation element according to the first embodiment.

FIG. 26 is a block diagram showing the overall structure of the functional simulation element 7. In the drawing, a reference numeral 4 designates the functional-diagram-information storage unit for storing the functional diagram information, which is the information on the functional diagram wherein the functional operation of a logic circuit is designed by means of symbols, tables, characters, and the like. In addition to the information on the symbols, tables, characters, and the like for representing the function diagram, the following information is stored as the functional diagram information: element information for functional simulation, which is on elements such as terminals, registers for storing the state values, bit connectors for transferring the signal values bit by bit, logic calculators, arithmetic calculators, comparators, memories, state machines, truth tables, and logical expressions; signal information on the state value of a signal which is obtained through the evaluation of the element; and fan-out information indicating element information which is on the element to be subsequently evaluated when a change occurs in the state value of the signal. The logic calculators include: a logical NOT calculator; a logical AND calculator; a logical OR calculator; a logical EXCLUSIVE-OR calculator; a logical NAND calculator; a NOR calculator; and an EXCLUSIVE-NOR calculator. The arithmetic calculators include: an increment calculator; a decrement calculator; an adder without carry; a subtracter without borrow; an adder with carry; a subtracter with borrow; a multiplier; a divider; and a shift calculator. The comparators include: a magnitude comparator for comparing the magnitudes of the state values of signals; a match comparator for determining whether or not the state values of signals match; and a mismatch comparator for determining whether or not the state values of signals mismatch. The memories include a RAM or ROM.

A reference numeral 50 designates a function simulator element for receiving the functional diagram information and performing functional simulation. The function simulator element 50 carries out a backward execution for returning the simulation state to the past and a forward execution for chronologically advancing the simulation state to the future.

A reference numeral 51 designates functional-simulation-result information, which is the information on the result of the functional simulation performed by the function simulator element 50. The functional-simulation-result information 51 includes information on the state values of all the signals, periodic pattern setting, a memory pattern which is the data stored in the memory such as a RAM or ROM, force setting for forcibly setting the state of a signal to a given state value, and unforce setting for canceling the force setting at all the simulation times.

A reference numeral 52 designates an input display element which displays the result of the functional simulation performed by the function simulator element 50 and accepts test data and a control command inputted to the function simulator element 50 every time the functional simulation is performed by the function simulator element 50. The input display element 52 performs the above operations interactively by means of the windows in the CRT monitor 2 and input unit 1. The test data includes: a test pattern to be inputted to the state value of a signal; a periodic pattern representing a test pattern such as a clock; and a memory pattern which is the pattern data stored in a memory. Hereinafter, the test data indicates the test pattern, periodic pattern, and memory pattern. The control commands given to the function simulator element 50 include: a forward step execute command for instructing the function simulator element 50 to execute a forward step; a forward jump execute command for instructing the function simulator element 50 to execute a forward jump; a backward step execute command for instructing the function simulator element 50 to execute a backward step; a backward jump execute command for instructing the function simulator element 50 to execute a backward jump; a test data input command for inputting the test data to the function simulator element 50; and a result fetch command for fetching the result of the functional simulation performed by the function simulator element 50. The test data input commands include: a test pattern input command for inputting a test pattern, which is to be inputted to the state value of a signal, to the function simulator element 50; a periodic pattern input command for inputting a periodic pattern, representing a periodic test pattern such as a clock, to the function simulator element 50; and a memory pattern input command for inputting a memory pattern, which is the pattern data stored in the memory, to the function simulator element 50. The display methods include the displaying of the signal values in tabular form, in the functional diagram, and in waveform.

A reference numeral 53 designates a control element for controlling the data flow and commands between the function simulator element 50 and the input display element 52 and the execution by the function simulator element 50 and input display element 52.

Next, the operation of the functional simulation element 7 thus constituted will be described.

Under the input control by the control element 53, the test data, control command to the function simulator, and the like are inputted from the input unit 1 by the input display element 52. Under the transfer control by the control element 53, the test data, control command, and the like are inputted to the function simulator element 50, which executes functional simulation. The result of the functional simulation performed by the function simulator element 50 is transferred by the control element 53 to the input display element 52 and displayed on the CRT monitor 2. Under the input control by the control elements 53, the test data, control command, and the like can be inputted every time functional simulation is performed. Under the data transfer control by the control element 53, the result of the functional simulation can be displayed every time the functional simulation is performed. Hence, it is possible to perform functional simulation interactively.

Thus, with the functional design support apparatus of the present embodiment, it is possible to input the test data and display the simulation result in the course of functional simulation every time the function simulator 7 performs the functional simulation. It is also possible to return the simulation time to a given past time if an error is detected in the test data inputted at the past time or if different test data is to be inputted at the past time.

Below, the function simulator element 50 comprised by the functional simulation element 7 will be described in detail with reference to the drawings.

First, the structure of the function simulator element 50 will be described with reference to FIG. 27.

Figure 27:
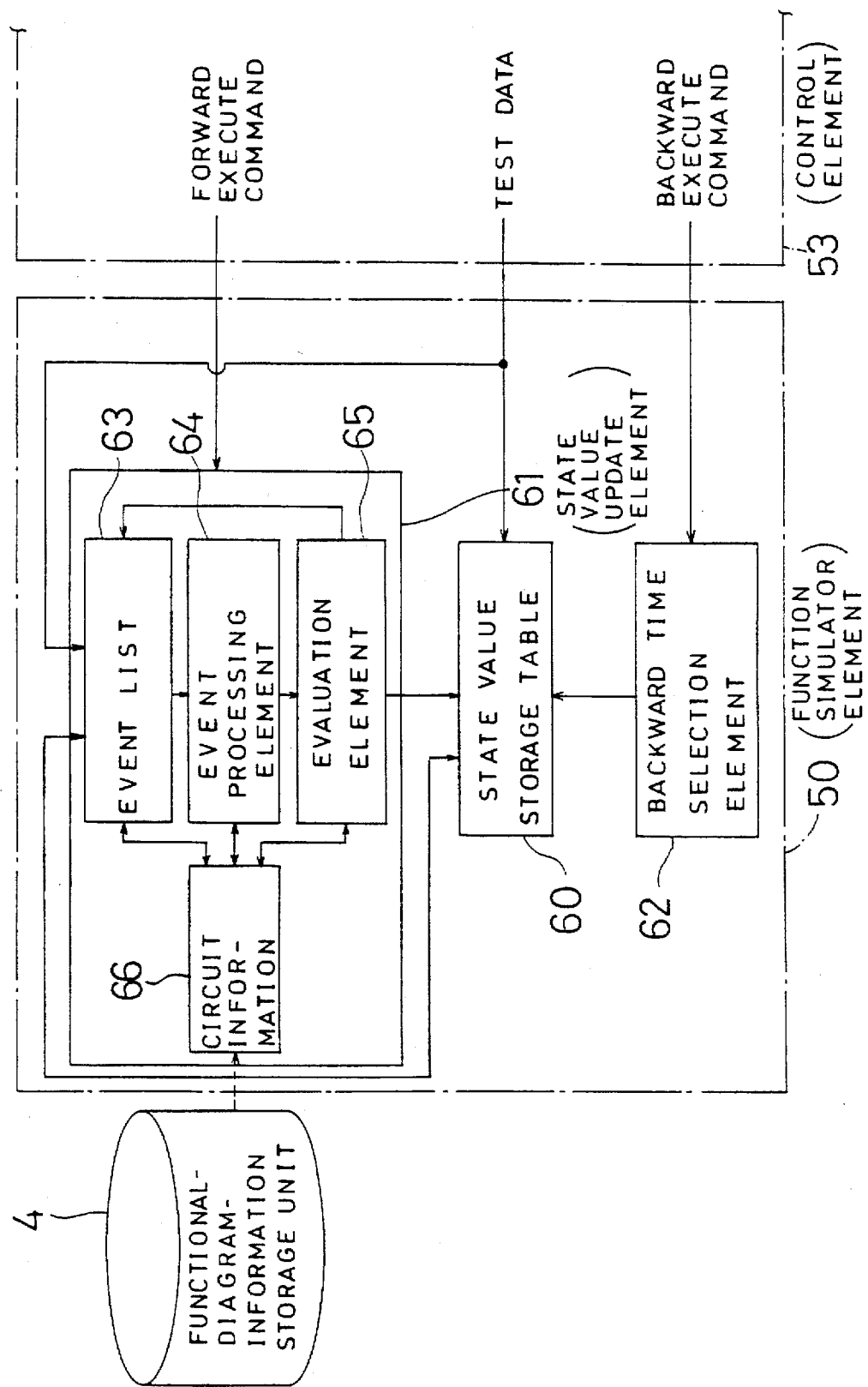
FIG. 27 is a block diagram showing the structure of a function simulator element according to the first embodiment.

FIG. 27 is a block diagram showing the structure of the function simulator element 50. In the drawing, a reference numeral 60 designates a state value storage table which holds the state value transition history at all the times of each model constituting the circuit, 61 designates a state value update element for updating the state value storage table 60 in the execution of forward simulation, 62 designates a backward time selection element for returning the time of the state value storage table 60 to the past in the execution of backward simulation.

In the execution of forward simulation, the state value update element 61 under the control of the control element 53 adds the state values of all the models in the circuit in the process of simulation to the state value storage table 60 at specified time intervals (unit time or a time interval between consecutive two changes in the signal value of a model). In the execution of backward simulation, on the other hand, the backward time selection element 62 updates, under the control of the control element 53, the time of the state value storage table 60 to an objective time in the past.

In the status update element 61, a reference numeral 63 designates an event list into which an event for storing information on a change in the state value is cataloged, 64 designates an event processing element for fetching an event from the event list 63, selecting a process to be performed depending on the type of the fetched event, and updating the state value, 65 designates an evaluation element for evaluating an element which may undergo a new change in the state value due to the updating of the state value by the event processing element 64 and, if a change is newly caused in the state value, cataloging information on the change into the event list 63, and 66 designates circuit information in which the processed functional diagram information is fetched and stored.

Next, a specific functional simulation operation performed by the function simulator element 50 will be described with reference to FIG. 29.

FIG. 29 shows a specific example of the state value storage table 60, which exhibits changes in the state values caused by functional simulation operations. As shown in the drawing, in the execution of forward simulation from the time T1 to the time T2, the state value update element 61 adds the new time T2 and the state values V12, V22, and V32 at the time T2 to the state value storage table 60. The execution of backward simulation from the time T4 to the time T2 can be implemented by the backward time selection element 62 simply by returning the time of the state value storage table 60 from T4 to T2. As a result, the state values of the individual models become V12, V22, and V32. Although it has conventionally been required to execute simulation again in order to obtain the state value of a model which is different from a specified observation point, it becomes possible to obtain the state value of a signal which is not specified as the observation point. It is also possible to execute both time forward and time backward simulations by bypassing several unit times as well as following one unit time after another.

Thus, in the functional simulation element 7, since the function simulator element 50 is provided with the state value storage table 60 for holding the state value transition history in the individual circuit models, it becomes possible, in debugging the logic circuit interactively, to return to a past time in the past at a high speed by time backward simulation and then execute time forward simulation again. Consequently, the operational function of the logic circuit can be verified with improved efficiency.

Next, a specific operation of time forward simulation performed by the state value update element 61 of the function simulator element 50 will be described with reference to FIGS. 30(a) and 30(b).

Figure 30:
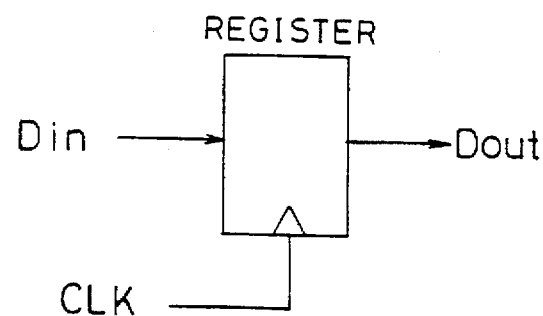
FIG. 30(a) is a view showing a logic circuit to be subjected to forward simulation performed by a state value update element of the above function simulator element.
FIG. 30(b) is a timing chart showing data for the above forward simulation and the simulation result.
Figure 30B:
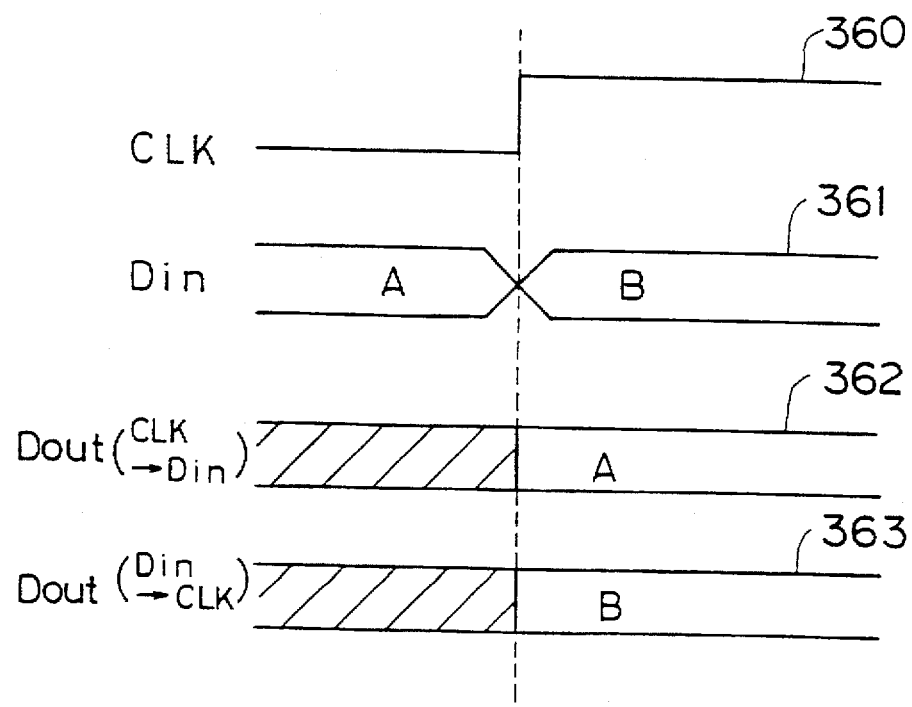

FIG. 30(a) shows a logic circuit to be subjected to the above forward simulation and FIG. 30(b) shows the input data and the simulation result. Here, the logic circuit to be subjected to the above forward simulation is a register having an input signal Din, an output signal Dout, and a clock signal CLK, as shown in FIG. 30(a). The register stores the value of the input signal Din in synchronization with the rise edge of the clock signal CLK and outputs the output signal Dout.

In FIG. 30(b), a reference numeral 360 designates the waveform of the clock signal CLK and 361 designates the waveform of the input signal Din. Here, it will be appreciated that a change in the state value of the input signal occurred simultaneously with the rise of the clock signal CLK.

A reference numeral 362 shows a change in the state value of the output signal Dout in the case where the evaluation element 65 performed element evaluation based on a change in the state value of the clock signal CLK and then evaluated the element based on a change in the state value of the input signal Din, 363 designates a change in the state value of the output signal Dout in the case where the evaluation element 65 evaluated the element based on a change in the state value of the input signal Din and then evaluated the element based on a change in the state value of the clock signal CLK.

In a conventional embodiment, it is not uniquely determined which one of the changes 362 and 363 should be taken as the change in the state value of the output signal Dout, for the element evaluation is carried out independently of the type of the event. In the present embodiment, however, the change 362 always serves as the change in the state value of the output signal Dout of the register of FIG. 30(a), because, even when the input signal Din and clock signal CLK of the register are simultaneously changed, the state value of the input signal Din is always updated after the element evaluation was performed based on the change in the state value of the clock signal CLK. Consequently, the unique result can be obtained.

Thus, in the case where the clock signal and input signal change at the same time in a storage element such as a register or RAM that operates in synchronization with the rise edge or fall edge of the clock signal, even if there is a time difference between the event process based on the change in the clock signal and the event process based on the change in the input signal, it is possible to obtain the same functional simulation result by providing the functional simulator element 50 of the function simulator 7 with the state value update element 61 having the event processing element 64. The functional simulation element also operates properly even in an operation in which registers are connected in succession such as a pipeline operation.

Figure 31:
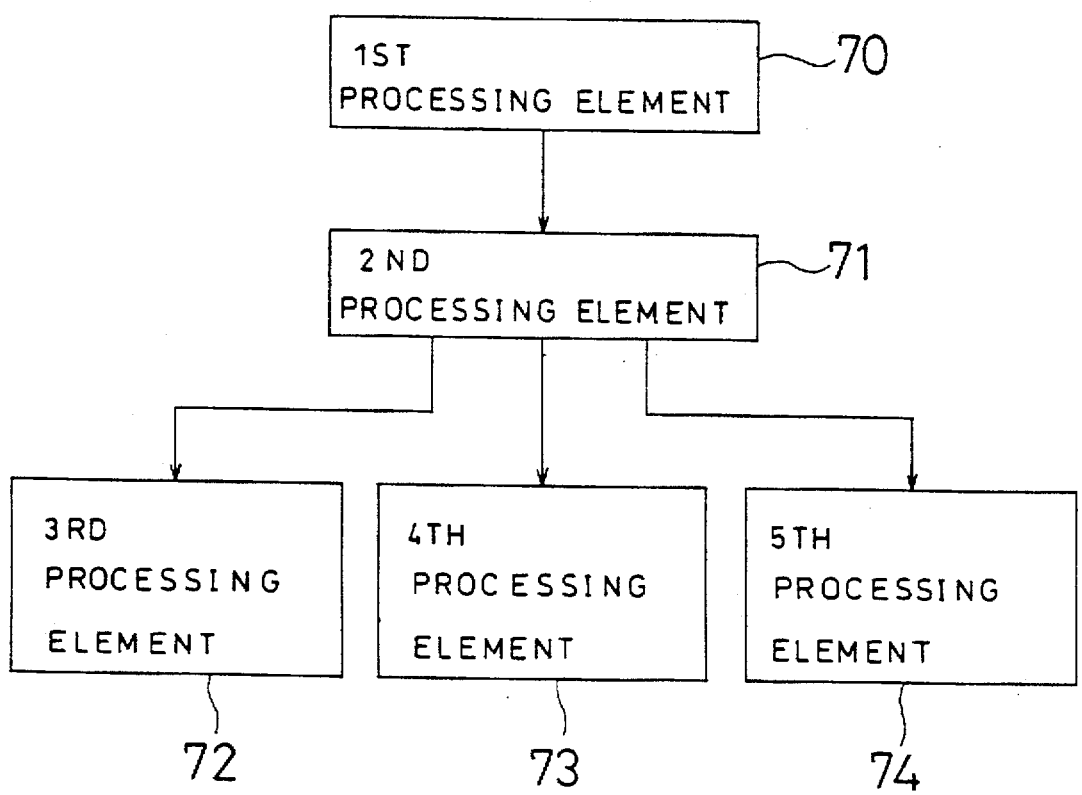
FIG. 31 is a block diagram showing the structure of an event processing element of the above function simulator element.

FIG. 31 is a block diagram showing the structure of the event processing element 64. In the drawing, a reference numeral 70 designates a first processing element for fetching events from the event list 63 one by one, 71 designates a second processing element for judging the type of the event fetched by the first processing element 70 and determining the subsequent process to be performed, 72 designates a third processing element for updating the state value, 73 designates a fourth processing element for updating the state value of the clock signal, and 74 designates a fifth processing element for updating the state value of the input data signal of the register.

As a result of the event type judgment by the second processing element 71, if the event is for the state value of a signal other than the clock signal and the input signal of the register, the third processing element 72 updates the state value immediately. If the event is a change in the state value of the clock signal, the fourth processing element 73 updates the state value of the clock signal after the completion of all the event processing by the third processing element 72. If the event is a change in the state value of the input signal of the register, the fifth processing element 74 updates the state value of the input data signal of the register after the completion of all the event processing by the fourth processing element 73 and by the fifth processing element 74.

Figure 32:
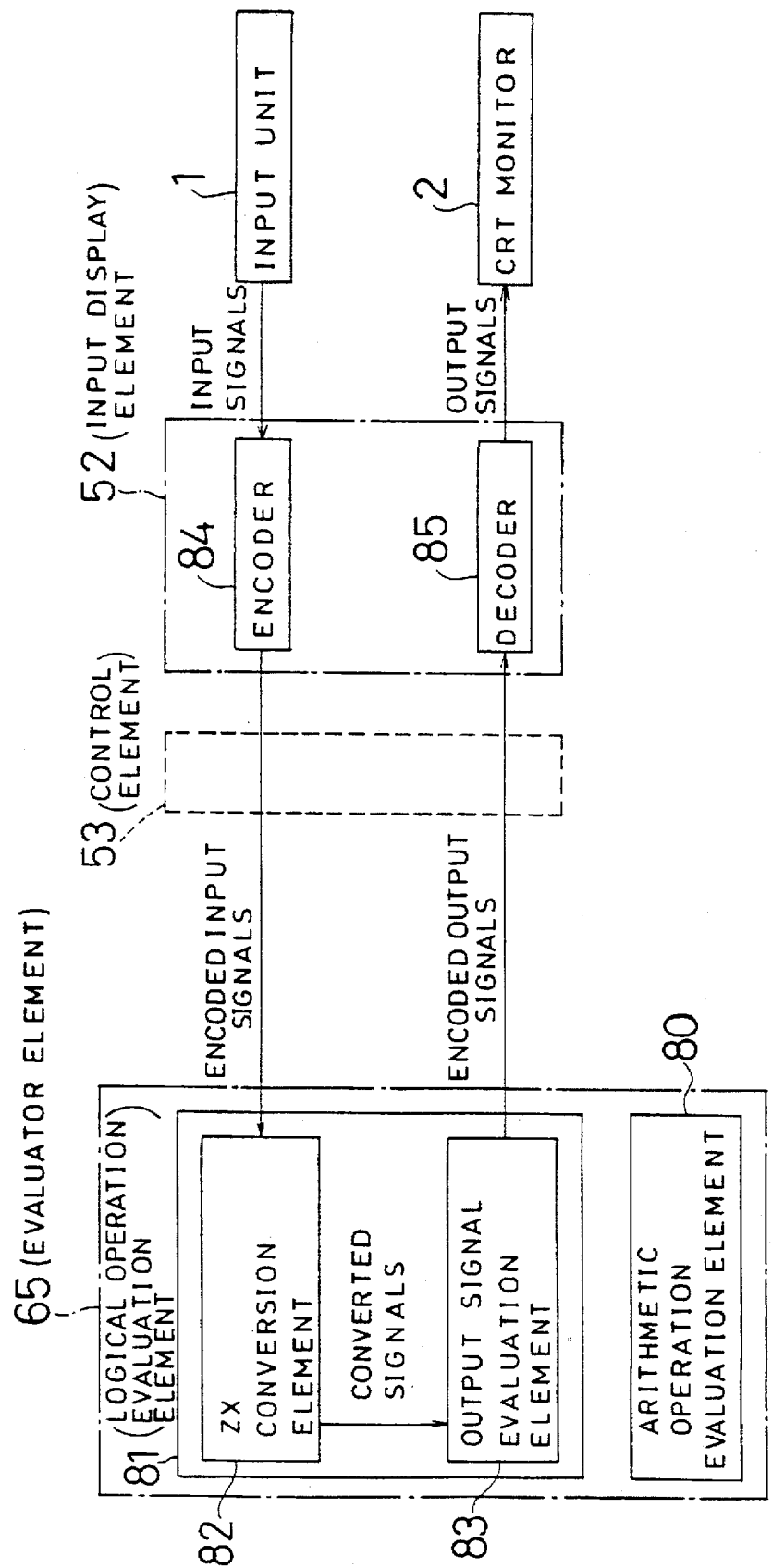
FIG. 32 is a block diagram showing the structure of an evaluation element of the above function simulator element.

FIG. 32 is a block diagram showing an example of the structure of the evaluation element 65.

In the functional simulation of a circuit, if the circuit simulated is a logic calculator circuit, it is not sufficient to treat only binary logic operations consisting of logic signals 0 and 1 alone. It is required to perform simulation in consideration of various states which might be generated in an actual circuit. That is, in the actual circuit, the logic signal may be in the state of don't care (hereinafter represented by X) or in the state of high impedance (herein after represented by Y), so that it becomes necessary to treat a four-value logic signal in which the logic value is 0, 1, X, or Z.

Here, a description will be given to an example of the evaluation element for evaluating a logic calculator circuit which performs a logic operation using multi-bit input signals represented by these four-value signals.

As shown in FIG. 32, the evaluation element 65 comprises: a logic operation evaluation element 81 having a ZX conversion element 82 and an output signal evaluation element 83; and an arithmetic operation evaluation element 80 for evaluating an arithmetic calculator circuit. An input display element 52 comprises an encoder 84 and a decoder 85. Each of the input signals inputted from the input unit 1 is encoded by the encoder 84, and the resulting encoded input signals are transmitted to the logic operation evaluation element 81 via the control element 53. In the logic operation evaluation element 81, each of the encoded input signals is converted by the ZX conversion element 82 and a logic operation is performed by the output signal evaluation element 83 so that its result is outputted as an encoded output signal. The encoded output signals are transmitted to the decoder 85 via the control element 53, decoded by the decoder 85, and then displayed on the CRT monitor 2 as the output signals.

When the input signals inputted from the input unit 1 contain a plurality of multi-bit signals in which each bit shows by one of the logic signals 0, 1, X, and Z, the encoder 84 encodes each bit of the input signals by two bits, which are: a 0-drive bit indicating whether or not the bit can be represented by the logic signal 0; and a 1-drive bit indicating whether or not the bit can be represented by the logic signal 1.

FIG. 33 shows a correspondence between the input and output when the encoder 84 performs encoding. In the drawing, "LOGIC SIGNAL" is represented by the four values of 0, 1, X (don't care), and Z (high impedance). When "0-DRIVE BIT" is "1," there is a high possibility that the corresponding "LOGIC SIGNAL" is represented by the logic value 0. Conversely, when "0-DRIVE BIT" is "0", there is a low possibility that the corresponding "LOGIC SIGNAL" is represented by the logic value 0. When "1-DRIVE BIT" is "1," there is a high possibility that the corresponding "LOGIC SIGNAL" is represented by the logic value 1. Conversely, when "1-DRIVE BIT" is "0", there is a low possibility that the corresponding "LOGIC SIGNAL" is represented by the logic value 1.

FIG. 34 shows a specific example of the encoding of a 4-bit logic signal. In the drawing, "LOGIC SIGNAL" is an example of the 4-bit logic signal composed of "01XZ," "0-DRIVE WORD" indicates a collection of 0-drive bits when each bit is encoded, and "1-DRIVE WORD" indicates a collection of 1-drive bits when each bit is encoded.

When the logic signal "01XZ" is encoded in accordance with the correspondence in encoding shown in FIG. 33, the encoded signal is represented by the two drive words of the 0-dive word "1010" and 1-drive word "0110." The results of encoding thus performed by the encoder 84 with respect to the input signals are termed encoded input signals.

Figure 35:
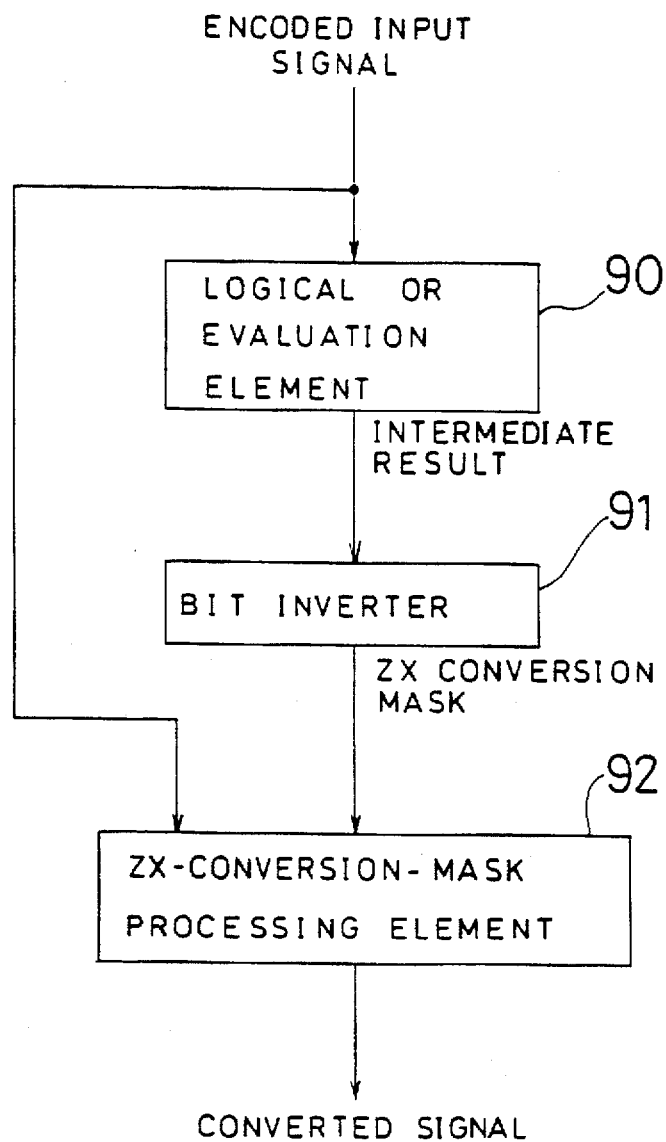
FIG. 35 is a block diagram showing the structure of a ZX conversion element of the above evaluation element.

When the encoded input signals are inputted to the ZX conversion element 82, if any bit of the encoded input signals is an encoded bit corresponding to the logic signal Z, the ZX conversion element 82 converts the encoded bit to an encoded bit corresponding to the logic signal X. The results of conversion performed by the ZX conversion element 82 with respect to the encoded input signals are termed converted signals. FIG. 35 is a block diagram showing an example of the structure of the ZX conversion element 82 in detail. Here, the ZX conversion element 82 is constituted so that all the bits are subjected to the ZX conversion simultaneously, not one by one.

In the drawing, a reference numeral 90 designates a logical OR evaluation element for performing, when the encoded input signals obtained through the encoding by the encoder 84 of FIG. 32, the logical OR operation between the 0-drive word and 1-drive word of each encoded input signal. The results obtained by the logical OR evaluation element 90 from the encoded input signals are termed intermediate results.

A reference numeral 91 designates a bit inverter for inverting every bit of the intermediate result inputted thereto through the logical NOT operation. The results obtained by the bit inverter 91 from the intermediate results are termed ZX conversion masks.

A reference numeral 92 designates a ZX-conversion-mask processing element for performing, when the encoded input signal and ZX conversion mask are inputted thereto, the logical OR operation between the 0-drive word of the encoded input signal and the ZX conversion mask and the logical OR operation between the 1-drive word of the encoded input signal and ZX conversion mask, so as to output a converted signal having the result of the former logical OR operation as the 0-drive word and the result of the latter logical OR operation as the 1-drive word.

The output signal evaluation element 83 performs, when the converted signals are inputted thereto, the evaluation (simulation) of the functions of the logical operations using the 0-drive words and 1-drive words of the converted signals, so as to obtain and output the encoded output signals consisting of the 0-drive words and 1-drive words which indicate the evaluation results. The above evaluation (simulation) is performed with respect to various logic operations including the multi-bit, multi-input, and multi-output operations.

Here, a specific description will be given to the evaluation of the functions of logic operations. (1) In the case of evaluating a 2-input 1-output logical AND operation, the 0-drive word of the encoded output signal can be obtained by performing the logical OR operation between the 0-drive word of a converted signal A and the 0-drive word of a converted signal B. On the other hand, the 1-drive word of the encoded output signal can be obtained by performing the logical AND operation between the 1-drive word of the converted signal A and the 1-drive word of the converted signal B. (2) In the case of evaluating a 2-input 1-output logical OR operation, the 0-drive word of the encoded output signal can be obtained by performing the logical AND operation between the 0-drive word of the converted signal A and the 0-drive word of the converted signal B. On the other hand, the 1-drive word of the encoded output signal can be obtained by performing the logical OR operation between the 1-drive word of the converted signal A and the 1-drive word of the converted signal B. (3) In the case of evaluating the logical NOT operation, the 0-drive word of the encoded output signal which is a collection of the 0-drive bits can be obtained by interchanging the 0-drive word and 1-drive word of a converted signal.

When the encoded output signals are inputted to the decoder 85, the decoder 85 decodes each of the encoded output signals composed of the 0-drive words and 1-drive words to an output signal represented one of the logic signals 0, 1, X, and Z.

Next, the operation of the evaluation element 65 thus constituted will be described.

Figure 36:
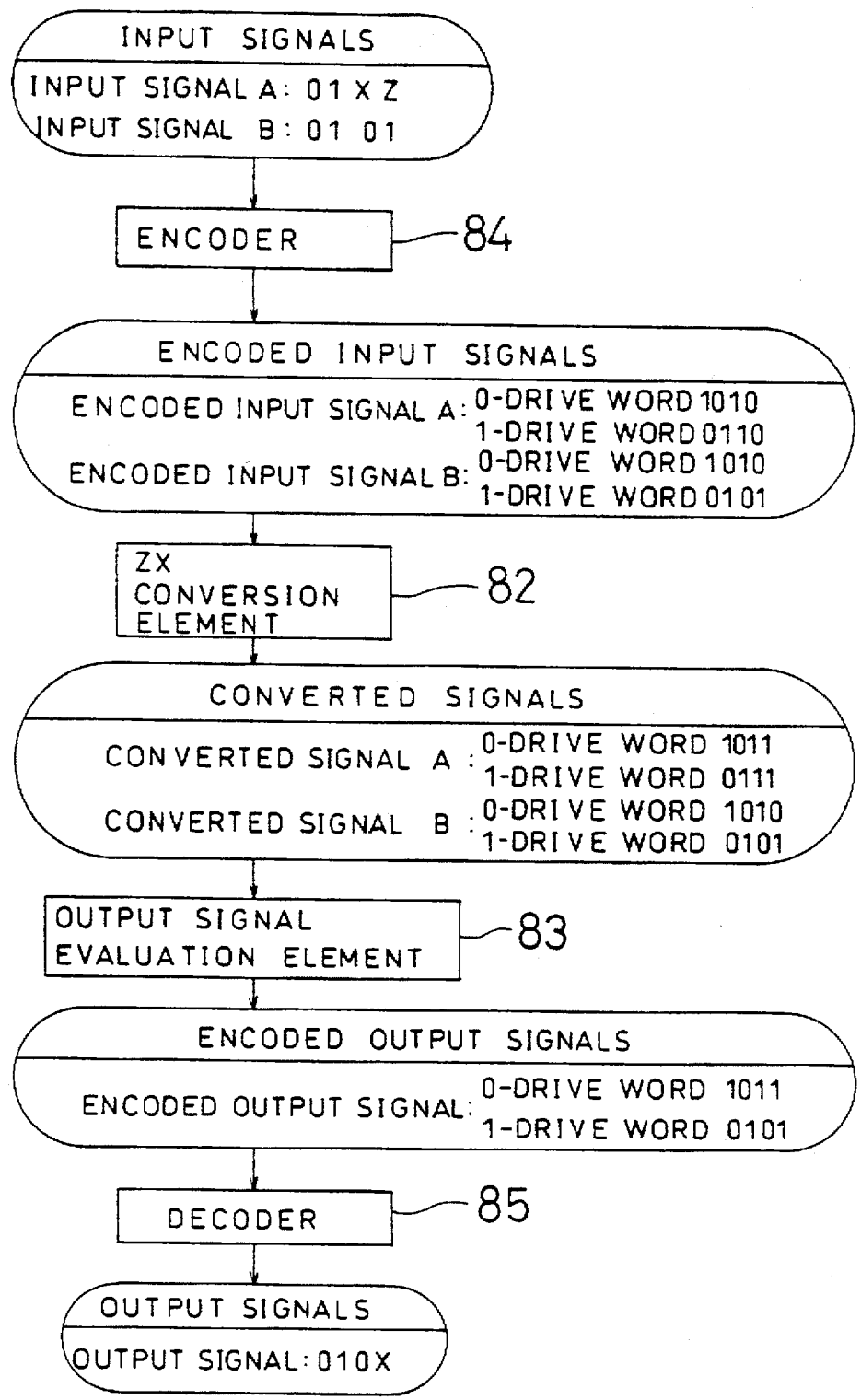
FIG. 36 is a view diagrammatically showing a specific example of the operation of the above evaluation element.

FIG. 36 is a view diagrammatically showing the process of converting the signals. Here, a 4-bit 2-input 1-output logical AND operation will be described as an example of the operation to be subjected to functional simulation.

As shown in FIG. 36, the input signals are composed of two input signals to be used in the operation, which are a 4-bit input signal A having a logic value of "01XZ" and a 4-bit input signal B having a logic value of "0101." The input signals are converted by the encoder 84 to the encoded input signals in accordance with the correspondence for encoding shown in FIG. 33. That is, the input signal A is converted to an encoded input signal A consisting of the 0-drive word having a logic value of "1010" and the 1-drive word having a logic value of "0110." Likewise, the input signal B is converted to an encoded input signal B consisting of the 0-drive word "1010" and the 1-drive word "0101" (see "ENCODED INPUT SIGNALS" of FIG. 36).

Next, the encoded input signals are converted by the ZX conversion element 82 to converted signals.

FIG. 37 illustrates the process in which the ZX conversion element 92 performs ZX conversion with respect to the input signal A.

In FIG. 37, "LOGIC SIGNAL" is the foregoing input signal A and "ENCODED INPUT SIGNAL" is the encoded input signal A obtained through the encoding of the input signal A. The logical OR evaluation element 90 performs the logical OR operation between the 0-drive word "1010" and the 1-drive word "1110" constituting the encoded input signal A, so as to provide the intermediate result "1110" (see "INTERMEDIATE RESULT" of FIG. 37).

Furthermore, the bit inverter 91 inverts each bit in the intermediate result "1110" through the logical NOT operation, so as to provide the ZX conversion mask "0001" (see "ZX CONVERSION MASK" of FIG. 37).

Subsequently, the ZX-conversion-mask processing element 92 sets, as the 0-drive word of the converted signal A, the logical OR "1011" of the 0-drive word "1010" of the encoded input signal A and the foregoing ZX conversion mask "0001" and sets, as the 1-drive word of the converted signal A, the logical OR "0111" of the 1-drive word "0110" of the encoded input signal A and the foregoing ZX conversion mask "0001" (see "CONVERTED SIGNAL" of FIG. 37).

In the foregoing ZX conversion mask, the bit having the logic value 1 corresponds to the logic value Z in the original input signal. It follows that, by performing the logical OR operation between the two drive words of the encoded input signal and the ZX conversion mask, the encoded bit corresponding to the logic signal Z was converted to the encoded bit corresponding to the logic signal X. In FIG. 37, "LOGIC SIGNAL CORRESPONDING TO CONVERTED SIGNAL" is obtained through the reverse encoding (decoding) of "CONVERTED SIGNALS" based on the correspondence for encoding shown in FIG. 33. If the Z in "LOGIC SIGNAL" is replaced by X, the "LOGIC SIGNAL CORRESPONDING TO CONVERTED SIGNAL" is obtained.

The ZX conversion described above will similarly be carried out by ZX conversion element 82 with respect to the encoded input signal B.

As a result of the ZX conversion, the first bit in the encoded input signal A is converted to the encoded bit corresponding to the logic signal X, so that the 0-drive word becomes "1011" and the 1-drive word becomes "0111" in the converted signal A. This is because the first bit in the input signal A is the logic signal Z. As for the encoded input signal B, it remains the same so that the 0-drive word is "1010" and the 1-drive word is "1010" in the converted signal B. This is because the input signal B does not contain the logic signal Z (see "CONVERTED SIGNALS" of FIG. 36).

Thus, the logic signal Z can be converted by the conversion element 82 to the logic signal X in a manner that all the bits are subjected to the ZX conversion simultaneously, not one by one.

Thereafter, the output signal evaluation element 83 evaluates (i.e., simulates), when the converted signal A and converted signal B are inputted thereto, various logic operations using these signals. In simulating the 2-input 1-output logical AND operation in the present embodiment, if at least one of the two input signals is 0, the result of the operation becomes 0, so that the logical OR of the 0-drive bits which is more likely to have a logic value 0 becomes the 0-drive bit of the operation result. If each of the two input signals is 1, the result of the operation becomes 1, so that the logical AND of the 1-drive bits which is more likely to have a logic value 1 becomes the 1-drive bit of the operation result. Consequently, the 0-drive word of the encoded output signal corresponding to the operation result can be obtained using the logical OR between the 0-drive words of the converted signals A and B, while the 1-drive word of the output signal corresponding to the operation result can be obtained using the logical AND of the 1-drive words of the converted signals A and B.

In the example of FIG. 36, the 0-drive word of the encoded output signal becomes the logical OR "1011" of the 0 drive word "1011" of the converted signal A and the 0-drive word "1010" of the converted signal B. On the other hand, the i-drive word of the encoded output signal becomes the logical AND "0101" of the 1-drive word "0111" of the converted signal A and the 1-drive word "0101" of the converted signal B (see "ENCODED OUTPUT SIGNALS" of FIG. 36). Finally, each of the encoded bits of the encoded output signals is decoded by the decoder 85 to one of the logic signals 0, 1, X, and Z. In the present embodiment, if each encoded bit is represented by (0-drive bit, 1-drive bit), it is decoded as follows:

The fourth bit of the encoded bits is (1, 0) and the corresponding logic signal is 0; the-third bit of the encoded bits is (0, 1) and the corresponding logic signal is 1; the second bit of the encoded bits is (1, 0) and the corresponding logic signal is 0; and the first bit of the encoded bits is (1, 1) and the corresponding logic signal is X.

As a result, the output signal becomes "010X" (see "OUTPUT SIGNALS" of FIG. 36).

In this manner, it becomes possible to carry out simulation at a time without referring to the operation table which implements the logic operation to be subjected to simulation for every one bit.

Figure 38:
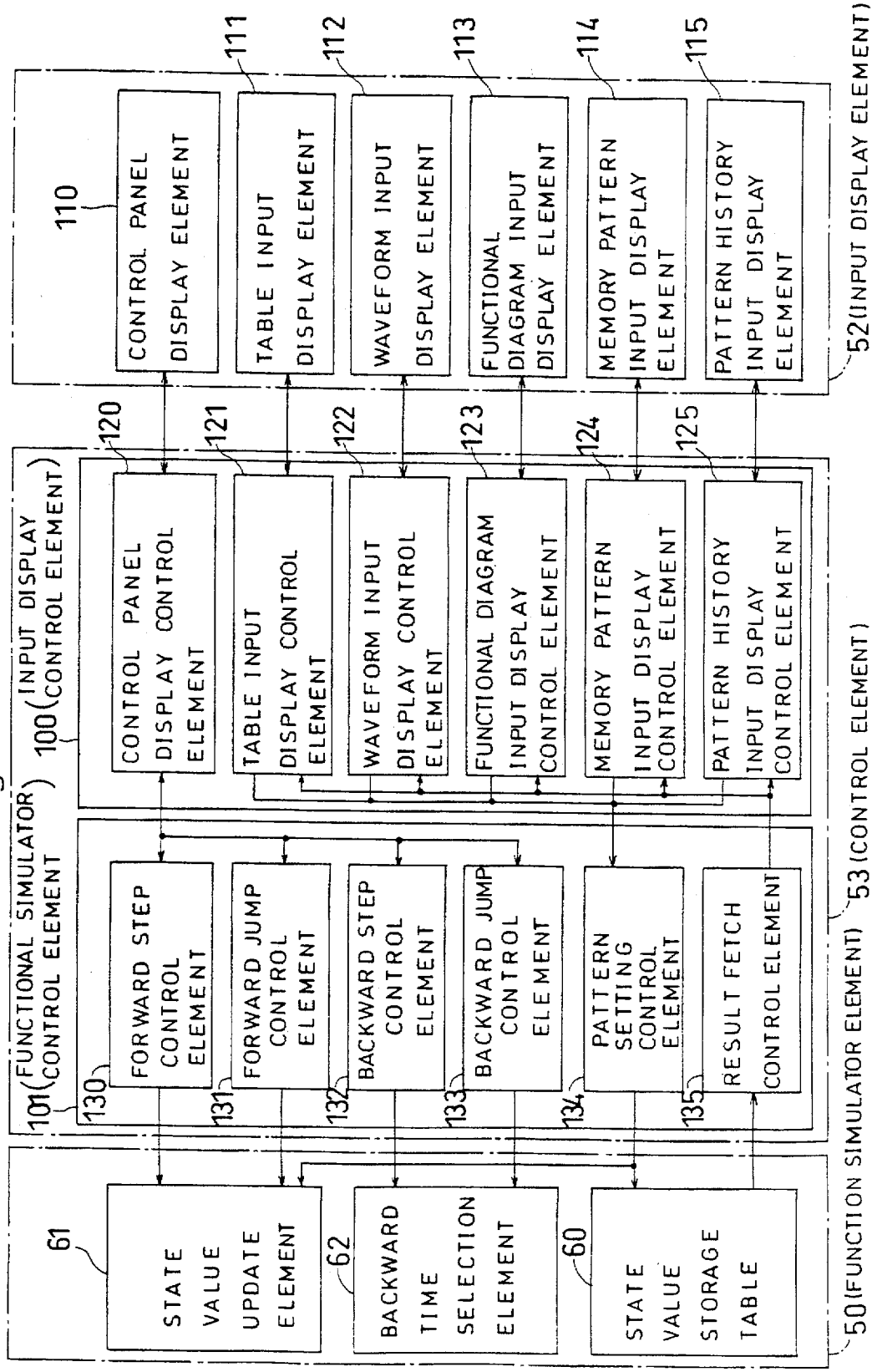
FIG. 38 is a block diagram showing the structures of a control unit and of an input display element according to the first embodiment.

Below, a detailed description will be given to the control element 53 and input display element 52 comprised by the functional simulation element 7 with reference to the drawing. First, the structures of the control element 53 and input display element 52 will be described with reference to FIG. 38. FIG. 38 is a block diagram showing the structure of the control element 53 and input display element 52. In the control element 53 shown in FIG. 38, a reference numeral 100 designates an input display control element for controlling the input display element 52 which receives control commands to the function simulator element 50 such as a functional simulation execute command, a time backward command, and a pattern input command and displays the result of the functional simulation performed by the function simulator element 50.

A reference numeral 101 designates a functional simulator control element for receiving a control command which is given to the function simulator element 50 and inputted to the input display element 52 so as to input it to the function simulator element 50 and, after the execution of the control command, receives data from the function simulator element 50 so as to transmit it to the input display control element 100.

The data transfer and data control between the input display control element 100 and functional simulator control element 101 may be process-to-process communication.

As described above, since the control element 53 is divided into the input display control element 100 for controlling the input display element 52 and the functional simulator control element 101 for controlling the function simulator element 50, if a function change or function addition is intended for the input display element 52, it is sufficient to change only the input display control element 100 without changing the function simulator control element 101, so that the present embodiment can easily satisfy the requirements set by the function change or function addition. Conversely, if a function change or function addition is performed for the function simulator element 50 or if the function simulator element 50 is replaced by another function simulator, it is sufficient to change only the functional simulator control element 101 without changing the input display control element 100, so that the present embodiment can easily satisfy the requirements set by the function change, function addition, or function simulator replacement.

In the input display element 52 shown in FIG. 38, a reference numeral 110 designates a control panel display element which is controlled by the input display control element 100 so that it displays, in the window of the CRT monitor 2, a control panel for controlling the execution of functional simulation and the inputting of test data.

Figure 39:
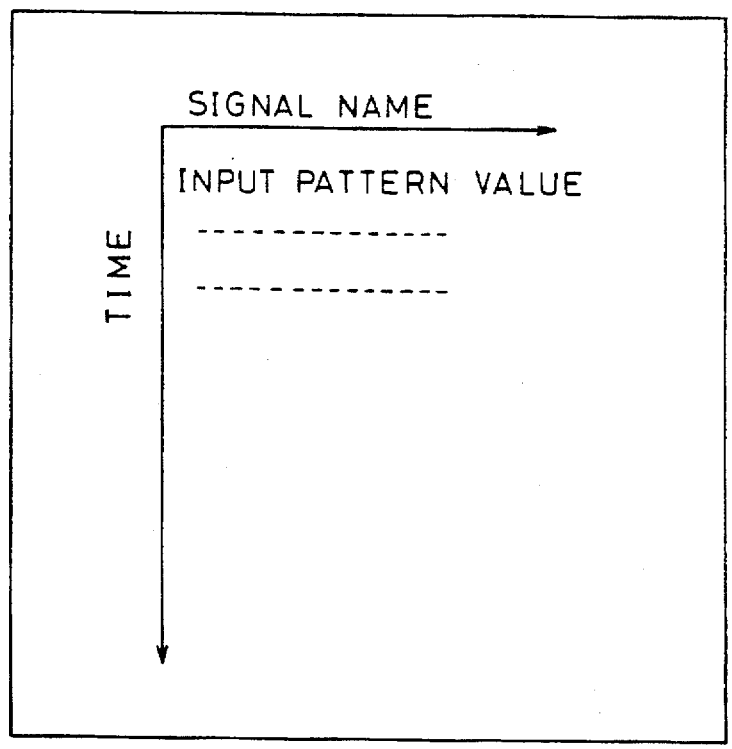
FIG. 39 is a view showing a table displayed by a tabular input display element according to the first embodiment.

A reference numeral 111 designates a table input display element which is controlled by the input display control element 100 so that, every time the function simulator element 50 performs functional simulation, the value of each signal is displayed in tubular form in the window of the CRT 118 monitor 2 (see FIG. 39).

A reference numeral 112 designates a waveform input display element which is controlled by the input display control element 100 so that a waveform pattern is inputted thereto and that, every time the function simulator element 50 performs the functional simulation, the result of the functional simulation is displayed in waveform in the window of the CRT monitor 2.

A reference numeral 113 designates a functional diagram input display element which is controlled by the input display control element 100 so that a pattern in the functional diagram is inputted thereto and that, every time the function simulator element 50 performs functional simulation, the value of each signal is displayed in the functional diagram in the window of the CRT monitor 2.

A reference numeral 114 designates a memory pattern input display element which is controlled by the input display control element 100 so that a pattern of the memory in the circuit is inputted thereto and that, every time the function simulator element 50 performs functional simulation, the memory pattern is displayed in the window of the CRT monitor 2.

A reference numeral 115 designates a pattern history input display element which is controlled by the input display control element 100 so that it displays the test data previously inputted in tabular form in the window of the CRT monitor 2 and that the test data is inputted by selecting it. For example, if the function simulator element 50 carries out backward execution and forward execution in this order or if the functional diagram information is changed, the test pattern, periodic pattern, memory pattern, and the like which were inputted in the previous functional simulation are displayed in tabular form in the window of the CRT monitor 2. If any of the above patterns is selected, it will be inputted.

The input display element 52 is also provided with a hardware-description-language input display element which accepts test data in the hardware description language so that, every time the function simulator element 50 performs the functional simulation, the result of the functional simulation is displayed in the hardware description language in the window of the CRT monitor 2, though the drawing thereof is omitted here.

In the input display control element 100 shown in FIG. 38, a reference numeral 120 designates a control panel display control element for controlling the control panel display element 110 which displays the control panel for controlling the execution of functional simulation and the inputting of test data.

A reference numeral 121 designates a table input display control element for controlling the table input display element 111 which accepts a pattern in tabular form and displays the result of functional simulation in tabular form.

A reference numeral 122 designates a waveform input display control element for controlling the waveform input display element 112 which accepts a waveform pattern and displays the result of the functional simulation in waveform.

A reference numeral 123 designates a functional diagram input display control element for controlling the functional diagram input display element 113 which accepts a pattern in the functional diagram and displays the result of functional simulation in the functional diagram.

A reference numeral 124 designates a memory pattern input display control element for controlling the memory pattern input display element 114 which accepts the pattern of a memory in the circuit and displays the memory pattern after functional simulation.

A reference numeral 125 designates a pattern history input display control element for controlling the pattern history input display element 115 which displays the test data previously inputted in tabular form so that the test data is inputted by selecting it.

The input display control element 100 is also provided with a hardware-description-language input display control element for controlling the foregoing hardware description language input display element which accepts test data in the hardware description language and displays the result of the functional simulation in the hardware description language.

In the functional simulator control element 101 shown in FIG. 38, a reference numeral 130 designates a forward step control element for controlling the execution of forward step by the state value update element 61 of the function simulator element 50 in which forward simulation is executed for one unit time.

A reference numeral 131 designates a forward jump control element for controlling the execution of forward jump by the state value update element 61 of the function simulator element 50 in which forward simulation is executed for multiple unit times.

A reference numeral 132 designates a backward step control element for controlling the execution of backward step by the backward time selection element 62 of the function simulator element 50 in which backward simulation is executed for one unit time.

A reference numeral 133 designates a backward jump control element for controlling the execution of backward jump by the backward time selection element 62 of the function simulator element 50 in which backward simulation is executed for multiple unit times.

A reference numeral 134 designates a pattern setting control element for setting the test pattern, memory pattern, and the like inputted from the input display element 52 to the state value storage table 60 of the function simulator element 50.

A reference numeral 135 designates a result fetch control element for fetching the result of the functional simulation performed by the function simulator element 50 from the state value storage table 60 of the function simulator element 50. In the execution of jump by the forward jump control element 131 or backward jump control element 133, the result fetch control element 135 specifies an objective time.

Next, a description will be given to the functional simulation controlling operation by the functional simulator control element 101 of the control element 53 with reference to FIG. 40.

FIG. 40 shows the simulation time controlled by the function simulator control element 101. As shown in the drawing, if the forward step is executed at the current time TO under the control of the forward step control element 130, the current time after the forward simulation becomes T1.

If the forward jump over eight unit times is executed at the current time TO under the control of the forward jump control element 131, the current time after the forward simulation becomes T8.

If the backward step is executed at the current time TO under the control of the backward step control element 132, the current time after the backward simulation becomes (T-1).

If the backward jump over eight unit times is executed at the current time TO under the control of the backward jump control element 133, the current time after the backward simulation becomes (T-8).

As described above, since the control element 53 has the functional simulator control element 101 thus constituted, the execution of a variety of functional simulations, the inputting of test data during the execution of the functional simulations, and the fetching of the existing functional simulation results become possible, thereby improving the efficiency with which the operational function of the logic circuit is verified.

Next, a description will be given to the control panel displayed by the control panel display element 110 of the input display element 52 with reference to FIGS. 41(a) and 41(b).

Figure 41A:
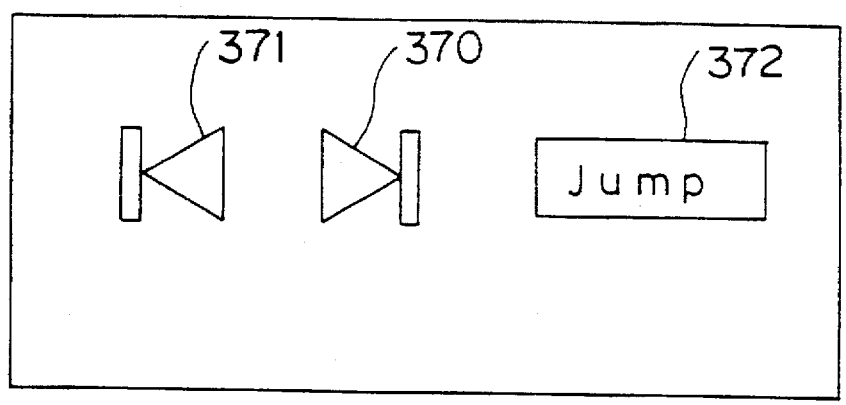
FIG. 41(a) is a view showing a control panel displayed by a control panel display element according to the first embodiment.

FIG. 41(a) shows the above control panel. In the drawing, a reference numeral 370 designates a forward step execute button. By pressing the forward step execute button 370, forward simulation is executed for one unit time and the time advances by one unit time.

A reference numeral 371 designates a backward step execute button. By pressing the backward step execute button 371, backward simulation is executed for one unit time and the time returns to the past by one unit time.

A reference numeral 372 designates a jump execute button. By pressing the jump execute button 372, there is displayed a jump execute control panel for controlling the functional simulation time so that it advances to a future time by bypassing multiple unit times or it returns back to a past time by bypassing multiple unit times.

Figure 41B:
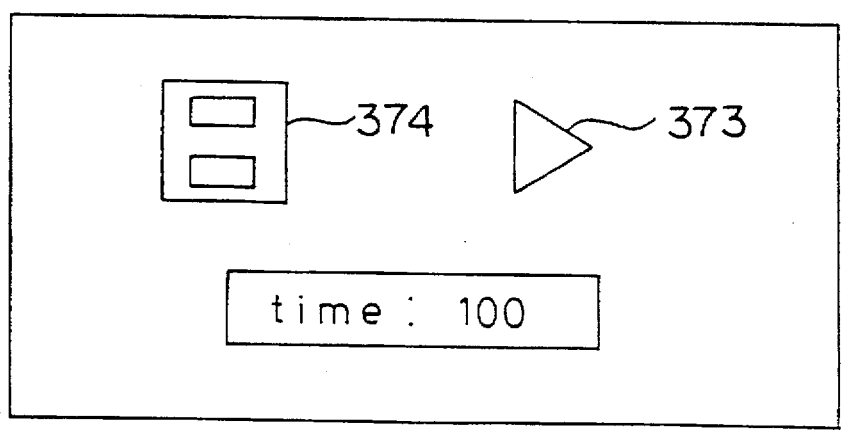
FIG. 41(b) is a view showing a jump execute control panel displayed by pushing a jump execute button in the above control panel.

FIG. 41(b) shows the above jump execute control panel. In the drawing, a reference numeral 373 designates a jump execute start button. By inputting an objective time and pressing the jump execute start button 373, the forward jump or backward jump is executed. Whether the forward jump is executed or the backward jump is executed is determined by the objective time inputted. If the objective time is in the future, the forward jump is executed so that forward simulation is executed till the objective time. If the objective time is in the past, on the other hand, the backward jump is executed so that the time is returned to the objective time.

A reference numeral 374 is a jump execute halt button. By pressing the jump execute halt button 374, the jump execution is halted halfway.

It is easily possible to specify not only the time but also a conditional expression as the condition of halting the jump execution, so that it is halted at the time when the conditional expression is satisfied.

As described above, since the control element 53 has the control panel display element 110 which is constituted so as to display the control panel, it becomes possible to control the execution of functional simulation and the inputting of test data by means of the control panel displayed in the window of the CRT monitor 2. Hence, functional simulation can be executed interactively.

Next, a specific description will be given to the input display element operation of the table input display element 111 of the input display element 52 with respect to FIGS. 42(a), 42(b), and 42(c).

FIGS. 42(a) and 42(b) are functional diagrams showing a circuit to be subjected to functional simulation. FIG. 42(c) shows a pattern in tabular form inputted to and displayed by the table input display element 111. In the drawing, "0" designates a state value 0, "1" designates a state value 1, and "x" designates an indefinite state value. It is easy to expansively multi-value the state value that can be displayed.

In the case of inputting the signal value patterns of the external input pins CLK, RST, INDATA in the functional diagram shown in FIG. 42(a), the external input pins CLK, RST, and INDATA are selected in FIG. 42(c) and the pattern in tabular form enclosed by a dotted box is inputted, so that the pattern in tabular form is fetched as a test pattern in the execution of functional simulation.

The table input display element 111 also displays the simulation result at the observation point which was selected in the execution of functional simulation. If the external output pin OUT in the functional diagram shown in FIG. 42(b) is specified as the observation point, "1" is displayed as the result of simulation as shown in FIG. 42(c).

In the pattern, it is possible to set the signal values one by one with respect to a given time, so that they can be reset any number of times.

The signal value pattern can be set not only in decimal but also in binary, octal, and hexadecimal.

The pattern can be set not only to the external input pin but also to a given signal in the functional diagram by the force for forcibly setting the state values of terminals, registers, and the like or by the unforce for canceling the force. The observation point can also be set not only to the external output pin but also to a given signal in the tabular functional diagram.

The methods of selecting signals to which the pattern is set and to which the observation point is set include the clicking of the mouse and the inputting of the signal name in another window.

Thus, it is possible to input the pattern in tabular form and display the result of functional simulation in the window of the CRT monitor. As a result, it becomes possible to know the state values of the circuit models operating in parallel in tabular form, not in a sequence of characters, in the execution of functional simulation. Hence, the operational function of the logic circuit can be verified with improved efficiency.

Next, a specific description of the input display operation by the waveform input display element 112 of the input display element 52 will be described with reference to FIGS. 43(a) and 43(b).

Figure 43A:
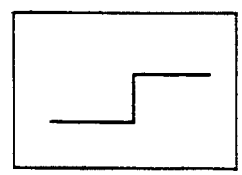
FIG. 43(a) is a waveform chart showing a waveform pattern inputted to the above waveform input display element.
Figure 43B:
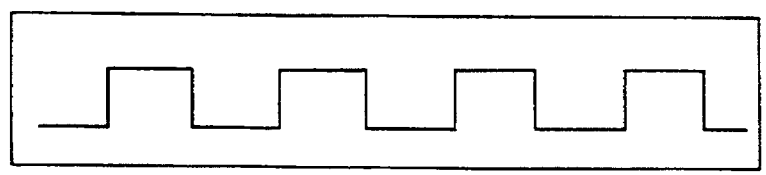
FIG. 43(b) is a waveform chart showing a waveform pattern displayed by the above waveform input display element.

FIG. 43(a) shows a waveform pattern in one cycle inputted by the waveform input display element 112 and FIG. 43(b) shows the waveform pattern displayed by the waveform input display element 112.

If the periodic signal of the external input pin CLK in the functional diagram shown in FIG. 42(a) is set so as to alternate 0 and 1 during one unit time, the external input pin CLK is selected as the element to which a waveform pattern is inputted, and the waveform pattern shown in FIG. 43(a) is inputted thereto. In the execution of functional simulation, the waveform pattern is fetched as a test pattern. After the simulation, the waveform input display element 112 displays the signal of the external input pin CLK in periodic waveform, as shown in FIG. 43(b).

In addition to 0 and 1, X can also be used in setting the periodic signal. It is easy to arrange the present embodiment so that multi-value can be treated as the periodic signal.

The methods of selecting the element to which the pattern is set include the clicking of the mouse and the inputting of the element name in another window.

The periodic waveform can be changed at a time halfway through the functional simulation.

Thus, if the test data for one cycle is inputted, the test data over the whole simulation period is displayed in the window of the CRT monitor 2. Therefore, by simply inputting the test data for one cycle prior to the execution of functional simulation, the setting of the test data can easily be accomplished.

Next, a specific description will be given to the input display operation of the memory pattern input display element 114 of the input display element 52 with reference to FIG. 44.

FIG. 44 shows a memory pattern inputted and displayed by the memory pattern input display element 114. In the drawing, a reference numeral 380 designates an address panel for displaying the addresses in the memory. The methods of displaying the addresses in the memory include decimal, binary, octal, and hexadecimal forms.

A reference numeral 381 designates a memory pattern panel for displaying memory patterns and accepting and changing patterns. The methods of displaying memory patterns include decimal, binary, octal, and hexadecimal forms. Even if the panel 381 can display the memory patterns of only a part of the addresses, it is possible to show the memory patterns of all the addresses using a scrolling function.

The functions of editing memory patterns include: a cursor mode function of moving the cursor to the right, to the left, to the top, or to the bottom after characters are inputted; a copying function of selecting a block of memory patterns displayed on the memory pattern panel 381 and copying the selected block of memory patterns to different addresses; a counting function of sequentially inputting values obtained by incrementing a specified value to the memory patterns from the smallest address number upward in the selected block of memory patterns; and a changing function, of changing the values in the selected block of memory patterns in accordance with a specific pattern.

As an example of the changing function, if the pattern "111??" is used to change the values of the memory patterns, the third to fifth bits of all the selected memory patterns become "1," while the first and second bits thereof remain to have the values originally inputted to the selected memory patterns. For example, if the first bit is "0" and the second bit is "1" they will remain the same, while the third to fifth bits become "1."

Thus, with the cursor mode function, copying function, counting function, and changing function, memory patterns can easily be inputted and it becomes possible to display the memory patterns every time the function simulator element 50 executes functional simulation. Consequently, the operational function of the logic circuit provided with a memory can be verified with ease.

Next, a specific description will be given to the operation of the pattern history input display element 115 of the input display element 52 with reference to FIG. 45.

Figure 45:
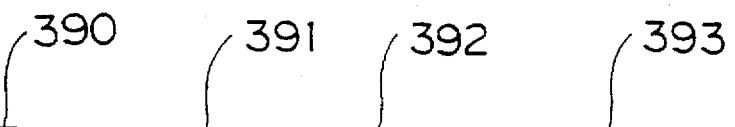
FIG. 45 is a view showing test data used in past functional simulation which is inputted to and displayed by a pattern history input display element according to the first embodiment.

FIG. 45 shows a pattern used as test data in the past functional simulation, which is inputted to and displayed by the pattern history input display element 115. In the drawing, a reference numeral 390 designates time indicating the time at which the pattern is inputted.

A reference numeral 391 designates a clock which displays, if a periodic pattern is inputted, the character "C" indicating that the periodic pattern has been inputted. If the character "C" is selected here, the name of a signal to which the periodic pattern is set and the one cycle of waveform which is set to the signal are displayed. Any method can be used to indicate that the periodic pattern has been inputted provided that the method is intended as such. For example, it is possible to simply display the name of the signal to which the periodic pattern is set. It is also possible to display an image that represents the periodic pattern.

A reference numeral 392 designates a memory and, if a memory pattern is inputted, the character "M" indicating that the memory pattern has been inputted is displayed. If the character "M" is selected here, the name of a memory element to which the memory pattern is set and the memory pattern set to the memory element are displayed. To indicate that the memory pattern has been inputted, it is possible to simply display the name of the memory element to which the memory pattern is set. It is also possible to display an image that represents the memory.

A reference numeral 393 displays the signal names in which test patterns are inputted and the patterns inputted in the signal names at specified times.

To input the test data displayed by the pattern history input display element 115, the time of desired test data is selected. If the functional simulator element 50 executes functional simulation, the selected test data is automatically transferred from the pattern history input display element 115 to the functional simulator control element 101 via the pattern history input display control element 125, so as to be inputted to the function simulator element 50.

The methods of selecting desired test data include the clicking of the mouse at the time of desired test data or the enclosing of the time with the mouse.

Thus, by displaying the previously inputted test data in the window on the CRT monitor and selecting desired test data among the test data being displayed, it becomes possible to reuse the previously inputted test data. In the case of restarting functional simulation, therefore, it is not required to manually input test data from the beginning. By simply selecting the test data displayed by the pattern history input display element 115, the test data is automatically transferred to the function simulator element 50 so that it can execute functional simulation.

Even in the case where the functional diagram to be subjected to functional simulation is changed, if the result of the preceding functional simulation is stored in a functional simulation result file and the functional simulation result file is loaded, the test data can also be reused. Consequently, the operational function of the logic circuit can be verified in a reduced period with improved efficiency.

Next, a specific description will be given to the input display operation of the functional diagram input display element 113 of the input display element 52 with reference to FIGS. 46(a) and 46(b).

Figure 46A:
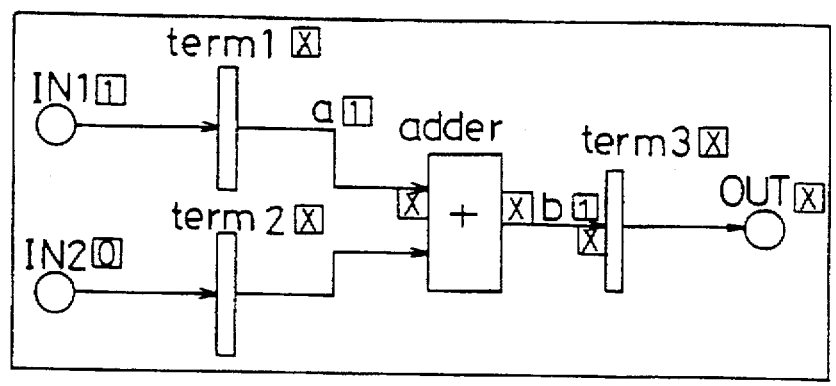
FIG. 46(a) is a view showing a pattern in the form of a functional diagram inputted to a functional diagram input display element according to the first embodiment.
Figure 46B:
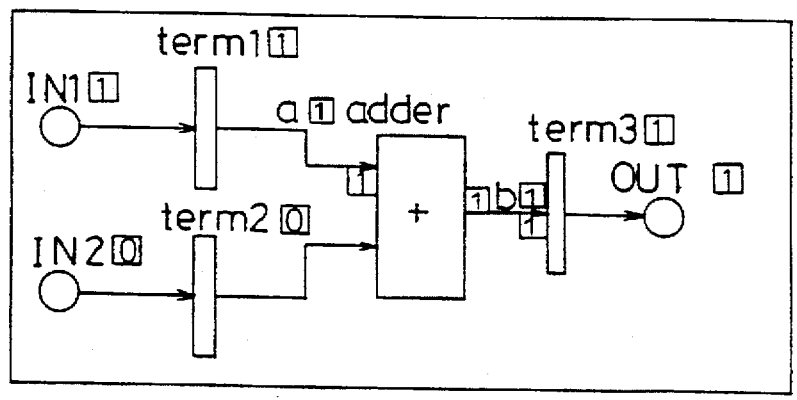
FIG. 46(b) is a view showing a pattern in the form of a functional diagram displayed by the above functional diagram input display element.

FIG. 46(a) shows a pattern in functional diagram representation inputted to the functional diagram input display element 113 and FIG. 46(b) shows a pattern in the functional diagram representation displayed by the functional diagram input display element 113.

In the case of inputting test data to the external input pins IN1 and IN2 in the functional diagram shown in FIG. 46(a), patterns "1" and "0" are inputted to the signal value display columns of the external input pins IN1 and IN2. In the execution of functional simulation, the patterns are fetched as test data, and after the execution of functional simulation, the state value "1" of the external output pin OUT which has been set as the observation point in the functional diagram is displayed.

The pattern can be set to not only to the external input pin but also a given signal in the functional diagram by the force for forcibly setting the state values of terminals, registers, and the like, or the unforce for canceling the force. The observation point can also be set not only to the external output pin but also a given signal in the functional diagram. The state value under the force can be distinguished from the state value out of the force if the character representing it is displayed in a different color. As for the transfer condition labels a and b, they may be high-lighted using different colors according to the state values, instead of displaying the state values.

The methods of selecting a signal to which the pattern is set and a signal which is set as the observation point include the clicking of the mouse and the inputting of the signal name in another window.

Thus, it becomes possible to input the test pattern and display the result of functional simulation in the functional diagram of the logic circuit to be subjected to functional simulation. Consequently, it becomes possible to know the state values of the circuit models operating in parallel in executing simulation, so that the operational function of the logic circuit can be verified with improved efficiency.

Below, the functional diagram input display control element 123 of the input display control element 100 of the control element 53 and the functional diagram input display element 113 of the input display element 52 will be described in detail with reference to the drawings.

First, a description will be given to the structures of the functional diagram input display control element 123 and functional diagram input display element 113 with reference to FIG. 47.

Figure 47:
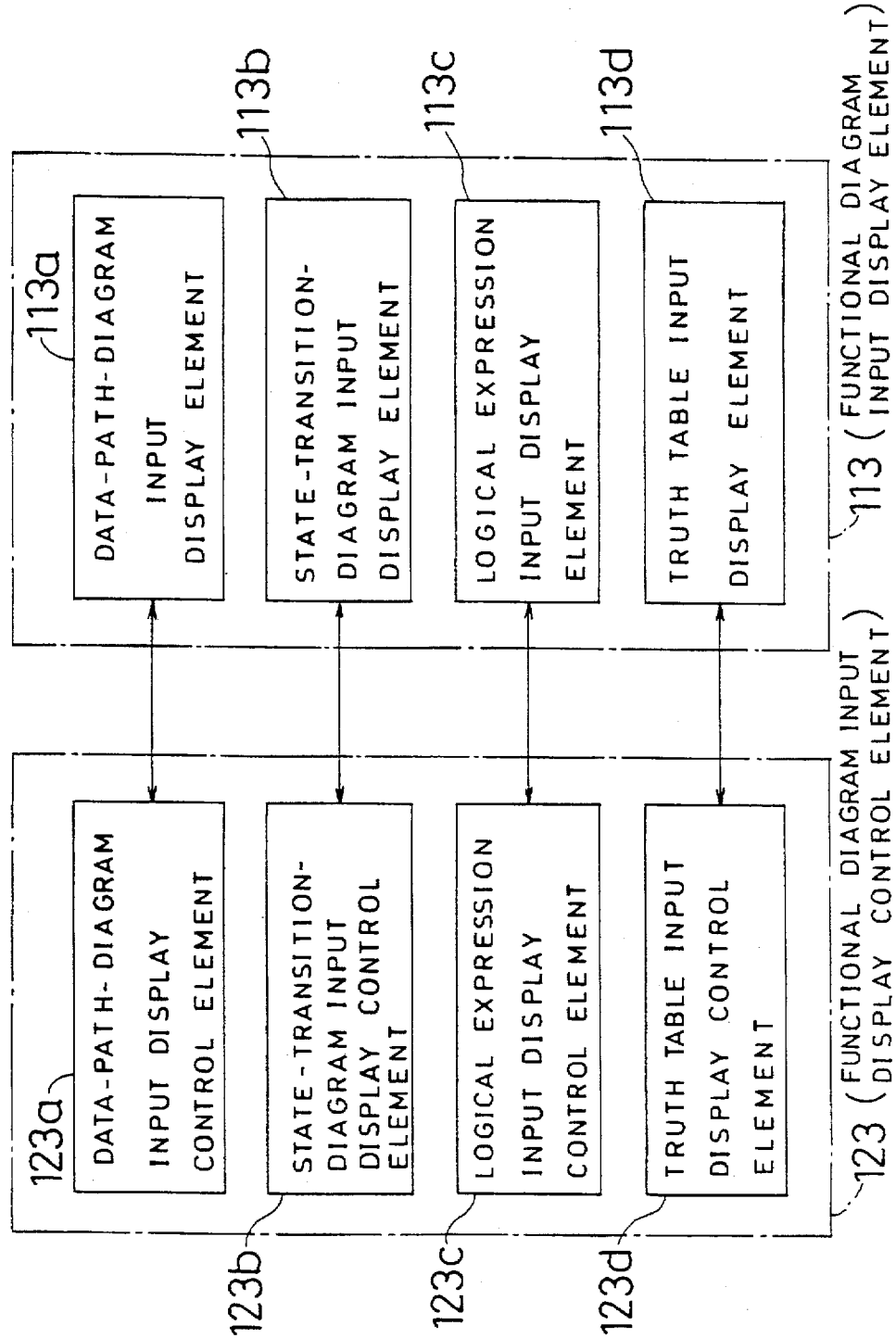
FIG. 47 is a block diagram showing the structures of a functional diagram input display control element and the structure of the functional diagram input display element according to the first embodiment.

FIG. 47 is a block diagram showing the structures of the functional diagram input display control element 123 and functional diagram input display element 113. In the functional diagram input display element 113 shown in FIG. 47, a reference numeral 113a designates a data-path-diagram input display element which is controlled by the functional diagram input display control element 123 so as to input a pattern in the data-path-diagram representation which represents, in a data path diagram, the operational function of a logic circuit to be subjected to functional simulation and to display, every time the function simulator 50 executes functional simulation, the signal values indicating the results of the functional simulation in the data-path-diagram- representation in the window of the CRT monitor 2.

A reference numeral 113b designates a state-transition-diagram input display element which is controlled by the functional diagram input display control element 123 so as to accept a pattern in state-transition-diagram representation which represents, in a state transition diagram, the operational function of the logic circuit to be subjected to functional simulation and to display, every time the function simulator element 50 executes functional simulation, the signal values indicating the results of the functional simulation in the window of the CRT monitor 2.

A reference numeral 113c designates a logical expression input display element which is controlled by the functional diagram input display control element 123 so as to accept a pattern in the functional expression representation which represents, in a logical expression, the operational function of the logic circuit to be subjected to functional simulation and to display, every time the function simulator element 50 executes functional simulation, the signal values indicating the results of the functional simulation in the window of the CRT monitor 2.

A reference numeral 113d designates a truth table input display element which is controlled by the truth table input display control element 123 so as to input a pattern in truth table representation which represents, in a truth table, the operational function of the logic circuit to be subjected to functional simulation and to display, every time the function simulator element 50 executes functional simulation, the signal values indicating the results of the functional simulation in the window of the CRT monitor 2.

In the functional diagram input display control element 123 shown in FIG. 47, a reference numeral 123a designates a data-path-diagram input display control element for controlling the data-path-diagram input display element 113a which accepts a pattern in the data-path-diagram representation and displays the result of the functional simulation in the data-path-diagram representation.

A reference numeral 123b designates a state-transition-diagram input display control element for controlling the state-transition-diagram input display element 113b which accepts a pattern in the state-transition-diagram representation and displays the results of the functional simulation in the state transition diagram representation.

A reference numeral 123c designates a logical expression accepts display control element for controlling the logical expression input display element 113c which inputs a pattern in the logical expression representation and displays the results of the functional simulation in the logical expression representation.

A reference numeral 123d designates a truth table input display control element for controlling the truth table input display element 113d which accepts a pattern in the truth table representation and displays the result of the functional simulation in the truth table representation.

Next, specific patterns in the diagrams inputted to and displayed by the state-transition-diagram input display element 113b, logical expression input display element 113c, and truth table input display element 113d will be described with reference to FIGS. 48(a), 48(b), and 48(c). The description of the pattern in the data-path-diagram representation which is inputted to and displayed by the data-path-diagram input display element 113a will be omitted here, for it is shown in FIGS. 46(a) and 46(b) and has already been described as the pattern in the functional diagram.

FIG. 48(a) show a pattern in the state-transition-diagram representation inputted to and displayed by the state-transition-diagram input display element 113b. Under the control of the state-transition-diagram input display control element 123b, the state values in the states ST1 to ST4 of the state machine and the state values of the transition conditions a and b are displayed in the signal value display columns.

FIG. 48(b) shows a pattern in the logical expression representation inputted to and displayed by the logical expression input display element 113c. Under the control of the logical expression input display control element 123c, the state values of the elements IN1 and IN2 to be referred to in defining conditions and the state values of the conditions a and b to be defined are displayed in the signal value display columns.

FIG. 48(c) shows a pattern in the truth table representation inputted to and displayed by the truth table input display element 113d. Under the control of the truth table input display control element 123d, the state values of the elements reg1 and reg2 to be referred to for defining conditions and the state values of the conditions c and d are displayed in the signal value display columns.

In the case of displaying characters in the signal value display columns, it is possible to clearly differentiate the state values by displaying the signal value display columns in different colors according to the signals values. For example, "X" can be differentiated by displaying it in a specific color. Instead of displaying characters in the signal value display columns, the current state of the state machine, its pre-transition state in the execution of forward simulation, and its pre-backward-simulation state in the execution of backward simulation can be high-lighted using a different color in the state-transition-diagram representation of FIG. 48(a).

In theological expression representation of FIG. 48(b) and in the truth table representation of FIG. 48(c), it is also possible to distinctively display the state values using not only characters but also colors. For example, when the condition becomes "ON," the column for a condition name is high-lighted in a color and when the condition becomes "X," the column for a condition name is high-lighted in another color.

The pattern and observation point can be set to given signals in the data-path-diagram representation, state-transition-diagram representation, logical expression representation, and truth table representation.

The methods of selecting signals to which the inputted pattern and observation point are set include the clicking of the mouse and the inputting of signal names in another window. Thus, it becomes possible to input a test pattern and display the result of the functional simulation in the data-path-diagram representation, state-transition-diagram representation, logical expression representation, and truth table representation displayed in the multi-window of the CRT monitor. Consequently, it becomes possible to easily recognize the state values of the circuit models operating in parallel in the execution of functional simulation, so that the operational function of the logic circuit can be verified with improved efficiency.

Below, an example of the functional design verification method for verifying the functional design of the operation of a logic circuit using a functional design support apparatus comprising the above functional simulation element 7 will be described with reference to the drawings.

First, the overall flow of steps in the above functional design verification method will be described with reference to FIG. 49.

Figure 49:
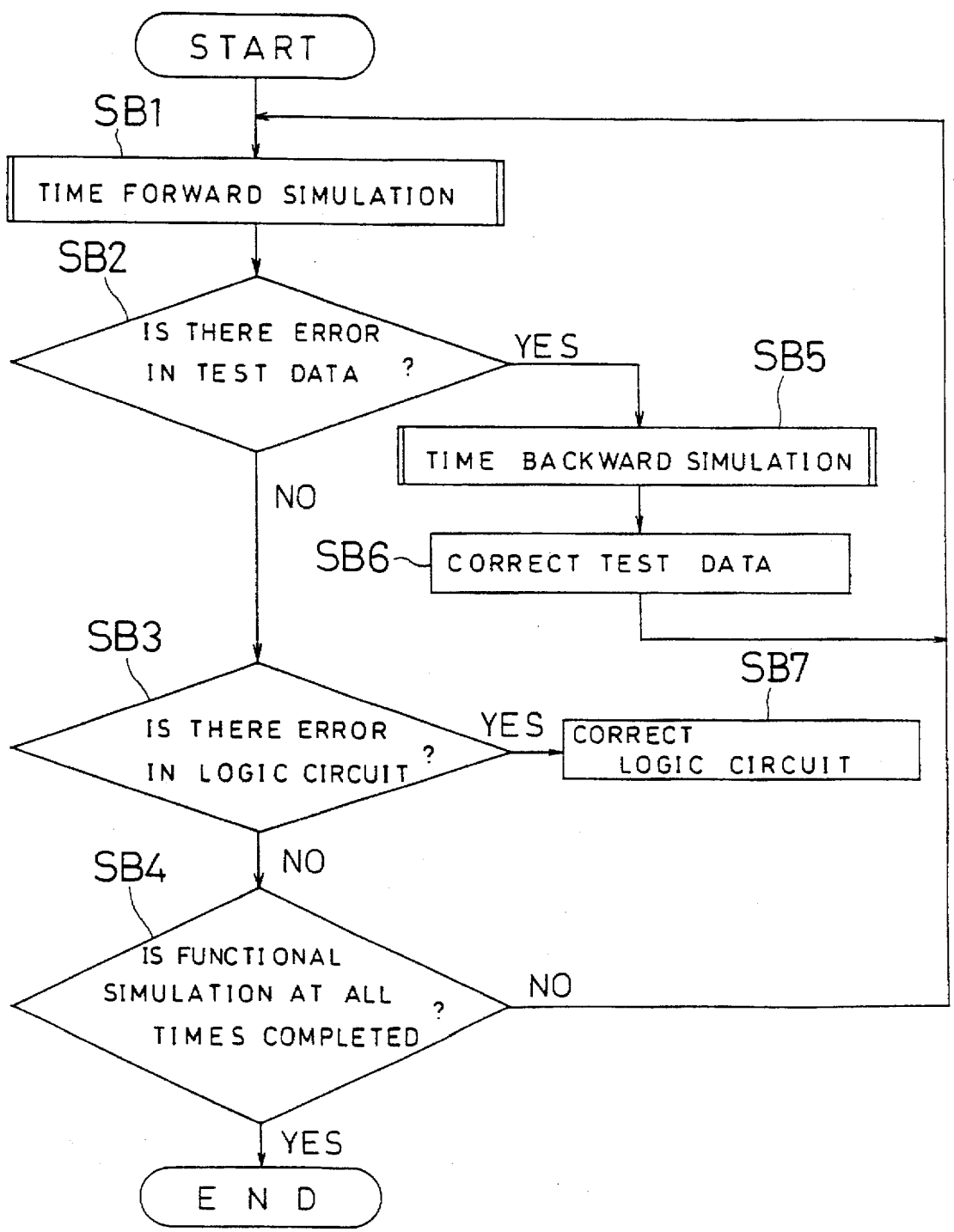
FIG. 49 is a flow chart showing a functional design verification method using a functional design support apparatus provided with the above function simulator element.

FIG. 49 is a flow chart showing the flow of steps in the above functional design verification method. As shown in FIG. 49., Step SB1 is a forward simulation step of selecting and inputting the test data displayed in the window of the CRT monitor 2 by means of the input unit 1, executing forward step or forward jump based on the test data, and displaying the functional simulation result.

In Step SB2, it is judged whether or not an error exists in the inputted test data. If there is no error in the test data, the process goes on to Step SB3.

Conversely, if there is any error in the test data, the process goes on to the backward simulation step in Step SB5, where backward step or backward jump is executed so that the simulation time returns to the past simulation time when the faulty test data was inputted. After the faulty data was corrected so as to produce new test data in Step SB6, the process returns to Step SB1, where forward simulation is restarted from the above past simulation time based on the new test data.

In Step SB3, it is judged by comparing the functional simulation result being displayed and the expectation value whether or not a logical error or a description mistake exists in the logic circuit to be subjected to logical simulation. If there is no error in the logic circuit, the process goes on to Step 4.

Conversely, if there is any error in the logic circuit, the process goes on to Step SB7 where the logical error or description mistake is corrected in the logic circuit. Here, a trace back operation can easily be performed by specifying the past simulation time and displaying the state value at the time.

In Step SB4, it is judged whether or not the functional simulation was executed at all the simulation times, i.e., whether or not the state values at all the simulation times were obtained and verified for each circuit model constituting the logic circuit. If there exists any simulation time at which the functional simulation was not executed, the process goes. back to the forward simulation process of Step SB1 and Steps SB1 to SB6 are repeatedly executed thereafter until the execution of functional simulation at all the simulation times is completed. When the functional simulation at all the times is completed, the verification of the functional design of the operation of the logic circuit is completed.

Next, the forward simulation step of Step SB1 will be described in detail with reference to FIG. 50. Here, as shown in FIG. 29, a description will be given to the forward simulation step in the case of performing the forward simulation at the simulation time T1.

Figure 50:
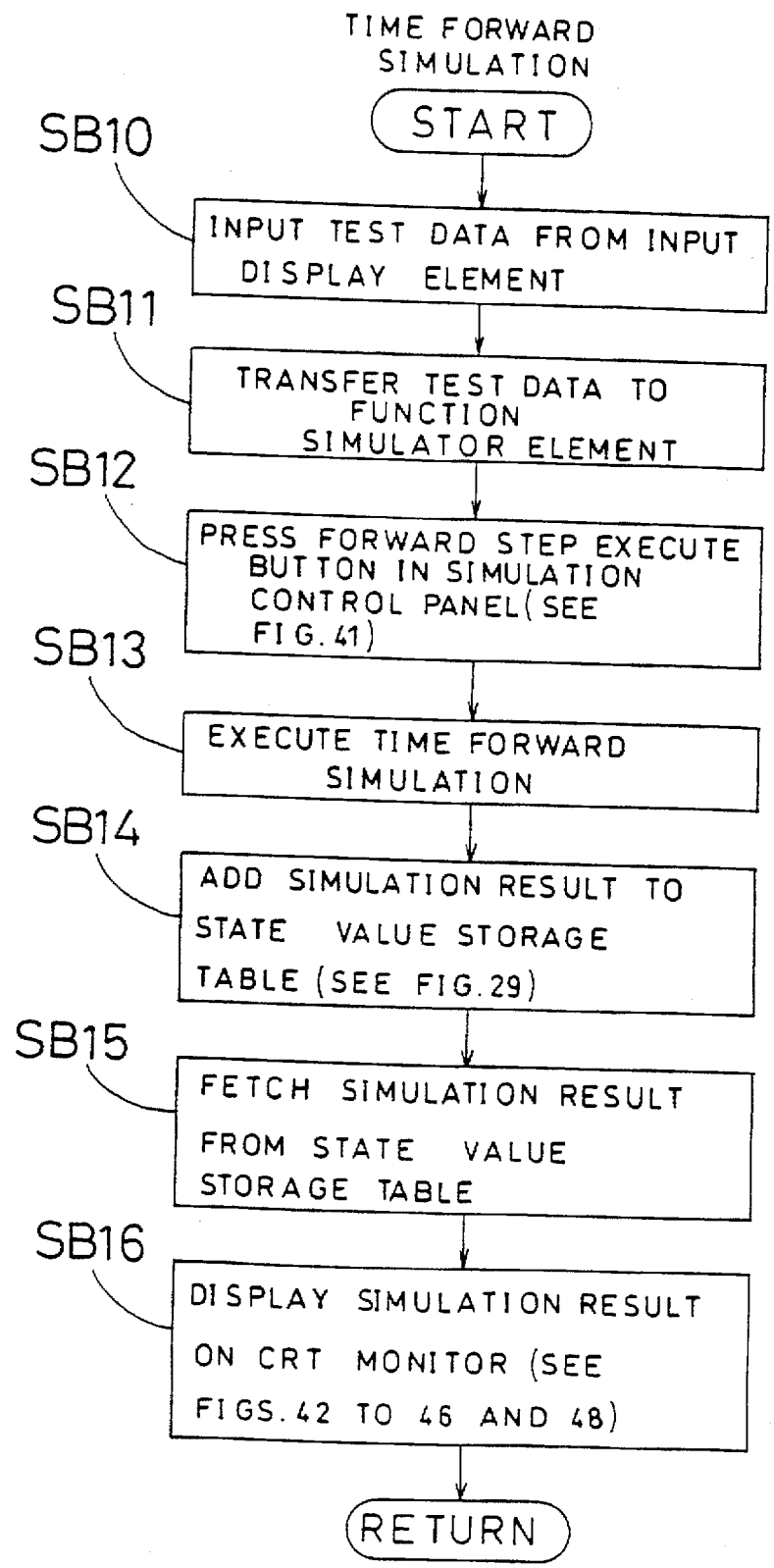
FIG. 50 is a flow chart showing a detailed process of forward simulation in the functional design verification method of FIG. 49.

FIG. 50 is a flow chart showing the forward simulation step of Step SB1 in detail. As shown in the drawing, the input display element 52 initially inputs, e.g., a pattern in the form of a functional diagram as test data in Step SB10.

Next, in Step SB11, the test data is transferred from the input display element 52 to the function simulator element 50 under the control of the control element 53. Subsequently, in Step SB12, the forward step execute button 370 in the control panel displayed by the input display element 52 is pressed, as shown in FIG. 41(a).

In response to the pressing of the forward step execute button 370, the function simulator element 50 simulates, based on the test data, the operational function of the logic circuit for a specified unit time in Step SB13.

When the simulation is completed, the function simulator element 50 adds, in Step SB14, the simulation result to its state value storage table 60 as the state value of the logic circuit at the simulation time T2, as shown in FIG. 29.

In Step SB15, the control element 53 fetches the simulation result from the state value storage table 60 of the function simulator element 50 as the state value of the logic circuit at the simulation time T2 and transfers it to the input display element 52.

In Step SB16, the input display element 52 displays the above simulation result in the functional diagram, as shown in FIGS. 46 and 48. It is also possible to display the simulation result in tabular form or in waveform as shown in FIGS. 42 and 43, respectively. In the case where the logic circuit comprises a memory, it is possible to display a memory pattern serving as the simulation result, as shown in FIG. 44. It is also possible to display the test data inputted in Step SB10 in tabular form, as shown in FIG. 45.

The forward simulation step for forward jump is initiated in Step SB12 by pressing the jump execute button 372 in the control panel shown in FIG. 41(a), so as to display the jump execute control panel shown in FIG. 41(b), specifying a desired simulation time, and pressing the jump execute start button 373 in the jump execute control panel. By repeatedly executing Steps SB13 to SB16, the state values at all the simulation times between the current time and the above simulation time are obtained, thereby completing the process.

In the case where the test data was set in the pattern history input display element, the test data is automatically set so as to execute forward simulation.

Thus, in the above forward simulation step, functional simulation can be executed for a limited period of time.

Moreover, test data can be inputted and the simulation result can be displayed every time functional simulation is executed. Consequently, the operational function can be verified halfway through the simulation and hence an error in the test data can be detected at an early stage.

Furthermore, by repeatedly executing the forward simulation step, the state values of the logic circuit at the individual simulation times can be set to the state value storage table 60 of the function simulator element 50.

Next, the backward simulation process of Step SB5 will be described in detail with reference to FIG. 51. Here, a description will be given to the backward simulation step in which the state values of the logic circuit at the simulation times T1 to T4 are preliminarily set in the status value storage table 60, as shown in FIG. 29, and the backward jump is conducted from the simulation time T4 to the past simulation time T2.

Figure 51:
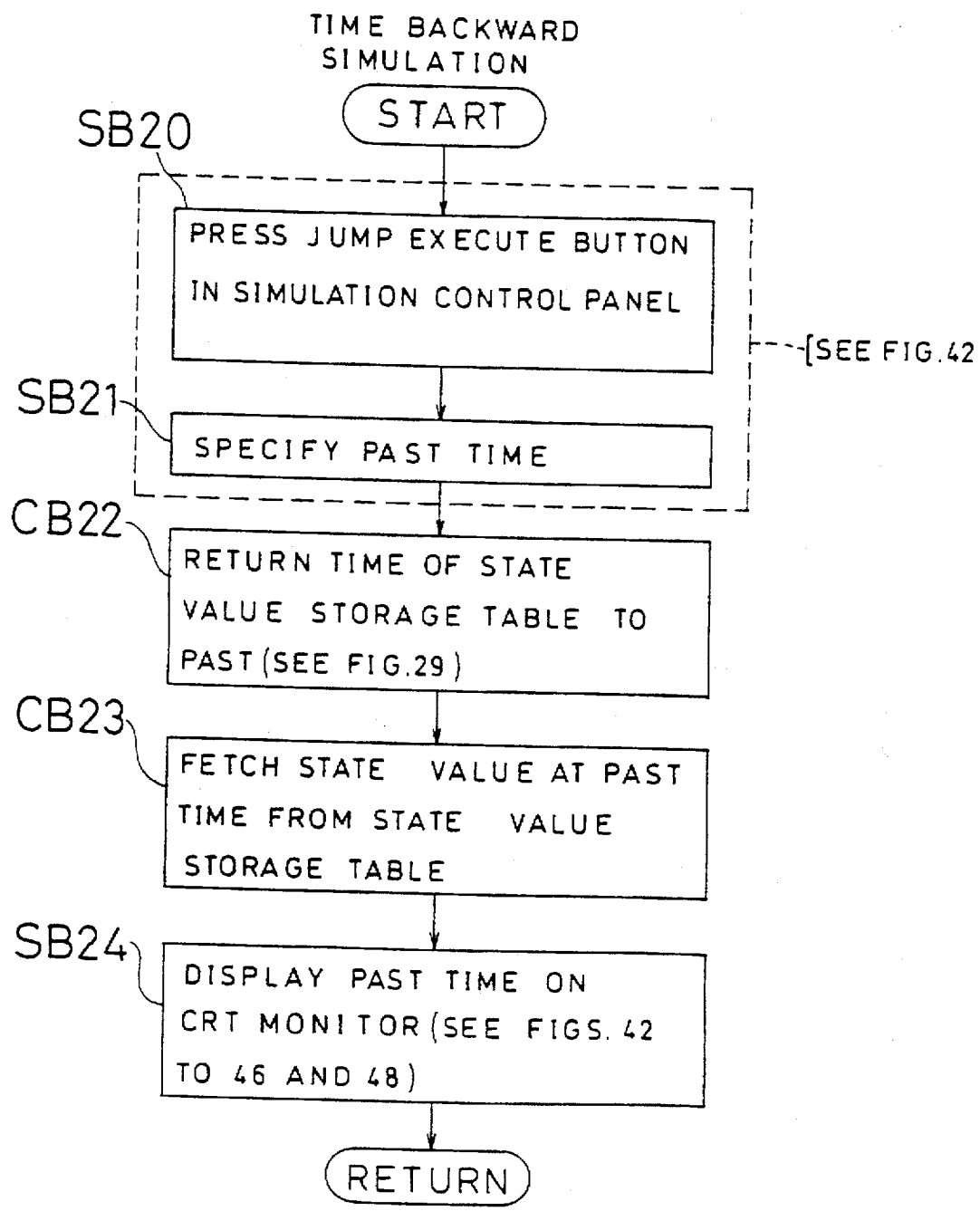
FIG. 51 is a flow chart showing a detailed process of backward simulation in the functional design verification method of FIG. 49.

FIG. 51 is a flow chart showing the backward simulation step of Step SB5 in detail. As shown in FIG. 51, the jump execute button 372 in the control panel displayed by the input display element 52 is initially pressed in Step SB20, as shown in FIG. 41(a), thereby displaying the jump execute control panel, as shown in FIG. 41(b).

Then, in Step SB21, the past simulation time T2 is specified as an objective time and the jump execute start button 373 is pressed in the jump execute control panel.

In response to the pressing of the jump execute start button 373, the simulation time in the state value storage table 60 is returned to the past simulation time T2 in the function simulator 50 in Step SB22, as shown in FIG. 29.

In Step SB23, the control element 53 fetches as the simulation result the state value of the logic circuit at the past simulation time T2 from the state value storage table 60 of the function simulator element 50 and transfers it to the input display element 52.

In Step SB24, the input display element 52 displays the above simulation result in the functional diagram, as shown in FIGS. 46 and 48. It is possible to show the simulation result in tabular form or in waveform, as shown in FIGS. 42 and 43, respectively. In the case where the logic circuit comprises a memory, it is also possible to show the memory pattern serving as the simulation result, as shown in FIG. 44.

The backward simulation step for backward step is initiated in Step SB20 by pressing the backward step execute button 371 in the control panel, which is shown in FIG. 41(a). In Step SB22, the simulation time in the state value storage table 60 of the simulator element 50 is returned to the preceding simulation time. In Step SB23, the state value of the logic circuit at the above preceding simulation time is transferred as the simulation result from the function simulator element 50 to the input display element 52. In Step SB24, the above simulation result is displayed in the functional diagram, thereby completing the process.

Thus, according to the above backward simulation step, the simulation time can be returned to the past. Consequently, even if there is an error in the inputted test data and if the inputted test data is to be changed, it is not required to execute the forward simulation step again from the time 0.

Moreover, since it is possible to recognize the state value at a past simulation time, even if there is an error in the logic circuit or test data, a trace back operation can easily be performed in order to determine its cause.

Below, another example of the structure of the functional simulation element of the functional design support apparatus according to the first embodiment will be described with reference to FIG. 52.

Figure 52:
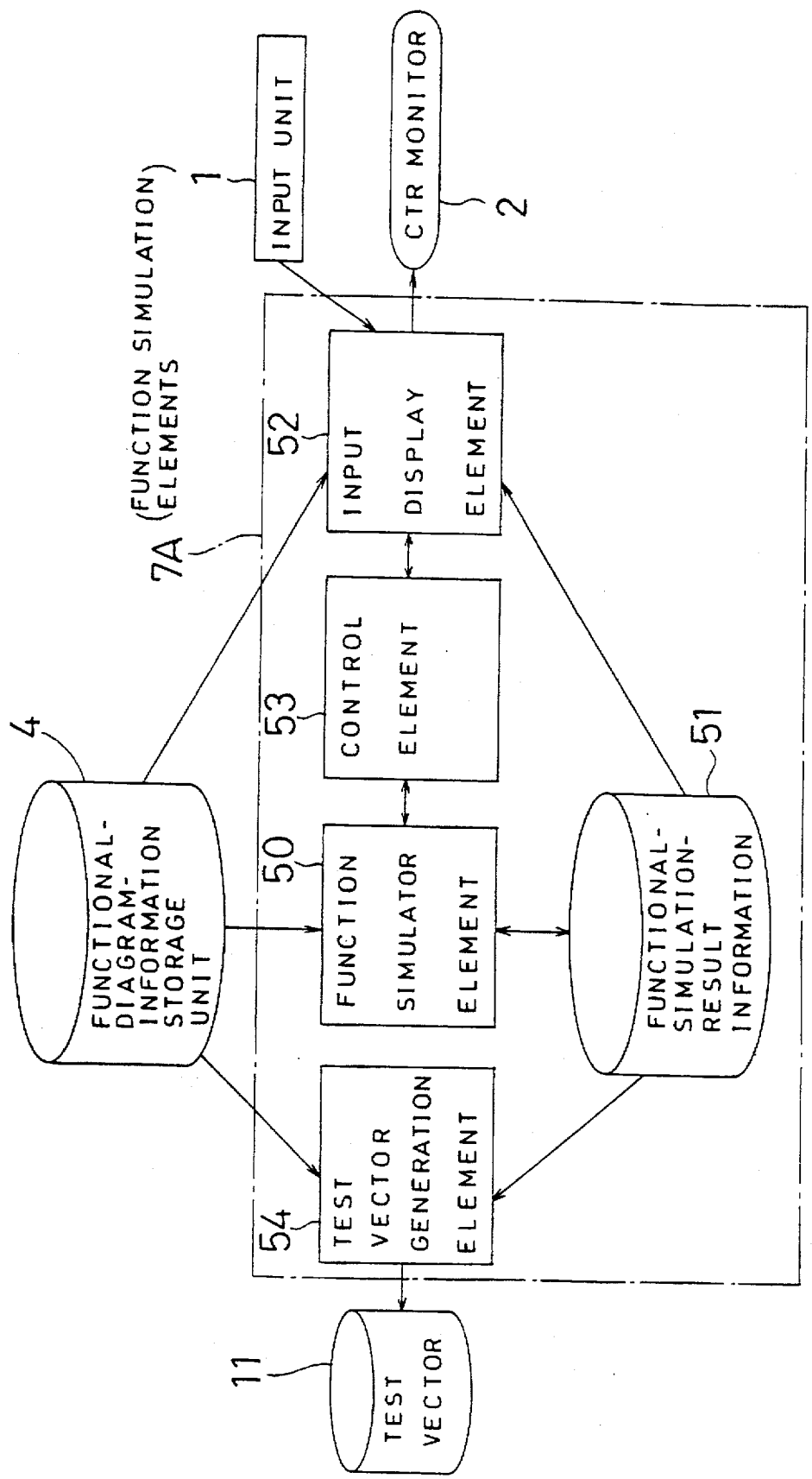
FIG. 52 is a block diagram showing another example of the structure of the functional simulation element according to the first embodiment.

FIG. 52 is a block diagram showing the overall structure of the functional simulation element 7A, which is obtained by further providing the functional simulation element 7 of FIG. 26 with a test vector generation element. The description of the same components as shown in FIG. 26 will be omitted here by providing the same reference numerals.

In FIG. 52, a reference numeral 54 designates the test vector generation element which accepts the functional description information and the functional-simulation-result information 51 and generates a test vector 11 for describing the content of the test data. By inputting the test vector 11 to the language based function simulator 10 of simultaneous processing type, functional simulation can be executed. The test vector 11 can be used not only as the input of the function simulator, but also as the input of a logic simulator.

The generated test vector 11 can be used not only in the simulator of simultaneous processing type but also in a simulator of interactive type.

Thus, by further providing the functional simulation element with the test vector generation element 54, the test vector for the language based function simulator 10 can be generated from the result information which has been subjected to interactive functional simulation based on the test data inputted for debugging the logic circuit interactively. Consequently, it becomes possible to interactively produce test data and correct it, while debugging the logic circuit and verifying the operational function thereof.

Example 2

Below, a functional design support apparatus according to a second embodiment of the present invention will be described with reference to the drawings.

Figure 53:
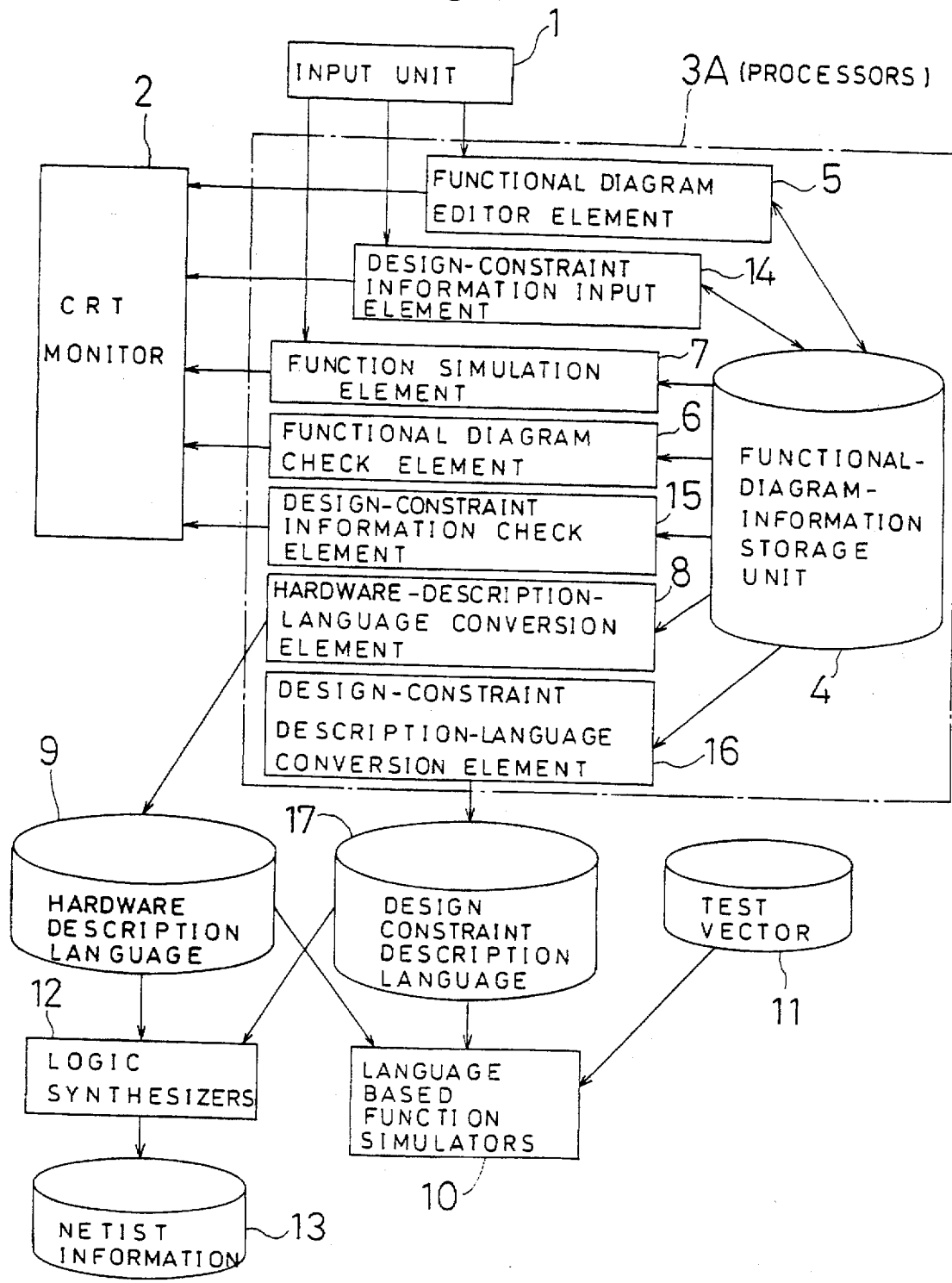
FIG. 53 is a block diagram showing the overall structure of the functional design support apparatus according to a second embodiment of the present invention.

FIG. 53 is a block diagram showing the overall structure of the functional design support apparatus according to the second embodiment. The description of the same components as shown in FIG. 1 of the first embodiment will be omitted here by providing the same reference numerals.

In FIG. 53, a processor 3A of the functional design support apparatus of the second embodiment comprises the functional-diagram-information storage unit 4, functional diagram editor element 5, functional diagram check element 6, functional simulation element 7, and hardware-description-language conversion element 8, similarly to the functional design support apparatus of the first embodiment, which is shown in FIG. 1. In addition to the above components, the functional design support apparatus of the second embodiment further comprises a design-constraint-information input element 14, design-constraint-information check element 15, and design-constraint description language conversion element 16.

The design-constraint-information input element 14 inputs, into the functional diagram indicated by the functional diagram information, design constraint information including timing constraint information, delay constraint, information, fan-out, and fan-in.

The design-constraint-information check element 15 detects the presence or absence of a contradiction in the design constraint information inputted by the design-constraint-information input element 14.

The functional simulation element 7 accepts, from the functional-diagram-information storage unit 4, the functional diagram information on a functional diagram and verifies the function and timing of a logic circuit by executing delay simulation with respect to the functional diagram.

By the time the functional simulation element 7 accepts the function diagram information, the functional diagram information has become contradiction-free because it was detected for a contradiction by the functional diagram check element 6 and corrected by the functional diagram editor element 5. The function diagram information has also become free from contradiction in the design constraint information because it was further detected for a contradiction by the design-constraint-information check element 15 and corrected by the functional diagram editor element 5.

The design-constraint-description-language conversion element 16 analyzes, in the functional diagram indicated by the functional diagram information, the design constraint information inputted by the design-constraint-information input element 14 and generates a design constraint description language.

A reference numeral 17 designates the design constraint description language generated by the design constraint description language conversion element 16.

The language based function simulator 10 accepts the hardware description language 9, design constraint description language 17, and test vector 11 and performs functional simulation in the hardware description language at a high speed.

The logic synthesizer 12 accepts the function description language 9 and design constraint description language 17 and generates net list information 13.

Figures 54A, 54B:
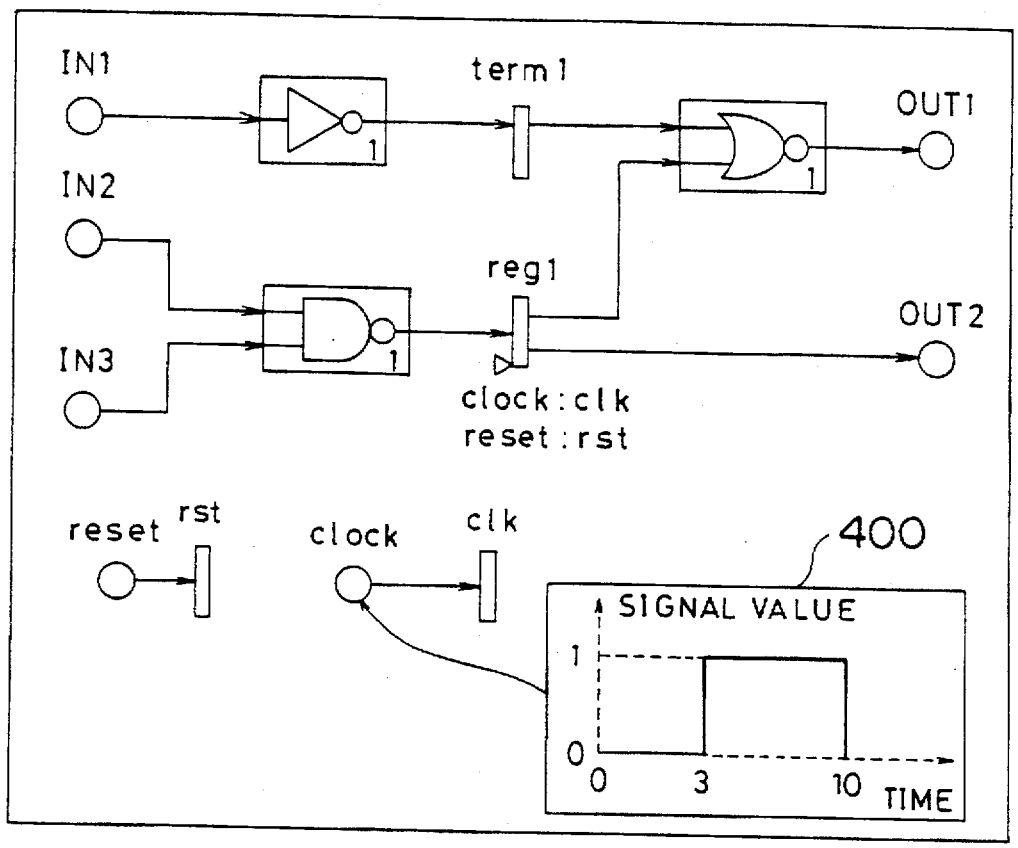
FIG. 54(a) is a view showing a periodic waveform set in the functional diagram by a design-constraint-information input element according to the second embodiment.
FIG. 54(b) is a view showing a design constraint description language corresponding to the periodic waveform of FIG. 54(a), which is implemented by a design-constraint description-language conversion element according to the second embodiment.

FIG. 54(a) shows a first specific example of the operation of the design-constraint-information input element 14, in which the design-constraint-information input element 14 accepts a periodic waveform so that the periodic waveform is set to the clock external input pin of the logic circuit in the functional diagram displayed by the functional diagram editor element 5 on the screen of the CRT monitor 2.

In FIG. 54(a), a reference numeral 400 designates the one cycle of periodic to be inputted and set by the design-constraint-information input element 14 to the clock external input pin of the logic circuit.

In the case where a plurality of clock external input pins exist in the logic circuit, it is also possible to set the periodic waveform to each of the clock external input pins.

FIG. 54(b) shows a first specific example of the operation of the design-constraint description language conversion element 16, in which the design-constraint description language conversion element 16 generates the design constraint description language 17 corresponding to the information on the periodic waveform which has been set by the design-constraint-information input element 14 to the clock external input pin of the logic circuit in the function diagram of FIG. 54(a).

In FIG. 54(b), the first row shows the design constraint description language for setting the information on the periodic waveform, which has been set by the design-constraint-information input element 14 to the clock external input pin of the logic circuit, to the logic synthesizer 12.

The second row shows the design constraint description language for instructing the logic synthesizer 14 to satisfy the set-up constraint and hold-time constraint on the register.

It is also possible to input and specify information on the rise edge skew and fall edge skew in the periodic waveform.

Figures 55A, 55B:
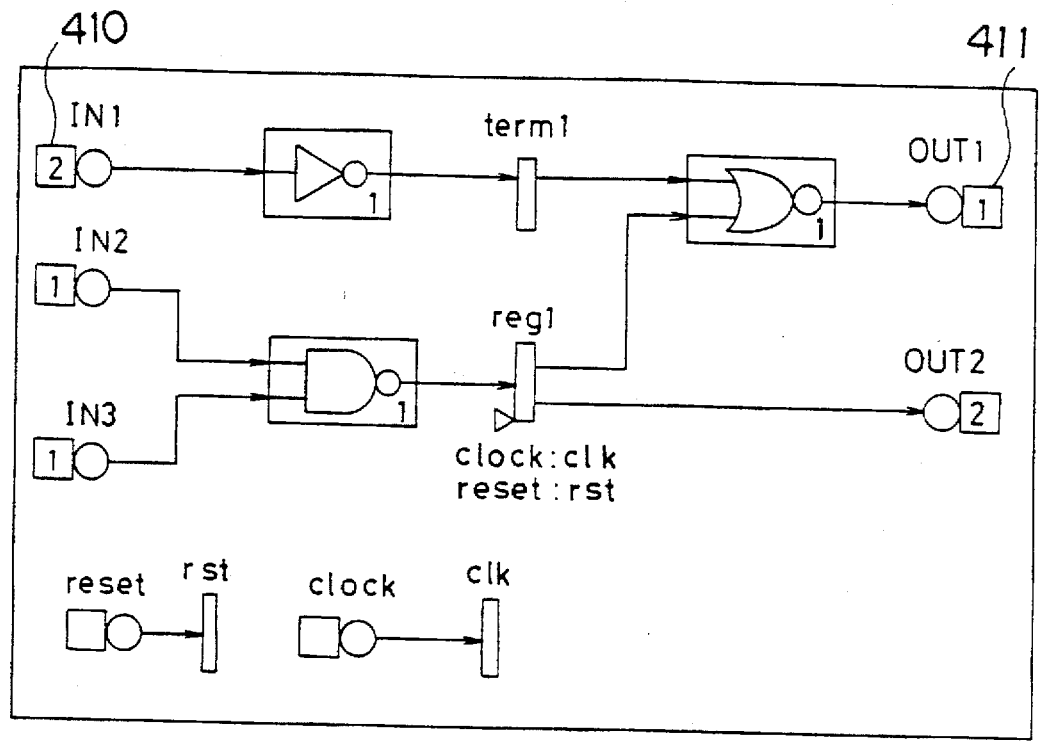
FIG. 55(a) is a view showing fan-out and fan-in set in the functional diagram by the above design-constraint-information input element.
FIG. 55(b) is a view showing a design constraint description language corresponding to the fan-out and fan-in of FIG. 55(a), which is implemented by the above design-constraint-description-language conversion element.

FIG. 55(a) shows a second specific example of the operation of the design-constraint-information input element 14, in which the design-constraint-information input element 14 accepts the fan-out and fan-in so that the fan-out is set to the external input pin and the fan-in is set to the external output pin in the functional diagram displayed by the functional diagram editor element 5 on the screen of the CRT monitor 2.

In FIG. 55(a), a reference numeral 410 designates the fan-out set to the external input pin by the design-constraint-information input element 14.

A reference numeral 411 designates the fan-in set to the external output pin by the design-constraint-information input element 14.

The blank columns in the reset external input pin and clock external input pin indicate that there is no capacity specification.

FIG. 55(b) shows a second specific example of the operation of the design-constraint-description-language conversion element 16, in which the design-constraint description-language conversion element 16 generates the design constraint description language corresponding to the information on the fan-out and fan-in which have been set by the design-constraint-information input element 14 to the external input pin and external output pin of the logic circuit in the functional diagram of FIG. 55(a), respectively.

In FIG. 55(b), the first and second rows show the design constraint description language for setting the information on the fan-out, which has been set to the external input pin by the design-constraint information input element 14, to the logic synthesizer 12.

The third and fourth rows show the design constraint description language for setting the information on the fan in, which has been set by the design-constraint-information input element 14 to the external output pin of the logic circuit, to the logic synthesizer 12.

Figures 56A, 56B:
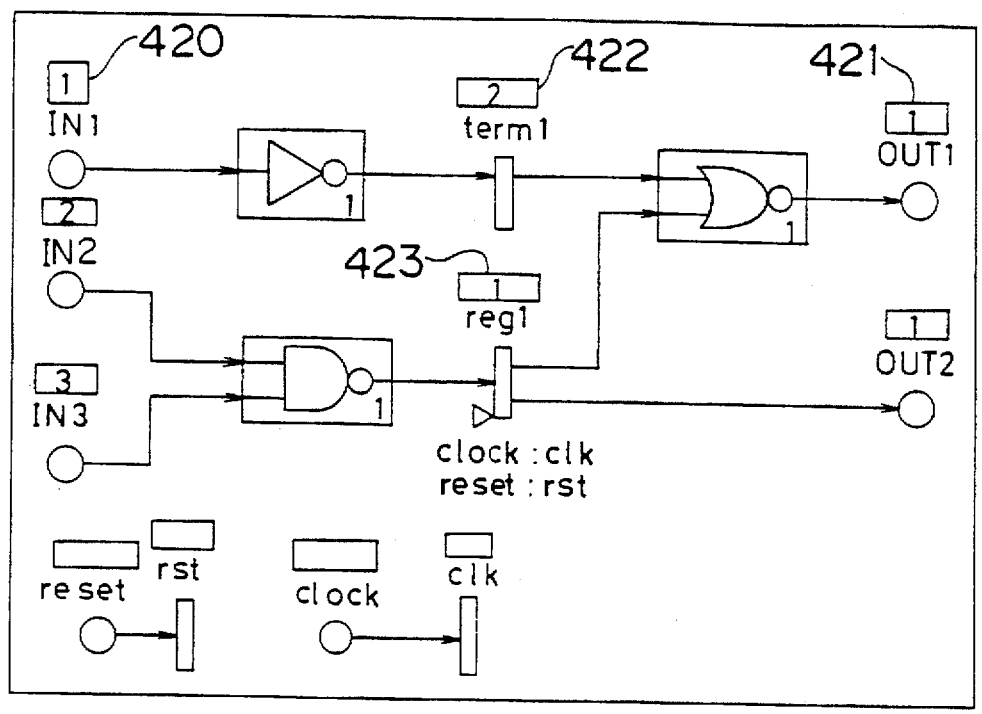
FIG. 56(a) is a view showing a delay value set in the functional diagram by the above design-constraint- information input element.
FIG. 56(b) is a view showing a design constraint description language corresponding to the delay value of FIG. 56(a), which is implemented by the above design-constraint-description-language conversion element.

FIG. 56(a) shows a third specific example of the operation of the design-constraint-information input element 14, in which the design-constraint-information input element 14 inputs a delay value so that the delay value is set to a terminal as a part incapable of storing the state value, to a register as a part capable of storing the state value, and to the external pin in the functional diagram displayed by the functional diagram editor element 5 on the screen of the CRT monitor 2.

In FIG. 56(a), a reference numeral 420 designates the delay value set to the external input pin by the design-constraint-information input element 14.

A reference numeral 421 designates the delay value set to the external output pin by the design-constraint-information input element 14.

A reference numeral 422 designates the delay value set to the terminal by the design-constraint-information input element 14.

A reference numeral 423 designates the delay value set to the register by the design-constraint-information input element 14.

A blank column indicates that there is no delay value.

The functional simulation element 7 executes delay simulation based on the delay value set by the design-constraint-information input element 14 in the functional diagram displayed by the functional diagram editor 5 on the screen of the CRT monitor 2. The delay simulation is more precise than 0-delay simulation.

The functional design support apparatus of the present invention can also be designed so that not only the standard delay value but also a rise-edge delay value or a fall-edge delay value can be used as the delay value.

It is also possible to expansively set the delay value to a part other than the external input pin, external output pin, terminal, and register.

FIG. 56(b) shows a third specific example of the operation of the design-constraint description language conversion element 16, in which the design-constraint description language conversion element 16 generates the design constraint description language 17 based on the information on the delay time which has been set by the design-constraint-information input element 14 to the terminal, register, and external pin in the functional diagram of FIG. 56(b).

In FIG. 56(b), the first row shows the design constraint description language for setting information on a total delay value, which is obtained by calculating the total of the delay values from the external input pin IN1 to the external output pin OUT1, to the logic synthesizer 12.

The second row shows the design constraint description language for setting information on a total delay value, which is obtained by calculating the total of the delay values from the external input pin IN2 to the external output pin OUT1, to the logic synthesizer 12.

The third row shows the design constraint description language for setting information on a total delay value, which is obtained by calculating the total of the delay values from the external input pin IN2 to the external output pin OUT2, to the logic synthesizer 12.

The fourth row shows the design constraint description language for setting information on a total delay value, which is obtained by calculating the total of the delay values from the external input pin IN3 to the external output pin OUT1, to the logic synthesizer 12.

The fifth row shows the design constraint description language for setting information on a total delay value, which is obtained by calculating the total of the delay values from the external input pin IN3 to the external output pin OUT2, to the logic synthesizer 12.

Although the present embodiment has cited as an example the design-constraint description language for setting the delay value which is obtained by simply adding up the delay values set to the parts on a path from the external input pin to the external output pin, the present embodiment can easily be arranged so that other various delay calculation methods can be used.

Figure 57:
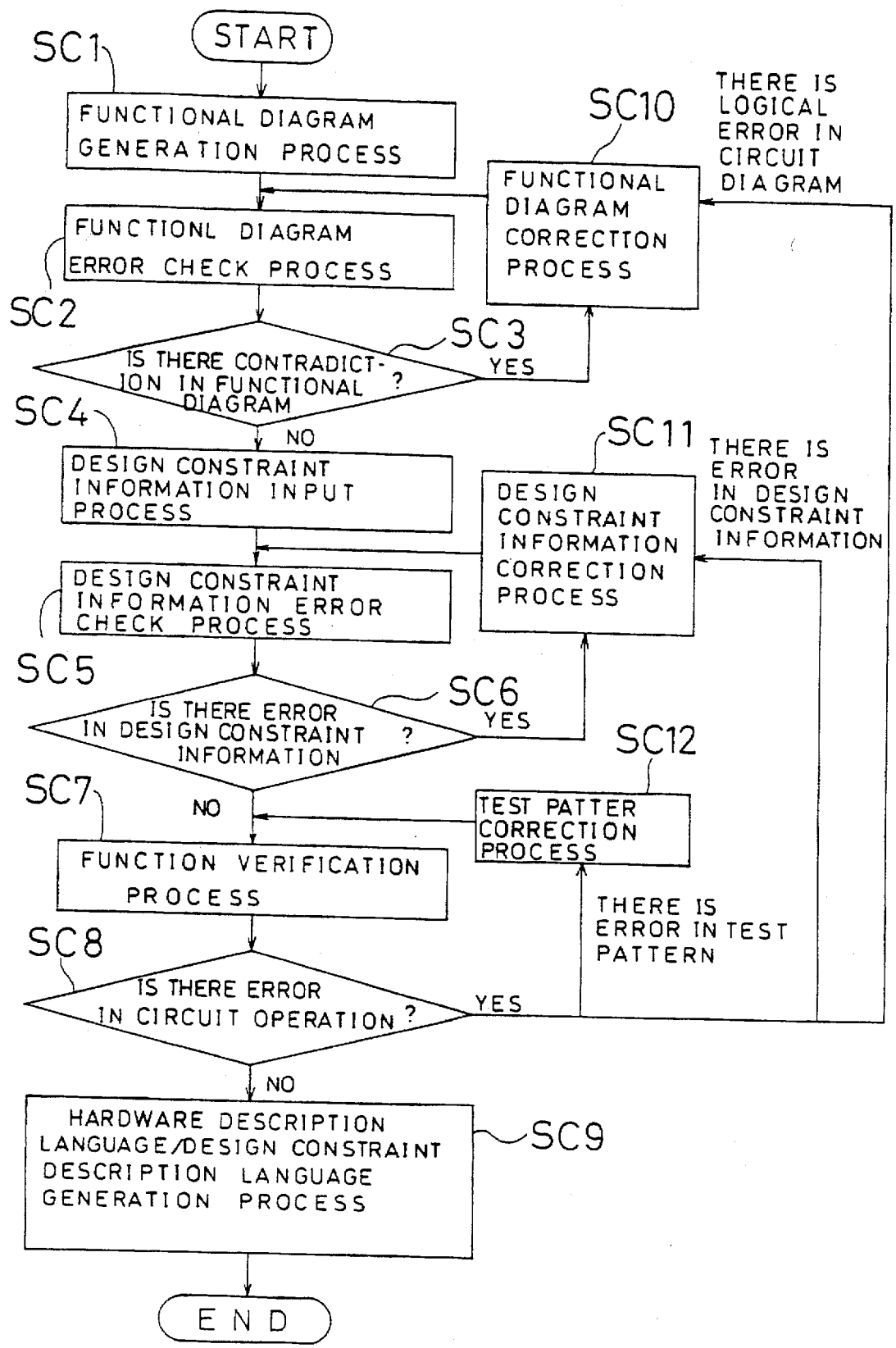
FIG. 57 is a flow chart showing the functional design support method using the functional design support apparatus according to the second embodiment.
Figure 58:
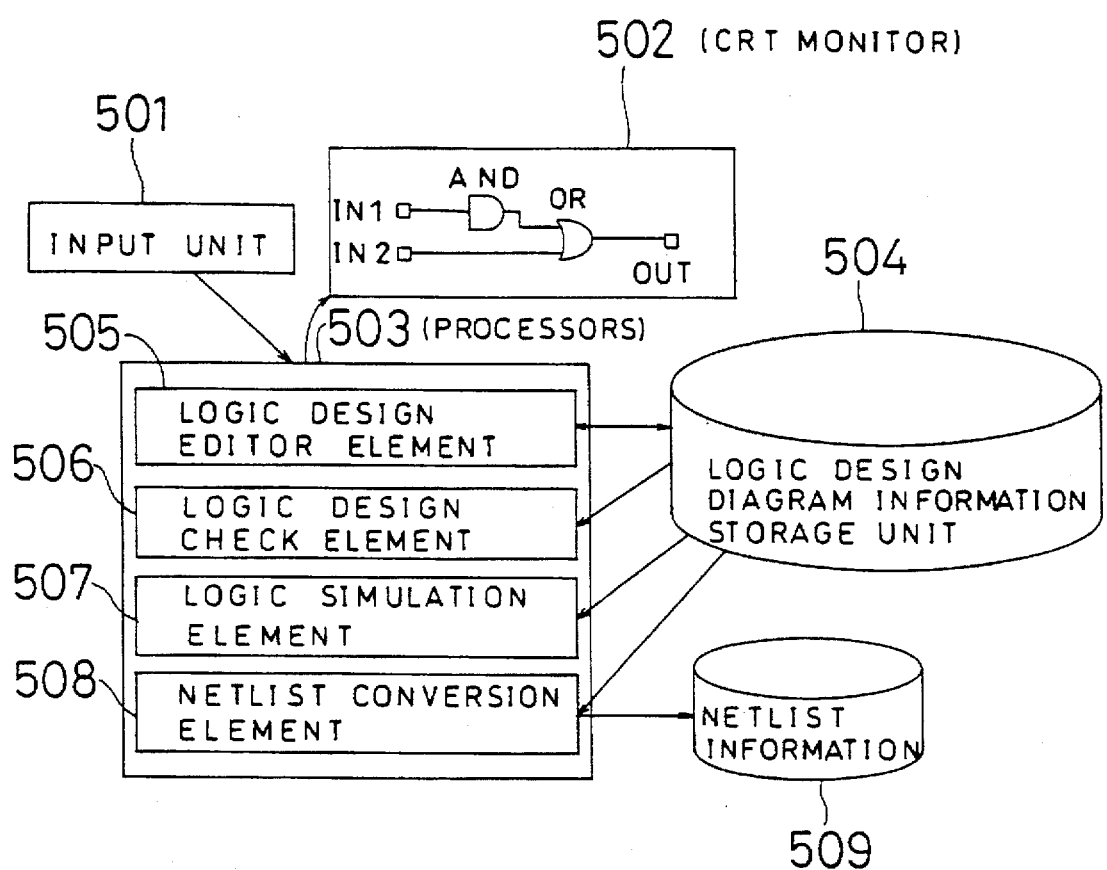
FIG. 58 is a block diagram showing the structure of a conventional logic design support apparatus.

FIG. 57 is a flow chart showing a functional design support method using the functional design support apparatus of the second embodiment.

In a functional diagram generation step SC1 of FIG. 57, the functional diagram is generated using symbols, tables, characters, and the like.

In a functional diagram error check step SC2, the functional diagram generated in the functional diagram generation step SC1 is inputted so as to detect the presence of absence of a contradiction in the functional diagram.

In a judge step SC3, it is judged whether or not a contradiction exists in the functional diagram. If there is no contradiction in the functional diagram, the process goes on to SC4. Conversely, if there is a contradiction, the process goes on to SC10 where the functional diagram is corrected using symbols, tables, characters, and the like (functional diagram correction step, thereby returning to the functional diagram error check step SC2.

In a design-constraint-information input step SC4, the design constraint information including timing constraint information, delay constraint information, fan-out, and fan in is inputted so that the design constraint information is set in the functional diagram generated in the functional diagram generation step SC1.

In a design constraint information error check step SC5, the design constraint information inputted in the design constraint information input process SC4 is detected for an error.

In a judge step SC6, it is judged whether or not an error exists in the design constraint information. If there is no error in the design constraint information, the process goes on to SC7. Conversely, if there is an error, the process goes onto SC11 where the design constraint information is corrected (design constraint information correction step), thereby returning to the design constraint step In a function verification step SC7, the function and timing of the logic circuit are verified in the functional diagram based on the information on the functional diagram generated in the functional diagram generation step SC1 and on the design constraint information inputted in the design-constraint-information input step SC4.

In a judge step SC8, it is judged whether or not there is an error in the operation of the logic circuit. If the logic circuit operates properly, the process goes on to SC9. If there is an error in the test pattern, the process goes on to SC12 where the test pattern is corrected (test pattern correction step) and, after the correction, returns to the function verification step SC7. If there is an error in the design constraint information, the process goes on to the design-constraint-information correction step SC11 in order to correct the design constraint information and, after the correction, returns to the design-constraint-information error check step SC5. If there is any logical error in the functional diagram, the process goes on to a functional diagram correction step SC10 in order to correct the operation of the functional diagram. After the correction, the process returns to the functional diagram error check step SC2 and, if the logic circuit operates properly, the process goes on to SC9.

In a language conversion step SC9, the hardware description language and design constraint description language are generated based on the functional diagram and design constraint information.

We claim:

1. A functional design verification apparatus for verifying the functional design of a logic circuit, comprising:

an encode means for accepting an n-bit input signal ($n \geq 2$) in which each bit is represented by one of logic signals 0, 1, X, and Z and encoding each bit of said input signal to an encoded bit consisting of a 0-drive bit which indicates whether or not the logic value of said bit can be 0 and a 1-drive bit which indicates whether or not the logic value of said bit can be 1 so as to generate an encoded input signal consisting of a 0-drive word composed of n 0-drive bits and a 1-drive word composed of n 1-drive bits; and a ZX conversion means for accepting said encoded input signal and converting that encoded bit of the n encoded bits in said encoded input signal, which corresponds to the logic signal Z, to the encoded bit which corresponds to the logic signal X so as to generate a converted signal;

an output signal evaluation means for accepting said converted signal and obtaining, based on the 0-drive word and 1-drive word of said converted signal, the 0-drive word and 1-drive word which correspond to the result of a logic operation to be subjected to functional simulation so as to generate the encoded output signal consisting of the obtained 0-drive word and 1-drive word; and a decode means for accepting said encoded output signal and restoring a combination of the m-th ($1 \leq m \leq n$) 0-drive bit in the 0-drive word of said encoded output signal and the mth 1-drive bit in the 1-drive word of the encoded output signal to representation by one of the logic signals 0, 1, X, and Z so as to generate an n-bit output signal.

2. A functional design support apparatus according to claim 1, wherein said ZX conversion means has:

a logical OR evaluation means for accepting the encoded input signal from said encode means, performing the logical OR operation between the 0-drive word and 1-drive word of said encoded input signal, and outputting the result of the operation as an intermediate result;

a bit inversion means for accepting said intermediate result, performs the logical NOT operation with respect to said intermediate result, and outputting the result of the operation as a ZX conversion mask; and a ZX-conversion-mask processing means for accepting said encoded input signal and said ZX conversion mask, performing the logical OR operation between the 0-drive word of said encoded input signal and said ZX conversion mask, outputting the result of the operation as the 0-drive word of the converted signal, performing the logical OR operation between the 1-drive word of said encoded input signal and said ZX conversion mask, and outputting the result of the operation as the 1-drive word of the converted signal.

3. A functional design verification apparatus according to claim 1, wherein:

when a logical operation to be performed is a conjunction operation, said output signal evaluation means performs a disjunction operation of 0-drive words and a conjunction operation of 1-drive words of values of a signal to be input.

4. A functional design verification apparatus according to claim 1, wherein when a logical operation to be performed is a disjunction operation, said output signal evaluation means performs a conjunction operation of 0-drive words and a disjunction operation of 1-drive words of values of a signal to be input.

5. A functional design verification apparatus according to claim 1, wherein when a logical operation to be performed is a NOT operation, said output signal evaluation means exchanges 0-drive words and 1-drive words of values of a signal to be input.

6. A functional design verification apparatus according to claim 1, wherein said output signal evaluation means performs to disjunction operation of 0-drive words and a conjunction operation of 1-drive words of values of a signal to be input when a logical operation to be performed is a conjunction operation;

said output signal evaluation means performs a conjunction operation of 0-drive words and a disjunction operation of 1-drive words of values of a signal to be input when a logical operation to be performed is a disjunction operation; and said output signal evaluation means exchanges 0-drive words and 1-drive words of values of a signal to be input when a logical operation to be performed is a NOT operation.

* * * * *